US009818661B2

(12) United States Patent
Tomita et al.

(10) Patent No.: US 9,818,661 B2
(45) Date of Patent: Nov. 14, 2017

(54) SEMICONDUCTOR UNIT AND TEST METHOD

(71) Applicant: Sony Corporation, Tokyo (JP)

(72) Inventors: Manabu Tomita, Kanagawa (JP); Yuzo Fukuzaki, Kanagawa (JP); Kazuhisa Ogawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 436 days.

(21) Appl. No.: 14/489,557

(22) Filed: Sep. 18, 2014

(65) Prior Publication Data

US 2015/0091603 A1    Apr. 2, 2015

(30) Foreign Application Priority Data

Sep. 30, 2013  (JP) .................................. 2013-204942

(51) Int. Cl.
*H01L 21/66* (2006.01)
*G01R 31/28* (2006.01)
*H01L 23/522* (2006.01)

(52) U.S. Cl.
CPC .......... *H01L 22/34* (2013.01); *G01R 31/2884* (2013.01); *H01L 23/5222* (2013.01); *G01B 2210/56* (2013.01); *H01L 2924/0002* (2013.01)

(58) Field of Classification Search
USPC ....................................... 324/762.01; 257/48
See application file for complete search history.

(56) References Cited

U.S. PATENT DOCUMENTS

| 6,143,621 A * | 11/2000 | Tzeng ..................... H01L 22/34 438/401 |
| 2011/0097828 A1* | 4/2011 | Konno ................. B23K 26/009 438/16 |
| 2012/0056177 A1* | 3/2012 | Zhu ......................... H01L 22/34 257/48 |

FOREIGN PATENT DOCUMENTS

| JP | 09139469 A | * 4/1997 | ............ H01L 27/04 |
| JP | 2001-118901 | 4/2001 | |
| JP | 2001118901 | * 4/2001 | ............ H01L 21/66 |

OTHER PUBLICATIONS

English translation of JP09139469-A-MT.*
English translation of JP2001118901-MT.*

* cited by examiner

*Primary Examiner* — Melissa Koval
*Assistant Examiner* — Courtney McDonnough
(74) *Attorney, Agent, or Firm* — Dentons US LLP

(57) ABSTRACT

A semiconductor unit includes: a substrate made of a semiconductor; and a device group formed on the substrate and configured of a plurality of first capacitors, in which the device group includes one or a plurality of first conductive layers and a second conductive layer, the first and second conductive layers provided to be superimposed on each other in part or as a whole with an insulating film in between, the first conductive layer includes an edge extending along one direction, the second conductive layer includes a plurality of sub-conductive layers having substantially same shapes as one another, and the plurality of sub-conductive layers are arranged in relatively different positions with respect to the edge of the first conductive layer.

14 Claims, 40 Drawing Sheets

| INPUT | | | OUTPUT | | | | | | |
|---|---|---|---|---|---|---|---|---|---|
| IN_2 | IN_1 | IN_0 | A | B | C | D | E | F | G |
| 0 | 0 | 0 | 1 | 0 | 0 | 0 | 0 | 0 | 0 |
| 0 | 0 | 1 | 0 | 1 | 0 | 0 | 0 | 0 | 0 |
| 0 | 1 | 0 | 0 | 0 | 1 | 0 | 0 | 0 | 0 |
| 0 | 1 | 1 | 0 | 0 | 0 | 1 | 0 | 0 | 0 |
| 1 | 0 | 0 | 0 | 0 | 0 | 0 | 1 | 0 | 0 |
| 1 | 0 | 1 | 0 | 0 | 0 | 0 | 0 | 1 | 0 |
| 1 | 1 | 0 | 0 | 0 | 0 | 0 | 0 | 0 | 1 |

SEMICONDUCTOR UNIT AND TEST METHOD

CROSS REFERENCE TO RELATED APPLICATIONS

This application claims the benefit of Japanese Priority Patent Application JP 2013-204942 filed Sep. 30, 2013, the entire contents which are incorporated herein by reference.

BACKGROUND

The present disclosure relates to a semiconductor unit capable of detecting, for example, a defect caused by misalignment from various defects produced in a manufacturing process for ICs (Integrated Circuits) or the like, and a test method using such a semiconductor unit.

During or after a manufacturing process for electronic components such as ICs, a judgment test to determine whether the electronic components are conforming items or defective items is performed. The ICs judged as defective items may be used for an improvement in yields by categorizing the defective ICs, based on, for example, causes of defects.

To improve yields, it is important to analyze causes of defects and clarify a step to be improved in the manufacturing process for ICs. Moreover, it is desirable to perform cause analysis of defects for a short time, thereby leading to a reduction in time necessary to improve yields.

Examples of the above-described defects include defects caused by misalignment (superposition misalignment) between layers. Moreover, some of defects caused by the misalignment may be produced not during the process but after the process (afterward). Therefore, it is desirable to execute a defect judgment test on all components after completion of the components.

An example of such a test technique may be a burn-in test. Moreover, in addition to the burn-in test, there is proposed a technique of detecting misalignment with use of a capacitor, based on a change in capacity of the capacitor (for example, refer to Japanese Unexamined Patent Application Publication No. 2001-118901).

SUMMARY

However, in the technique in Japanese Unexamined Patent Application Publication No. 2001-118901, it is difficult to perform high-precision capacity measurement. It is desirable to achieve a technique that is capable of precisely detecting a defect caused by misalignment.

It is desirable to provide a semiconductor unit capable of precisely detecting a defect caused by misalignment and a test method using such a semiconductor unit.

According to an embodiment of the present disclosure, there is provided a first semiconductor unit including: a substrate made of a semiconductor; and a device group formed on the substrate and configured of a plurality of first capacitors. The device group includes one or a plurality of first conductive layers and a second conductive layer, the first and second conductive layers provided to be superimposed on each other in part or as a whole with an insulating film in between. The first conductive layer includes an edge extending along one direction, and the second conductive layer includes a plurality of sub-conductive layers having substantially same shapes as one another. The plurality of sub-conductive layers are arranged in relatively different positions with respect to the edge of the first conductive layer.

The first semiconductor unit according to the embodiment of the present disclosure includes, on the substrate, the device group (the plurality of first capacitors) including the first and second conductive layers with the insulating film in between, in the device group, the second conductive layer includes the plurality of sub-conductive layers having substantially the same shapes as one another, and the respective sub-conductive layers are arranged in relatively different positions with respect to the edge of the first conductive layer. By such a configuration, the capacitances of respective capacitors vary, based on an area where the first conductive layer and the sub-conductive layer are superimposed on each other; therefore, misalignment between the first and second conductive layers is allowed to be detected, based on these capacitances. At this time, since misalignment is allowed to be detected by a relative comparison of the respective capacitances of the plurality of capacitors, even if variation in the thickness of the insulating film occurs in a substrate surface, misalignment detection is less likely to be affected by the variation.

According to an embodiment of the present disclosure, there is provided a second semiconductor unit including: a substrate made of a semiconductor; a plurality of first capacitors formed on the substrate and each including first and second conductive layers with an insulating film in between; and a detection circuit configured to detect a misalignment amount between the first and second conductive layers, based on capacitances of the plurality of first capacitors. A plurality of the first conductive layers are provided, the second conductive layer is provided to be superimposed on each of the first conductive layers in part or as a whole, and the detection circuit is configured to detect the misalignment amount by arithmetic processing using a difference between capacitances of capacitors selected from the plurality of first capacitors and a sum of the capacitances of the selected capacitors.

The second semiconductor unit according to the embodiment of the present disclosure includes, on the substrate, the plurality of first capacitors including the first and second conductive layers with the insulating film in between and the detection circuit configured to detect the misalignment amount by arithmetic processing using a difference between capacitances of capacitors selected from the plurality of first capacitors and a sum of the capacitances of the selected capacitors. The thickness of the insulating film is allowed to be cancelled by misalignment detection, based on the above-described predetermined arithmetic processing, and even if variation in film thickness of the insulating film occurs in the substrate surface, misalignment is allowed to be detected precisely.

According to an embodiment of the present disclosure, there is provided a first test method including: detecting a relative misalignment amount between layers on a substrate made of a semiconductor, based on electrical measurement by a device group configured of a plurality of first capacitors; and performing defect judgment on each of regions on the substrate, based on the detected misalignment amount. The device group includes first and second conductive layers provided to be superimposed on each other in part or as a whole with an insulating film in between. The first conductive layer includes an edge extending along one direction, and the second conductive layer includes a plurality of sub-conductive layers having substantially same shapes as one another. The plurality of sub-conductive layers are arranged in relatively different positions with respect to the edge of the first conductive layer.

The first test method according to the embodiment of the present disclosure includes detecting the relative misalignment amount between layers on the substrate made of the semiconductor, based on electrical measurement on the device group configured of the plurality of first capacitors; and performing defect judgment on each of regions on the substrate, based on the detected misalignment amount. In the device group, the second conductive layer includes the plurality of sub-conductive layers having substantially the same shapes as one another, and the plurality of sub-conductive layers are arranged in relatively different positions with respect to the edge of the first conductive layer. Since the capacitances of the respective capacitors vary, based on an area where the first conductive layer and the sub-conductive layer are superimposed on each other, misalignment is allowed to be detected by electrical measurement of the respective capacitors. At this time, misalignment is allowed to be detected by a relative comparison of the respective capacitances of the plurality of capacitors; therefore, even if variation in thickness of the insulating film occurs in the substrate surface, misalignment detection is less likely to be affected by the variation.

According to an embodiment of the present disclosure, there is provided a second test method including: detecting a relative misalignment amount between layers on a substrate made of a semiconductor by electrical measurement using a plurality of first capacitors; and performing defect judgment on each of regions on the substrate, based on the detected misalignment amount. In the detecting of the misalignment amount, the misalignment amount is detected by arithmetic processing using a difference between capacitances of capacitors selected from the plurality of first capacitors and a sum of the capacitances of the selected capacitors. The first capacitor includes a plurality of first conductive layers and a second conductive layer with an insulating film in between, the second conductive layer superimposed on a part or a whole of each of the first conductive layers.

The second test method according to the embodiment of the present disclosure includes detecting a relative misalignment amount between layers on a substrate made of a semiconductor by electrical measurement using a plurality of first capacitors; and performing defect judgment on each of regions on the substrate, based on the detected misalignment amount. In the detecting of the misalignment amount, the misalignment amount is detected by arithmetic processing using a difference between capacitances of capacitors selected from the plurality of first capacitors and a sum of the capacitances of the selected capacitors. The thickness of the insulating film is allowed to be cancelled by misalignment detection, based on the predetermined arithmetic processing, and even if variation in thickness of the insulating film occurs in the substrate surface, misalignment is allowed to be detected precisely.

The first semiconductor unit according to the embodiment of the present disclosure includes, on the substrate, the device group (the plurality of first capacitors) including the first and second conductive layers with the insulating film in between, in the device group, the second conductive layer includes the plurality of sub-conductive layers having substantially the same shapes as one another, and the respective sub-conductive layers are arranged in relatively different positions with respect to the edge of the first conductive layer. Misalignment between the first and second conductive layers is allowed to be detected by such a configuration, based on the capacitances of the respective capacitors according to the area where the first conductive layer and the sub-conductive layer are superimposed on each other. At this time, since the relative comparison of the respective capacitances of the plurality of capacitors is used, the misalignment is allowed to be detected while reducing an influence of variation in thickness of the insulating film in the substrate surface. Therefore, a defect caused by the misalignment is allowed to be detected precisely.

The second semiconductor unit according to the embodiment of the present disclosure includes, on the substrate, the plurality of first capacitors including the first and second conductive layers with the insulating film in between and the detection circuit configured to detect the misalignment amount by arithmetic processing using a difference between capacitances of capacitors selected from the plurality of first capacitors and a sum of the capacitances of the selected capacitors. The thickness of the insulating film is allowed to be cancelled by misalignment detection, based on the above-described predetermined arithmetic processing, and misalignment is allowed to be detected precisely without an influence of variation in thickness of the insulating film. Therefore, a defect caused by the misalignment is allowed to be detected precisely.

The first test method according to the embodiment of the present disclosure includes detecting the relative misalignment amount between layers on the substrate made of the semiconductor, based on electrical measurement on the device group configured of the plurality of first capacitors; and performing defect judgment on each of regions on the substrate, based on the detected misalignment amount. In the device group, the second conductive layer includes the plurality of sub-conductive layers having substantially the same shapes as one another, and the plurality of sub-conductive layers are arranged in relatively different positions with respect to the edge of the first conductive layer. Since the capacitances of the respective capacitors vary, based on an area where the first conductive layer and the sub-conductive layer are superimposed on each other, misalignment is allowed to be detected by electrical measurement of the respective capacitors. At this time, since misalignment is allowed to be detected by a relative comparison of the respective capacitances of the plurality of capacitors, the misalignment amount is allowed to be detected while reducing an influence of variation in thickness of the insulating film in the substrate surface. Therefore, a defect caused by misalignment is allowed to be detected precisely.

Moreover, a defective region is allowed to be sorted out, by performing defect judgment on each of regions on the substrate, based on the detected misalignment amount. For example, a defective region (a defective item) may be discarded, or may be corrected to be a conforming item. Further, feedback about a region judged as a defect is provided to the manufacturing process, thereby leading to an improvement in yields.

The second test method according to the embodiment of the present disclosure includes detecting the relative misalignment amount between layers on the substrate made of the semiconductor by electrical measurement using the plurality of first capacitors; and performing defect judgment on each of regions on the substrate, based on the detected misalignment amount. In the detecting of the misalignment amount, the misalignment amount is detected by arithmetic processing using a difference between capacitances of capacitors selected from the plurality of first capacitors and a sum of the capacitances of the selected capacitors. The thickness of the insulating film is allowed to be cancelled by misalignment detection, based on the predetermined arithmetic processing, and the misalignment amount is allowed to be detected precisely without an influence of variation in thickness of the insulating film. Therefore, a defect caused by misalignment is allowed to e detected precisely.

Moreover, a defective region is allowed to be sorted out by performing defect judgment on each of regions on the substrate, based on the detected misalignment amount. For example, a defective region (a defective item) may be discarded, or may be corrected to be a conforming item. Further, feedback about a region judged as a defect is provided to the manufacturing process, thereby leading to an improvement in yields.

The above description is merely an example of the present disclosure. Effects of the embodiments of the present disclosure are not limited to the above-described effects, and any other effects may be obtained, or may be further included.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

Some embodiments of the present disclosure will be described in detail below referring to the accompanying drawings. It is to be noted that description will be given in the following order.
1. First Embodiment (Example of semiconductor unit capable of detecting a defect caused by misalignment by electrical measurement)
 1-1. Defect Caused by Misalignment in Semiconductor Process
 1-2. Configuration of Semiconductor Unit
 1-3. Example of Test Method by Electrical Measurement Using Semiconductor Unit
 1-4. Example of Capacity Correction
2. Modification Examples 1-1 to 1-7 (Other examples of device group layout)
3. Second Embodiment (Example in a case where a film thickness measurement device is used)
4. Modification Example 2 (Another example of conductive layer layout)
5. Modification Example 3 (Another example of planar shape of sub-conductive layer)
6. Third Embodiment (Example in a case where arithmetic processing using a sum of capacities is used)
7. Modification Examples 4-1 and 4-2 (Example of arithmetic processing in a case where misalignment in two axis directions is detected)
8. Modification Examples 5-1 to 5-5 (Other examples of electrode layout)

First Embodiment

[Defect Caused by Misalignment in Semiconductor Process]

In a manufacturing process for semiconductor integrated circuits (ICs) or the like, whether or not the semiconductor ICs are defective is detected during the process or after the process (after product completion) with use of various test methods to sort out defective ICs from conforming ICs. Moreover, in a case where a defect is produced, it is desirable to analyze which step the defect is produced in and a cause of the defect and then provide feedback about an analysis result to the manufacturing process, thereby leading to an improvement in yields, or a reduction in time necessary to improve yields.

Figure 1A:
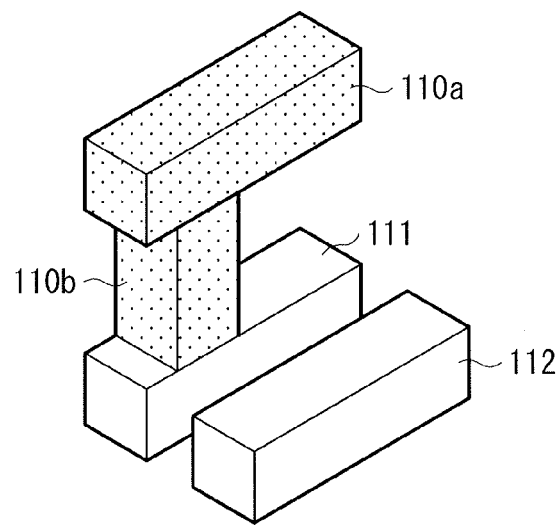
FIG. 1A is a schematic view for describing misalignment between wiring lines.
Figure 1B:
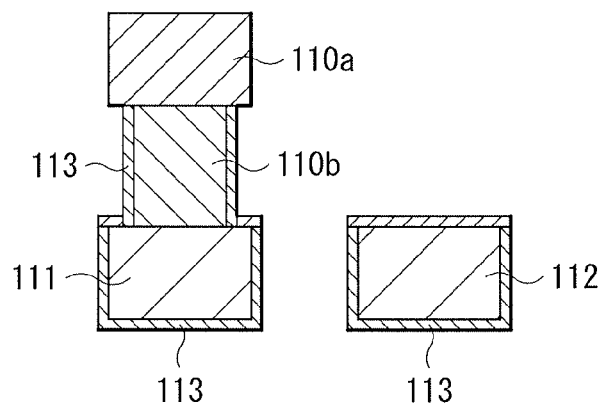
FIG. 1B is a schematic view for describing misalignment between wiring lines.
Figure 2A:
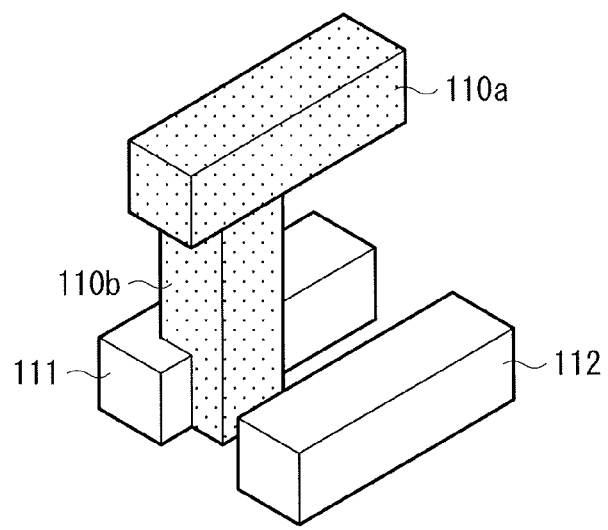
FIG. 2A is a schematic view for describing misalignment between wiring lines.
Figure 2B:
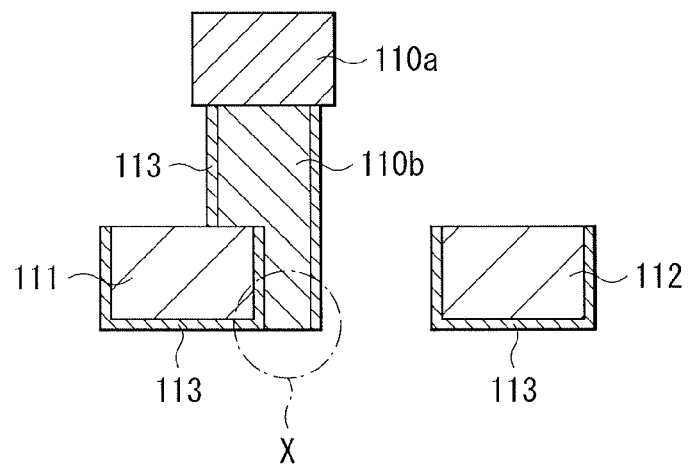
FIG. 2B is a schematic view for describing misalignment between wiring lines.

Examples of defects produced in such a process may include misalignment (superposition misalignment) between layers (between conductive layers). For example, when misalignment occurs during a wiring connection process between layers with use of a via, a connection defect is produced. Alternatively, when misalignment between upper and lower conductive layers occurs in a formation process for various capacitors, a failure such as inability to obtain a desired capacity value occurs. Misalignment in wiring connection will be described below referring to FIGS. 1A, 1B, 2A, and 2B. However, in these diagrams, only a wiring portion is selectively and schematically illustrated. FIGS. 2A and 3A are perspective views and FIGS. 2B and 3B are sectional views. For example, as illustrated in FIGS. 1A and 1B, in a case where conductive layers (an upper wiring line 110a and a lower wiring line 111) arranged in different layers are connected to each other, pattern formation is performed on each layer while the lower wiring line 111, a connection section 110b, and the upper wiring line 110a are so aligned as to be superimposed on one another. At this time, a protective film 113 such as a barrier metal or a diffusion prevention film is formed on side surfaces of the lower wiring line 111, the connection section 110b, and the like.

However, as illustrated in FIG. 2A, in a case where the connection section 110b and the upper wiring line 110a are not formed at desired positions with respect to the lower wiring line 111 (in a case where misalignment occurs), as indicated by X in FIG. 2B, a part of the connection section 110b is exposed on the protective film 113. Moreover, a distance to an adjacent electrode 112 is decreased. Since an electric field strength is inversely proportional to the square of the distance, the electric field strength increases with a decrease in the distance between the lower wiring line 111 and the electrode 112, thereby easily causing so-called ion migration. In a case where misalignment is large, the connection section 110b may be in contact with the protective film 113 of the electrode 112. In a case where electrical connection is secured between the lower wiring line 111 and the upper wiring line 110a in such a manner in spite of occurrence of misalignment, it is difficult to detect a defect in a test during the process, and a short circuit is established with time by ion migration or the like. A defect may be produced afterward in such a manner.

Figure 3:
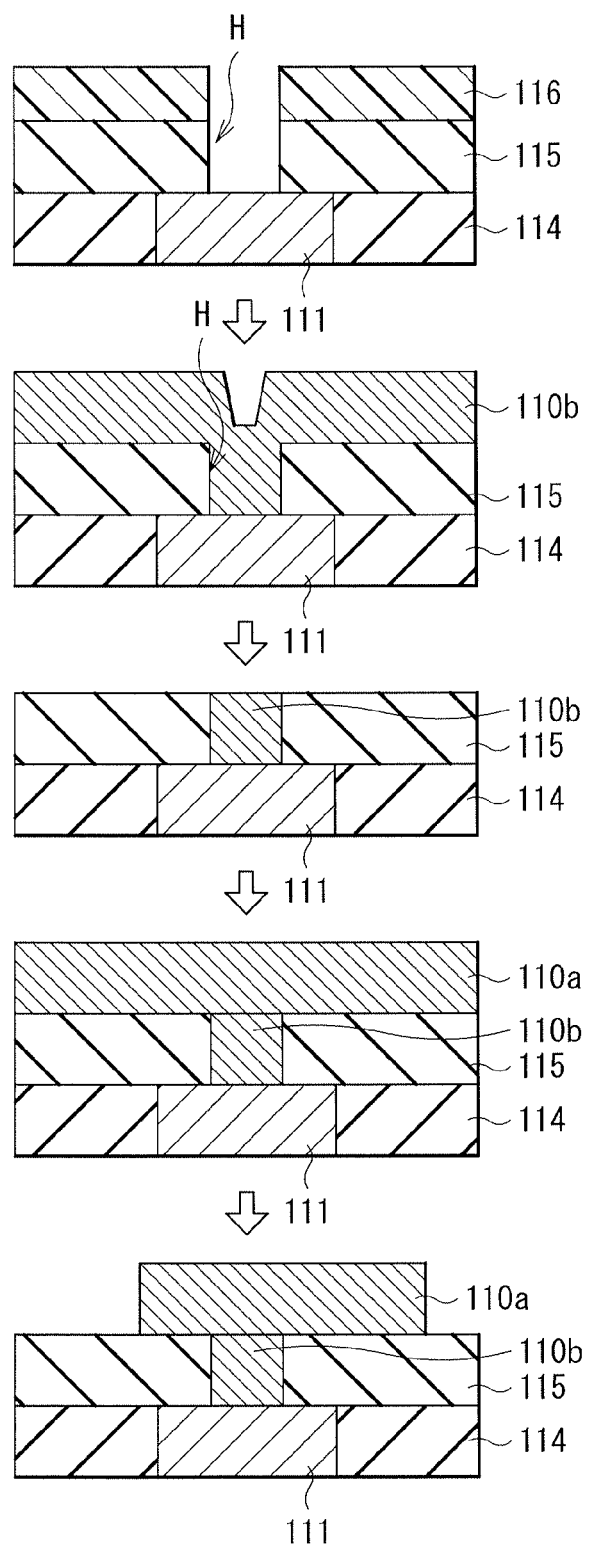
FIG. 3 is a schematic sectional view illustrating an example of a wiring connection process.

FIG. 3 illustrates a formation process for a tungsten plug (W-plug) as an example of the above-described wiring connection process. When the tungsten plug is formed, for example, after the lower wiring line 111 and interlayer insulating films 114 and 115 are formed, a contact hole H is formed in the interlayer insulating film 115 by etching using a photoresist 116. As the lower wiring line 111, for example, an alloy of aluminum and copper (an Al—Cu-based alloy) may be used, and as the interlayer insulating films 114 and 115, for example, a plasma oxide film ($SiO_2$) formed with use of TEOS (tetraethoxysilane) gas may be used. Then, after the photoresist 116 is peeled and cleansed, for example, the connection section 110b made of tungsten (W) is so formed with a predetermined thickness as to be charged into the contact hole H, and then the connection section 110b is planarized (polished) until the connection section 110b has a thickness substantially equal to that of the interlayer insulating film 115. After that, the upper wiring line 110a is formed by, for example, a sputtering method, and is patterned by etching with use of, for example, a photolithography method. It is to be noted that, as the upper wiring line 110a, for example, aluminum added with Cu or Si may be used.

It is to be noted that, as a wiring connection configuration in which the above-described misalignment may occur, in addition to this configuration, a configuration in which the upper wiring line 110a and the connection section 110b are integrally formed, for example, a wiring configuration by so-called dual damascene is listed. Moreover, in this case, misalignment in the wiring connection process is exemplified; however, for example, even in a capacitor formation process, a defect caused by misalignment may be produced. For example, in a case where misalignment between upper and lower conductive layers occurs when various capacitors are formed, a capacity changes by an amount of the misalignment; therefore, a designed capacity is not obtained, and an operation of a circuit falls out of specifications.

Figure 4A:
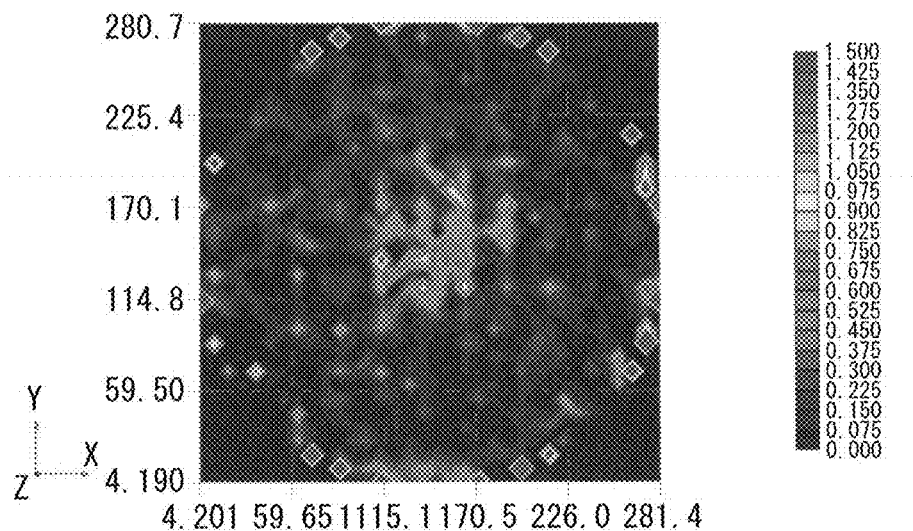
FIG. 4A is a characteristic diagram illustrating an output result of a burn-in test.
Figure 4B:
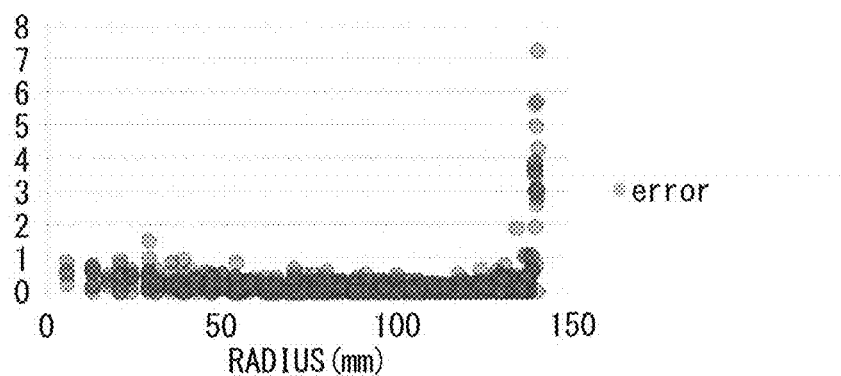
FIG. 4B is a characteristic diagram illustrating an output result of the burn-in test.
Figure 4C:
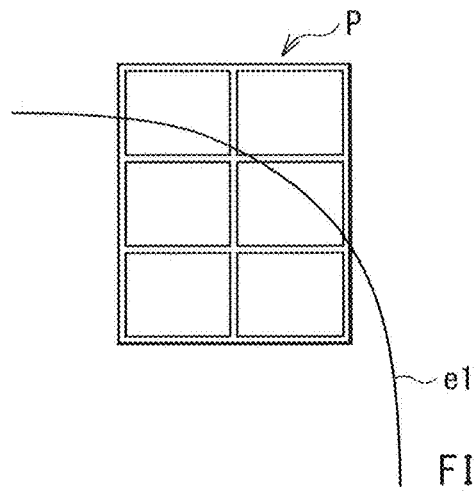
FIG. 4C is a diagram of an example of an exposure shot pattern in a wafer outer peripheral section.

Defects caused by the above-described misalignment including defects produced afterward may be detected by, for example, a burn-in test. The burn-in test is performed on all points on a wafer surface practically under a load over time after the manufacturing process, and is an analysis test, based on a technique called burn-in study. FIG. 4A is a map illustrating an output result by the burn-in test, and FIG. 4B is a characteristic diagram illustrating a relationship between a radius (a distance from a center to an outer edge in a wafer) and a defect index. Thus, it is clear that a large number of defective points caused by misalignment (points at 1.5 or more on the vertical axis in FIG. 4B) are produced mainly in a wafer outer peripheral section. This is because a defocused point in a shot pattern P of exposure in a photolithography step is easily produced around a wafer outer peripheral section e1 (refer to FIG. 4C). At the defocused point, it is difficult to perform patterning according to design, and the above-described misalignment easily occurs. Moreover, in the test during the process, only representative points in the wafer surface are generally tested; therefore, one of causes is that a defect in an outer peripheral section is more likely to be overlooked. In a burn-in test step, before shipment as products, final sorting is performed on all ICs to sort out conforming ICs from defective ICs.

A semiconductor unit (a semiconductor unit 1) according to this embodiment that will be described below is suitably used to detect the above-described misalignment. Moreover, a test method using this semiconductor unit 1 is allowed to be suitably used as an alternative to the above-described burn-in test or to reduce a temporal burden in the burn-in test.

[Configuration of Semiconductor Unit 1]

Figure 5:
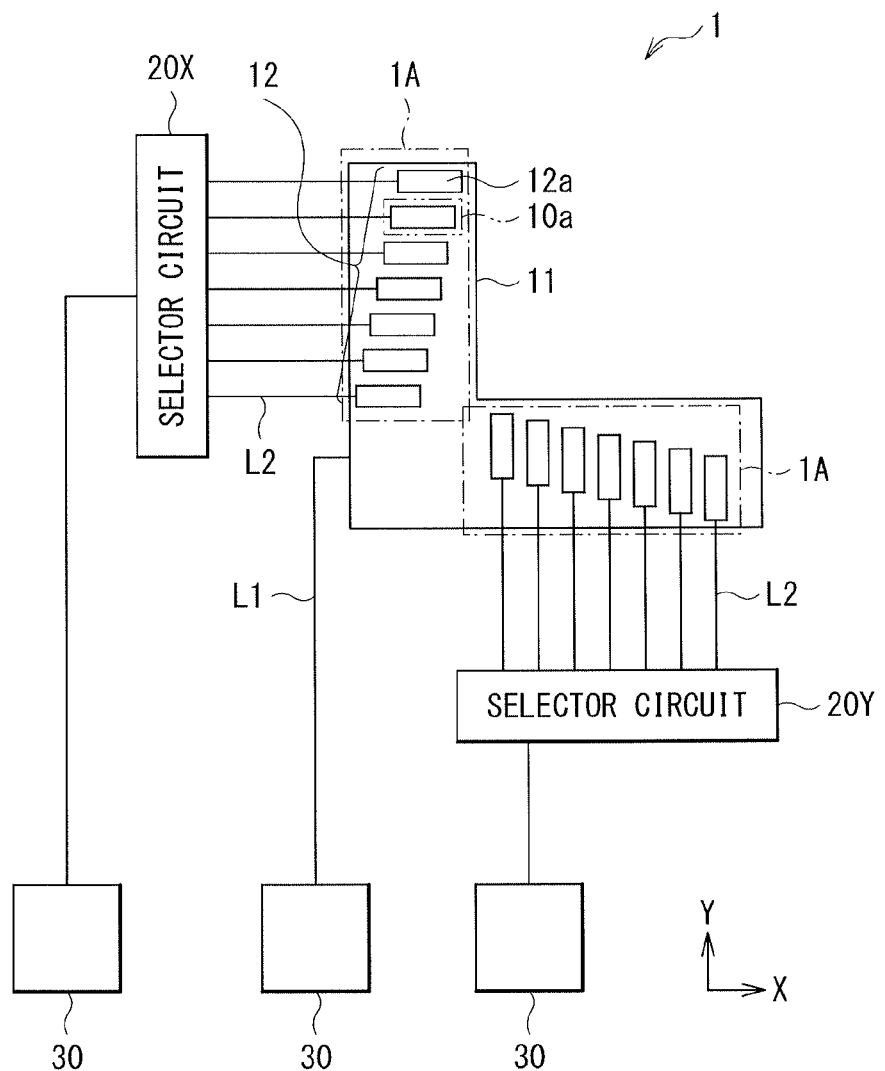
FIG. 5 is a schematic view illustrating a schematic configuration of a semiconductor unit according to a first embodiment of the present disclosure.

FIG. 5 is a schematic view illustrating a schematic configuration of the semiconductor unit 1 according to this embodiment. The semiconductor unit 1 includes one or more capacitors, and has a device configuration capable of detecting misalignment by electrical measurement using the capacitors. The semiconductor unit 1 may include a device group 1A configured of a plurality of capacitors 10a (first capacitors). Each of the capacitors 10a of the device group 1A may be connected to a measurement section 30 through, for example, a selector circuit (a selector circuit 20X or a selector circuit 20Y).

The device group 1A includes a first conductive layer 11 and a second conductive layer 12 with an insulating film (not illustrated in FIG. 5) in between. The second conductive layer 12 of the first and second conductive layers 11 and 12 includes a plurality of (seven in this case) sub-conductive layers 12a (is partitioned into a plurality of sub-conductive layers 12a). The number and layout of the capacitors 10a configuring the device group 1A may correspond to, for example, the number and layout of the sub-conductive layers 12a, and a portion where one sub-conductive layer 12a and the first conductive layer 11 are superimposed on each other configures one capacitor 10a.

The device group 1A is a unit configured to detect misalignment in an axis direction according to the layout of the plurality of capacitors 10a. The number of capacitors 10a configuring the device group 1A may be two or more; however, the more the number of capacitors 10 increases, the more precisely misalignment is detectable. The device groups 1A may be provided, for example, along an X-axis direction and a Y-axis direction, and are allowed to detect misalignment along two axis directions (the X-axis direction and the Y-axis direction) orthogonal to each other.

Moreover, for example, a plurality of the device groups 1A may be formed in respective points (selective regions or respective regions adjacent to respective IC chips) in a wafer surface in a semiconductor process.

(Layout Configuration of Capacitors)

Figure 6A:
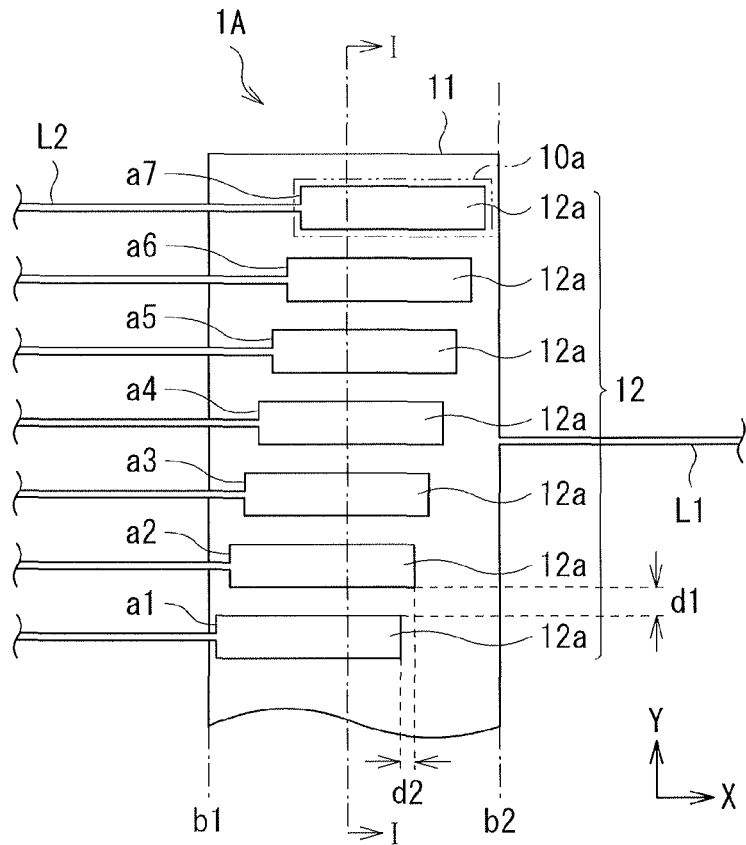
FIG. 6A is a plan view illustrating a specific configuration of a device group illustrated in FIG. 5.
Figure 6B:
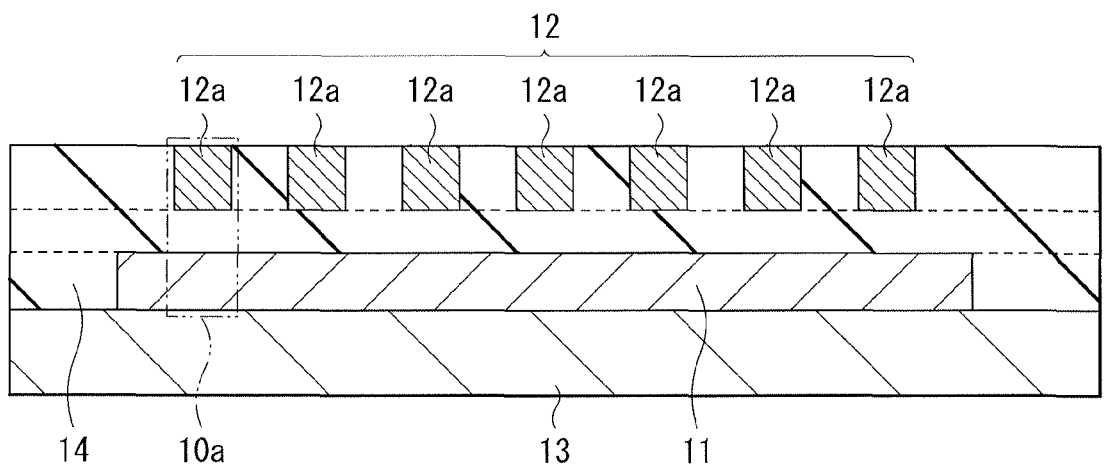
FIG. 6B is a sectional view illustrating a specific configuration of the device group illustrated in FIG. 5.

FIG. 6A illustrates an enlarged view of a planar configuration of one device group 1A. FIG. 6B is a sectional view taken along a line I-I in an arrow direction of FIG. 6A. The first conductive layer 11 is provided in a selective region on a substrate 13 made of, for example, a semiconductor such as silicon, and the second conductive layer 12 is provided on the first conductive layer 11 with an insulating film 14 in between. The second conductive layer 12 is partitioned into a plurality of sub-conductive layers 12a as described above, and the plurality of sub-conductive layers 12a are electrically isolated from one another.

Each of the capacitors 10a is configured of the sub-conductive layer 12a, a part (a portion facing the sub-conductive layer 12a) of the first conductive layer 11, and the insulating film 14 provided between them. In this case, a configuration in which each entire sub-conductive layer 12a configuring the second conductive layer 12 is disposed in a region facing the first conductive layer 11 (in a state in which misalignment does not occur) is illustrated. However, in a case where misalignment that will be described later occurs, or the like, the entire sub-conductive layer 12a may not be necessarily so disposed as to face the first conductive layer 11. It is only necessary to dispose the first conductive layer 11 and the second conductive layer 12 to be superimposed on each other in part.

In this embodiment, in such a device group 1A, the first conductive layer 11 has an XY planar shape (hereinafter simply referred to as a planar shape) including edges (for example, edges b1 and b2) extending along one axis direction, for example, a rectangular shape or a square shape. The edges b1 and b2 extend along a direction (the X-axis direction in this case) orthogonal to an axis direction where misalignment is to be detected (hereinafter referred to as "detection direction"; the Y-axis direction in this case). As illustrated in FIG. 5, the planar shape of the first conductive layer 11 may be an "L"-letter like shape in which a rectangular shape is bent at a part, and the first conductive layer 11 may be provided as a common conductive layer for a plurality of device groups 1A. However, the first conductive layer 11 is not limited to such a configuration, and as long as the first conductive layer 11 has a shape with the edge b1 (or the edge b2), respective first conductive layers 11 may be separately provided to respective device groups 1A. Moreover, as will be described later, the first conductive layer 11 may be partitioned into two or more in the device group 1A (a plurality of first conductive layers 11 may be provided) depending on the layout of the sub-conductive layers 12a. In a case where the first conductive layers 11 are separately provided to respective device groups 1A (or in the device group 1A), the first conductive layers 11 may be preferably electrically connected to one another.

In the second conductive layer 12, the plurality of sub-conductive layers 12a have substantially the same shape as one another. The plurality of sub-conductive layers 12a are disposed at relatively different positions with respect to the edge b1 (or the edge b2) of the first conductive layer 11. For example, in an example illustrated in FIG. 6A, the plurality of sub-conductive layers 12a each have a rectangular planar shape having a long side along the detection direction (the Y-axis direction in this case). Positions of respective short sides (a1 to a7) of the sub-conductive layers 12a are different from one another along the detection direction (the Y-axis direction in this case), and the plurality of sub-conductive layers 12a are so arranged as to be shifted in a stepwise fashion. For example, the sub-conductive layers 12a are arranged along the X-axis direction at intervals d1 (for example, about 0.5 µm to about 2.0 µm), and are so arranged as to be shifted along the Y-axis direction by a distance d2 (for example, about 0.01 µm to about 0.1 µm).

The selector circuits 20X and 20Y are switching circuits that may be provided to, for example, respective device groups 1A, and are configured to select, in turn, each of capacities of the plurality of capacitors 10a configuring the device group 1A for measurement. The capacity of the capacitor 10a selected by the selector circuits 20X and 20Y is measured through a measurement section 30 (or in the measurement section 30).

Figure 7A:
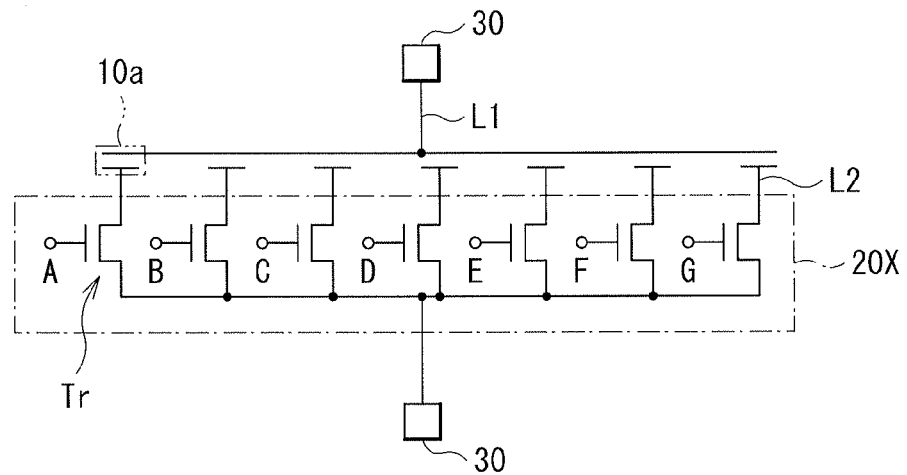
FIG. 7A is a circuit diagram illustrating a configuration example of a main part of a selector circuit illustrated in FIG. 5.
Figure 7B:
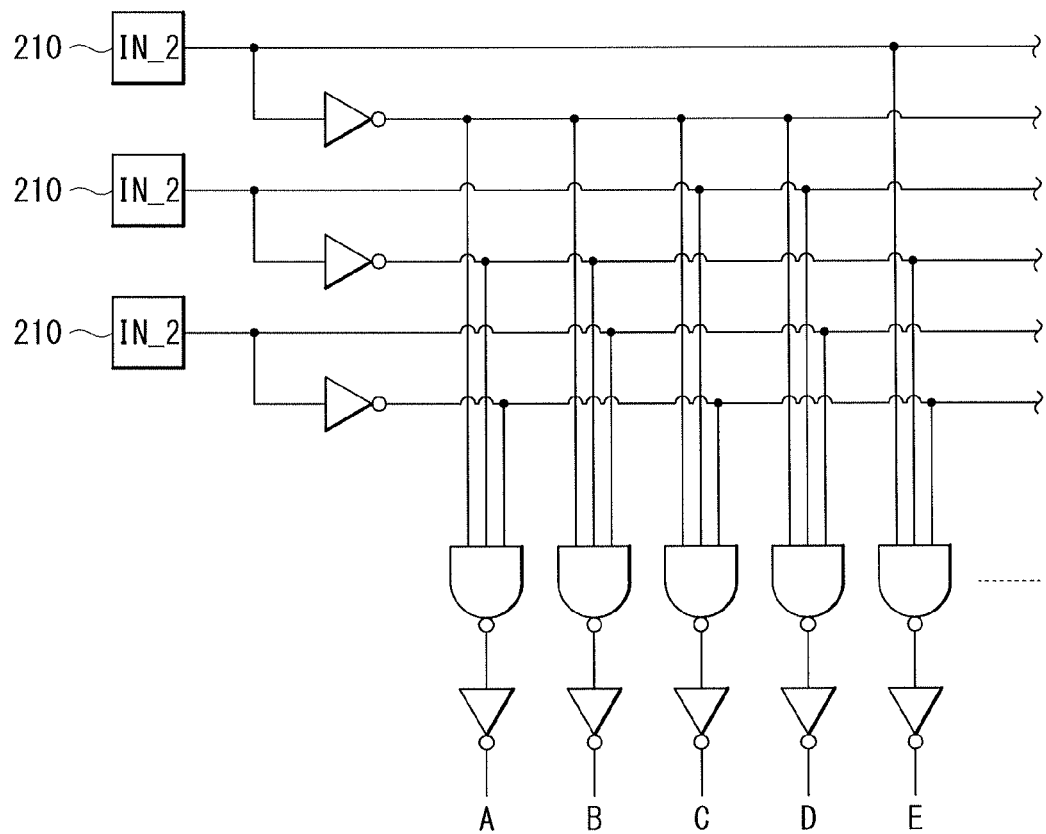
FIG. 7B is a circuit diagram illustrating a configuration example of a main part of the selector circuit illustrated in FIG. 5.

FIG. 7A is a circuit diagram illustrating a configuration example of the selector circuits 20X and 20Y. It is to be noted that, since the selectors 20X and 20Y have a similar configuration, the selector circuit 20X will be described as an example. The selector circuit 20X may include a switching device (for example, a three-terminal transistor Tr as illustrated) connected to an end (the sub-conductive layer 12a) of each capacitor 10a through a selection line L2. In the selector circuit 20X, when a selection signal is input to a gate of each transistor, the capacitor 100a to be measured is selected. The selection signal to be input to each transistor is generated in, for example, a circuit (a decode circuit) including an input switching circuit 210 and various logic circuits as illustrated in FIG. 7B, and is output from the circuit. Although not illustrated, output sides A, B, C, D, E, F, and G in FIG. 7B are connected to gates A to G to respective transistors Tr in FIG. 7A. Moreover, the number of input switching circuits 210 is set according to the number of capacitors 10a configuring the device group 1A, and in a case where n number (n is an integer of 1 or more) of switching circuits 210 are provided, switching between $2^n$ number of capacitors 10a are allowed to be performed. In this case, since the device group 1a includes seven capacitors 10a, in the selector circuit 20X, three input switching circuits 210 are used. It is to be noted that, in addition to the switching circuits 210, a power supply circuit (not illustrated) configured to supply power for a circuit operation, or the like is provided to the selector circuit 20X.

Figures 8, 9:
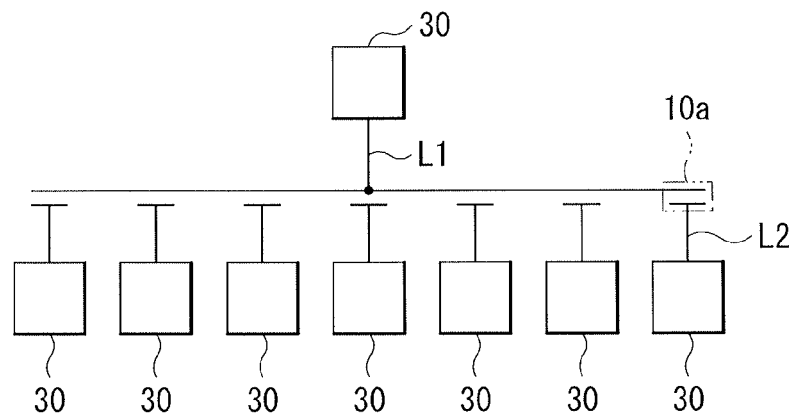
FIG. 8 is a circuit diagram in a case where a selector circuit is not used.
FIG. 9 is a diagram illustrating examples of a combination of an input selection signal and an output signal to the selector circuit.

It is to be noted that, as illustrated in FIG. 8, without providing the selector circuits 20X and 20Y, the measurement section 30 may be provided to an end (the sub-conductive layer 12a) of each of the capacitors 10a. However, in a case where the number of capacitors 10a configuring the device group 1A is large, when the selector circuits 20X and 20Y are not used, the number of measurement sections 30 is increased (in this case, eight measurement sections 30 is necessary for one device group 1A); therefore, the selector circuits 20X and 20Y may be preferably provided.

The measurement section 30 includes a circuit configured to measure a capacitance (hereinafter simply referred to as "capacity") of the capacitor 10a, and a detection circuit configured to detect misalignment. Alternatively, the measurement section 30 may function as a terminal for output (an electrode or a pad), and in this case, when the measurement section 30 is connected to various electric meters, a measurement circuit, or the like, capacity measurement and alignment detection are performed. As a capacity measurement technique, there are various techniques, and the capacity measurement technique is not specifically limited, but examples of the capacity measurement technique may include a technique using an AC ammeter, a bridge method, a technique using an LCR measuring device, a technique by a charge time constant, and a CBCM (Charge Based Capacitance Measurement) method. Misalignment is detected by a relative comparison of respective measured capacities of the plurality of capacitors 10a in the device group 1A. Respective operations (a test method with use of the semiconductor unit 1) of the capacity measurement and alignment detection will be described below.

[Test Method]

In the semiconductor unit 1 according to this embodiment, misalignment detection is performed by electrical measurement with use of the capacitors 1A of the device group 1A with the above-described configuration. Based on a result of the detection, defect judgment is performed on each region in a semiconductor wafer surface. More specifically, first, when respective predetermined signals are input to the respective selector circuits 20X and 20Y by a control section (not illustrated), the plurality of capacitors 10a in the device group 1A are sequentially switched from one to another to be connected to the measurement section 30. FIG. 9 illustrates examples of a combination of selection signals input to the selector circuits 20X and 20Y (more specifically, then input switching circuit 210 illustrated in FIG. 7B) and output signals. It is to be noted that, respective selection signals input to the respective selector circuits 20X and 20Y may be different from each other, or a same signal may be used as the selection signals.

In the capacitor 10a selected by the selector circuits 20X and 20Y (connected to the measurement section 30), the capacity is measured in the measurement section 30 (or though the measurement section 30) by various measurement techniques. An example of the capacity measurement technique will be described below.

(Capacity Measurement)

1. Measurement by AC Ammeter

For example, an AC current with a known amplitude and a known frequency flows through the capacity 10a, and a capacity C is allowed to be determined by the following expression (1), where f is frequency.

$$I = 2\pi f C V \quad (1)$$

2. Bridge Method

Figure 10A:
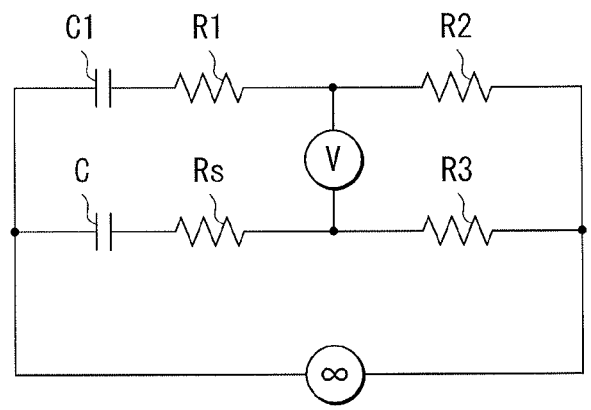
FIG. 10A is a circuit diagram for describing an example (a bridge method) of a capacity measurement technique.

As a technique of measuring a capacity with use of an AC current as with the above-described measurement, a so-called bridge method may be used, and allows high-precision capacity measurement. An example of a measurement circuit by the bridge method is illustrated in FIG. 10A. In this case, a capacity C1, and resistances R1, R2, and R3 are so adjusted as not to allow a current to flow through two bridge circuits (i.e., as to allow a voltage to be V=0), and the capacity C is allowed to be determined by the respective values of the capacity C1, and the resistances R1, R2, and R3 at that time.

3. Measurement Using LCR Measuring Device

Alternatively, there is a technique of measuring a capacity from a resonant frequency. In this case, the capacity C is allowed to be determined by the following expression (2) by forming a resonant circuit by a combination of coils with known inductances and measuring a resonant frequency.

$$f = 1/\{2\pi \cdot (LC)^{1/2}\} \quad (2)$$

Figure 10B:
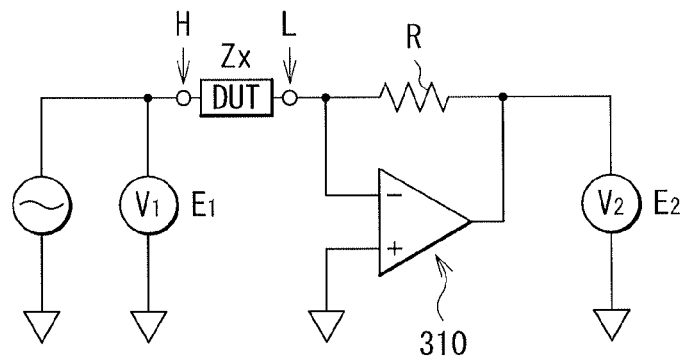
FIG. 10B is a circuit diagram for describing an example (a technique using an LCR measuring device) of the capacity measurement technique.

The LCR measuring device is used to measure the resonant frequency. A representative measurement system of the LCR measuring device is an automatic balance bridge method using a circuit as illustrated in FIG. 10B. It is to be noted that "DUT" in FIG. 10B stands for Device Under Test, and corresponds to an object to be measured. Moreover, a high gain amplifier 310 is configured to automatically adjust a gain to allow respective currents flowing through a feedback resistor R and the DUS to be equal to each other, i.e., to allow a low-potential side (an L terminal side in the diagram) to be consistently a virtual ground (a potential of 0). At an input voltage $E_1$ and an output voltage $E_2$ at this time, phase angles $\theta_1$ and $\theta_2$ are measured by the following expressions (3) and (4). An impedance Zx of the DUT is determined from these results and the feedback resistor R by the following expressions (5) and (6). Then, the capacity C of the DUT is allowed to be determined from a value of an imaginary part Xx of a real part (Rx) and the imaginary part (Xx) in the impedance Zx, based on the following expression (7), where j is an imaginary number.

$$E_1 = |E_1| \cdot \cos \theta_1 + j \cdot |E_1| \cdot \sin \theta_1 \quad (3)$$

$$E_2 = |E_2| \cdot \cos \theta_2 + j \cdot |E_2| \cdot \sin \theta_2 \quad (4)$$

$$Zx = R \cdot E_1/E_2 \quad (5)$$

$$Zx = R \cdot |E_1|/|E_2| \cdot \{\cos(\theta_1 - \theta_2) + j \cdot \sin(\theta_1 - \theta_2)\} \quad (6)$$

$$Xx = j/\omega C \quad (7)$$

4. Technique by Charge Time Constant

Moreover, the capacity C is allowed to be determined with use of a relationship of the following expression (8) by charging the capacitor 10a and measuring a time t until reaching a fixed voltage V (or measuring a voltage V reached after a lapse of a fixed time t).

$$V = (I/C) \cdot t \quad (8)$$

5. CBCM Method

Figure 11:
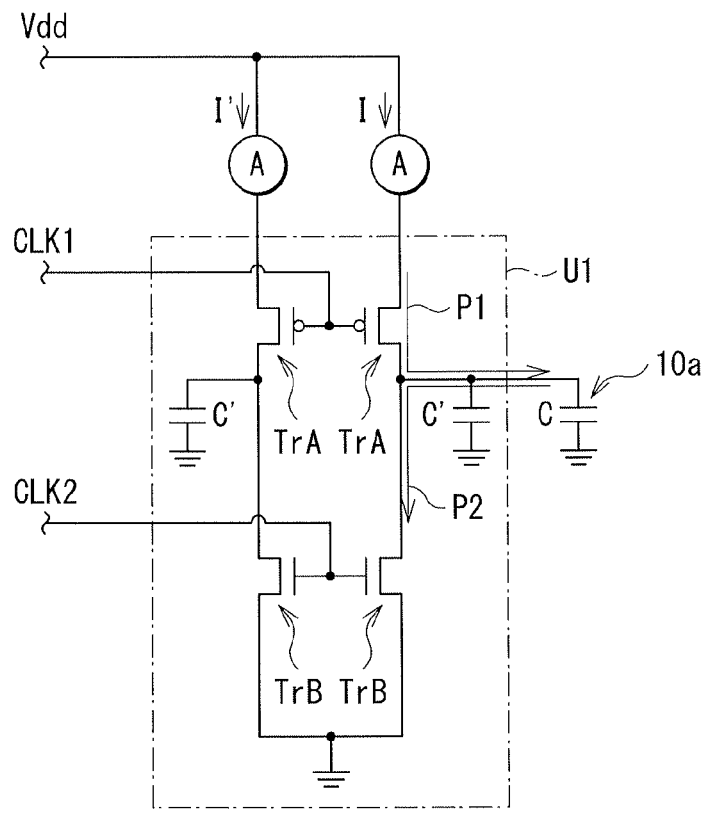
FIG. 11 is a circuit diagram for describing an example (a CBCM method) of the capacity measurement technique.

To measure an extremely small capacity, the CBCM method in consideration of a wiring capacity (parasitic capacity) may be used. FIG. 11 illustrates an example of a measurement circuit by the CBCM method. In a case where the capacity C to be measured is extremely small, an influence of a parasitic capacity C' by wiring or the like is increased. In the CBCM method, a reference circuit U1 configured to remove the influence of the parasitic capacity C' is used. More specifically, in the reference circuit U1, a pair of transistors TrA for charge (PMOSs in this case) and a pair of transistors TrB for discharge (NMOSs in this case) are provided, and are so configured as to allow wiring configurations thereof to be symmetric. Therefore, same parasitic capacities C' are generated in respective combinations of the transistor TrA and the transistor TrB, and the influence of the parasitic capacities C' is allowed to be removed in the end. The capacitor 10a to be measured is connected to one of the transistors Tr1 and one of the transistors TrB of such a reference circuit U1.

Figure 12:
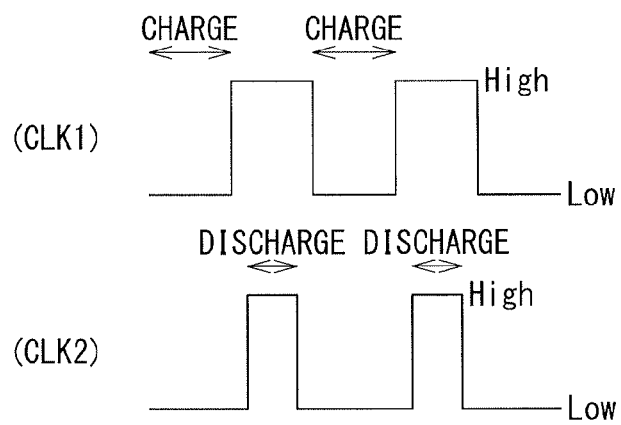
FIG. 12 is a schematic view illustrating an example of an input signal for charge and an input signal for discharge in a circuit illustrated in FIG. 11.

In such a measurement circuit, the capacitor 10a is charged and discharged. FIG. 12 illustrates an example of waveforms of signals CLK1 and CLK2 input to gates of the transistors TrA and gates of the transistors TrB. First, when the signal CLK1 input to the transistors TrA is at a low level and the signal CLK2 input to the transistors TrB is at a high level, the capacitor 10a is charged (P1 in FIG. 11). At this time, the parasitic capacities C' of the reference circuit U1 are also charged. It is to be noted that, in this case, the PMOSs are used as the transistors TrA; therefore, the transistors TrA are turned on when the signal CLK1 is at the low level and is turned off when the signal CLK1 is at the high level. However, when the PMOSs and NMOSs are turned on concurrently, a through current flows; therefore, an ON period of the signal CLK2 may be preferably set to be shorter than an OFF period of the signal CLK1.

Next, when the signal CLK1 input to the transistors TrA is at the high level and the signal CLK2 input to the transistors TrB is at the low level, the capacitor 100a is discharged (P2 in FIG. 11). At this time, the parasitic capacities C' of the reference circuit U1 are also discharged. It is to be noted that, since the NMOSs are used as the transistors TrB, the transistors TrB are turned on when the signal CLK2 is at the high level and are turned off when the signal CLK2 is at the low level.

After charge and discharge, currents I and I' in FIG. 11 are measured, and a difference between the currents I and I' is determined. In this case, the current I is a current flowing through the capacitor 10a and the parasitic capacity C', and the current I' is a current flowing only through the parasitic capacity C'. Therefore, the parasitic capacities C' cancel out each other by determining the difference between the currents I and I', and the capacity C is allowed to be determined by the following expression (9). It is to be noted that f is a measurement frequency, and is set within a range of about 1 kHz to several tens of MHz.

$$I-I'=C \cdot Vdd \cdot f \qquad (9)$$

Figure 13:
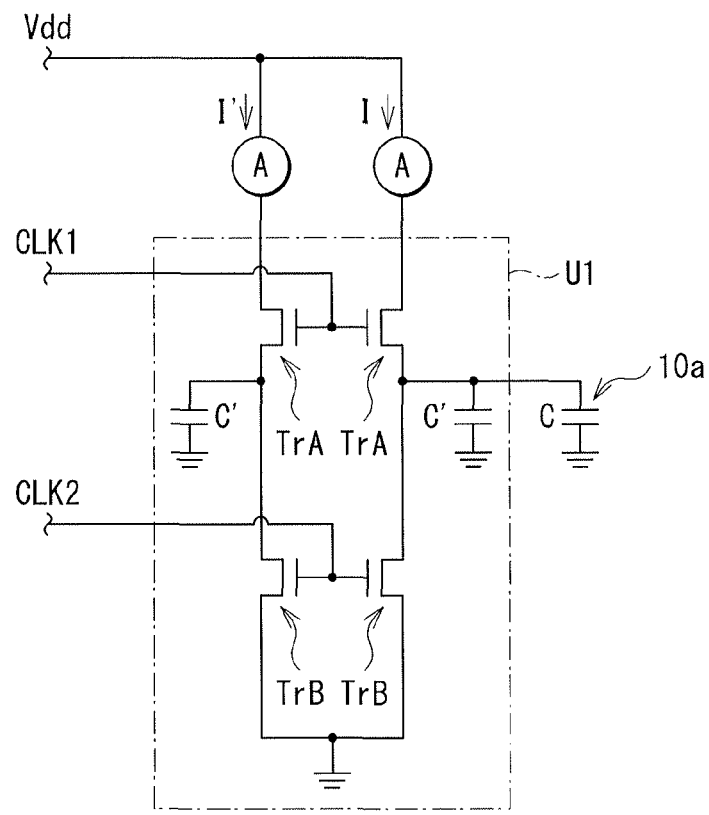
FIG. 13 is a circuit diagram for describing an example (the CBCM method) of the capacity measurement technique.
Figure 14:
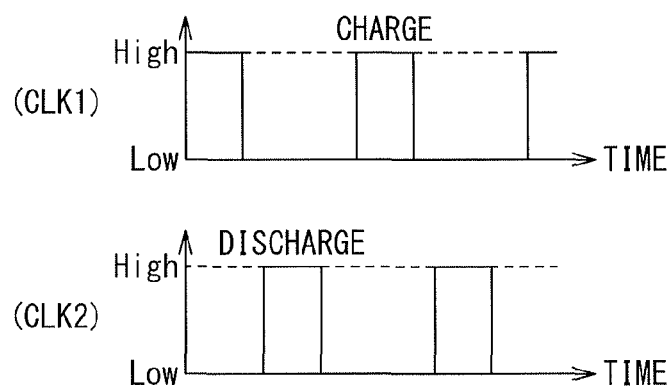
FIG. 14 is a schematic view illustrating an example of an input signal for charge and an input signal for discharge in a circuit illustrated in FIG. 13.

It is to be noted that, in the above-described reference circuit U1, an example in which the PMOSs are used as the transistors TrA for charge is described; however, the transistors TrA may be NMOSs as illustrated in FIG. 13. Moreover, FIG. 14 illustrates an example of waveforms of the signals CLK1 and CLK2 input to the gates of the transistors TrA and the gates of the transistors TrB in this case. In a case where the transistors TrA are NMOSs, the transistors TrA are turned on when the signal CLK1 is at the high level, and are turned off when the signal CLK1 is at the low level. However, since the transistors TrA for charge are provided on a side closer to a reference potential Vdd, when the PMOSs are used as the transistors TrA, on-resistance is lower than that in a case where the NMOSs are used as the transistors TrA; therefore, efficiency is higher.

Figure 15:
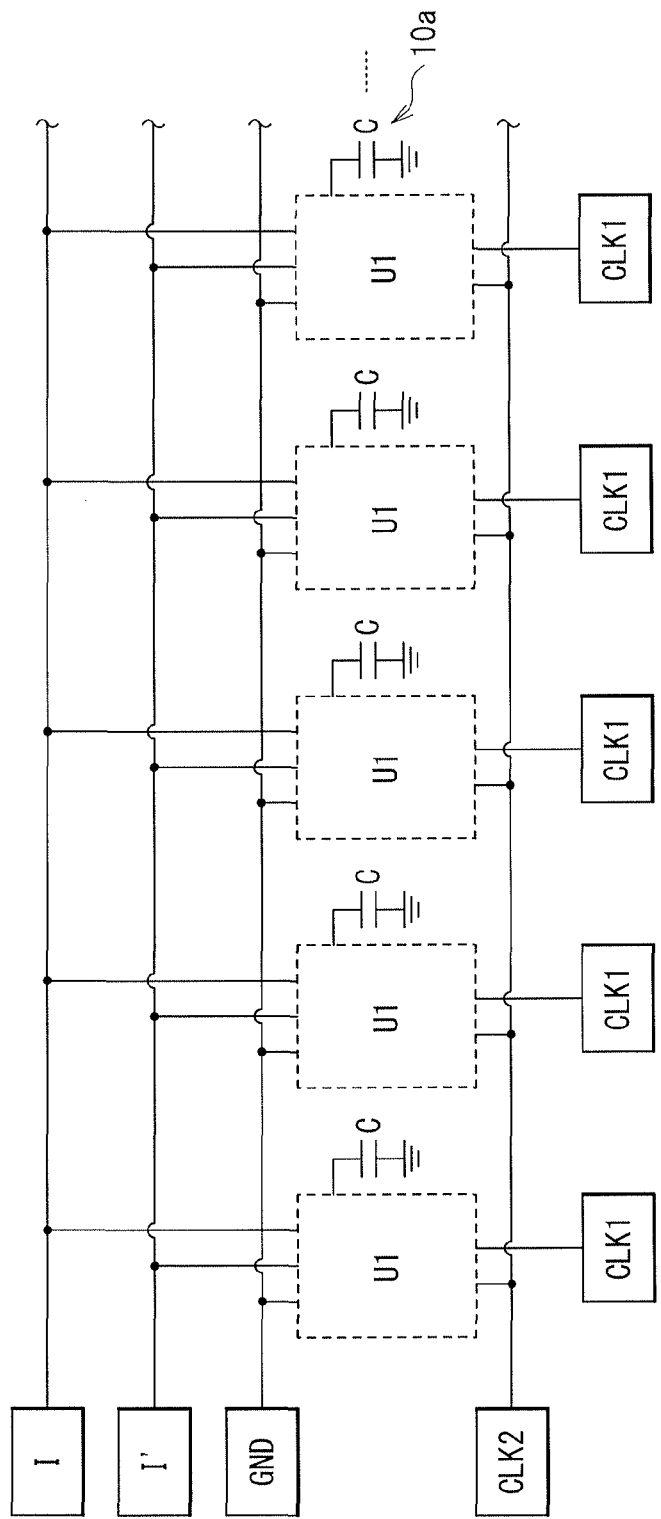
FIG. 15 is a circuit diagram illustrating a layout example in a case where a reference circuit is provided to each capacitor.

Moreover, FIG. 15 illustrates a circuit layout in a case where a plurality (for example, an equal number to the number of capacitors 10a configuring the device group 1A) of the above-described measurement circuits are provided.

In this example, the reference circuit U1 is provided to each of the capacitors 10a; therefore, the parasitic capacity is allowed to be precisely removed. It is to be noted that input terminals for the signals CLK1 and CLK2 may be provided to each of the capacitors 10a, or may be shared among the capacitors 10a. In this case, the input terminal for the signal CLK1 is provided to each of the capacitors 10a, and the input terminal for the signal CLK2 is shared among the respective capacitors 10a.

Figure 16:
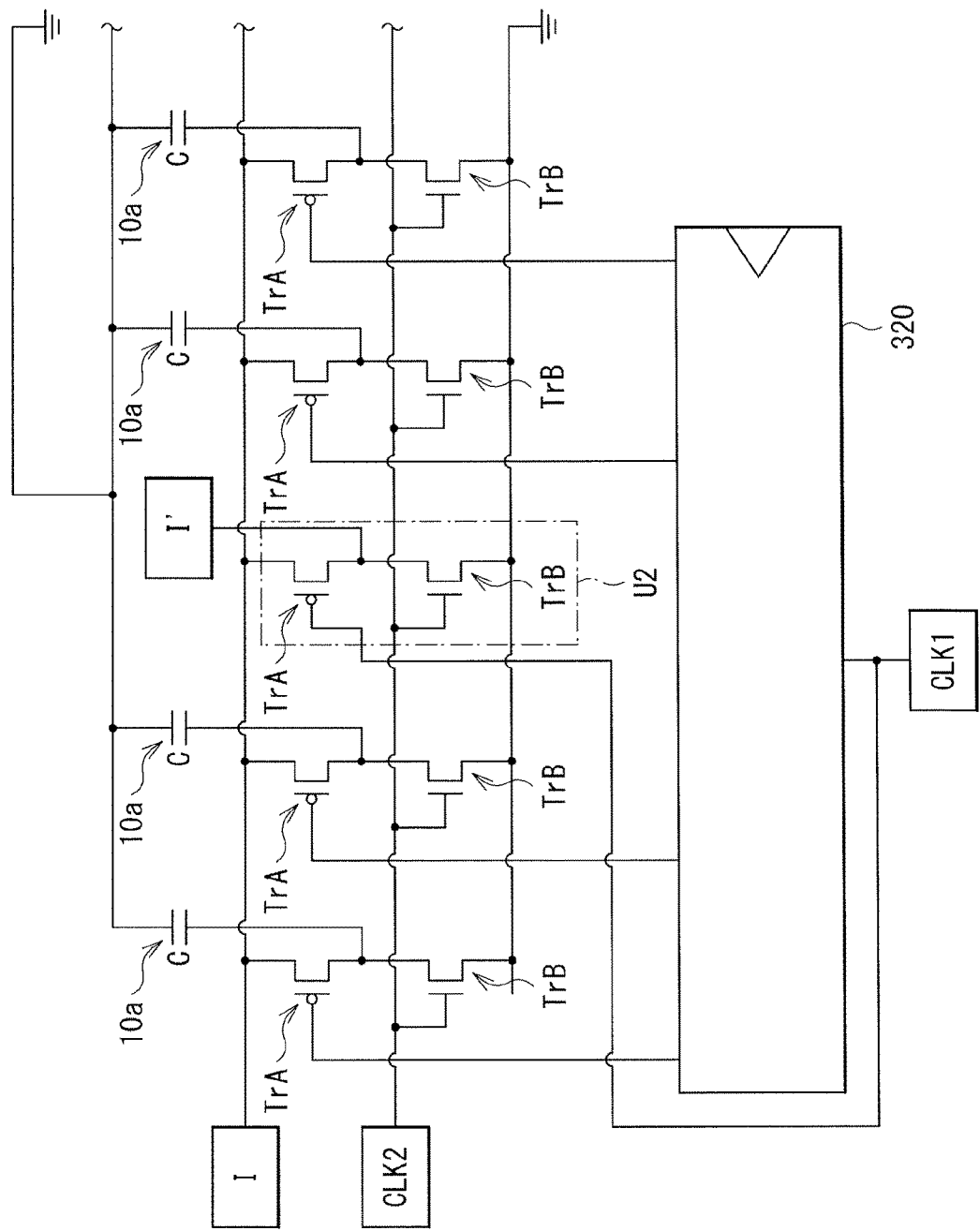
FIG. 16 is a circuit diagram illustrating a layout example in a case where a reference circuit common to respective capacitors is provided.

Alternatively, as illustrated in FIG. 16, one reference circuit U2 including the transistors TrA and TrB for removal of the parasitic capacity may be provided for a plurality of capacitors 10a. In this case, the signal CLK1 is sequentially input to the transistors TrA for charge of the respective capacitors 10a by a selector circuit 320. By such a circuit layout, a space for a reference circuit portion is allowed to be reduced, compared to the example illustrated in FIG. 15.

When the capacity of each of the plurality of capacitors 10a in the device group 1A is measured by the above-described technique in the measurement section 30 (or through the measurement section 30), misalignment (an misalignment amount) is detected by a relative comparison of respective measured capacities. An algorithm of misalignment detection in this embodiment will be described below.
(Misalignment Detection)

Figure 17A:
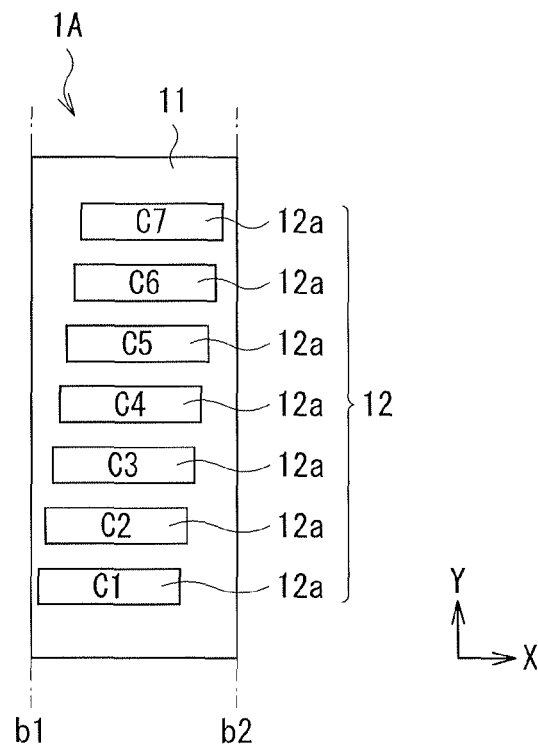
FIG. 17A is a schematic view illustrating a layout in a device group (without misalignment) at a reference position.

FIG. 17A schematically illustrates a layout of the first conductive layer 11 and the second conductive layer 12 in reference positions. In this example, the first conductive layer 11 and the second conductive layer 12 are arranged in a state in which all of the sub-conductive layers 12a configuring the second conductive layer 12 are located inside the edges b1 and b2 of the first conductive layer 11 (do not protrude from the edges b1 and b2). Such an arrangement will be described as a reference layout in which misalignment does not occur between the first conductive layer 11 and the second conductive layer 12, i.e., a reference layout formed according to a design value. Moreover, for convenience sake, seven capacitors 10a corresponding to seven sub-conductive layers 12a are denoted by reference numerals C1 to C7, and will be described below.

Figure 17B:
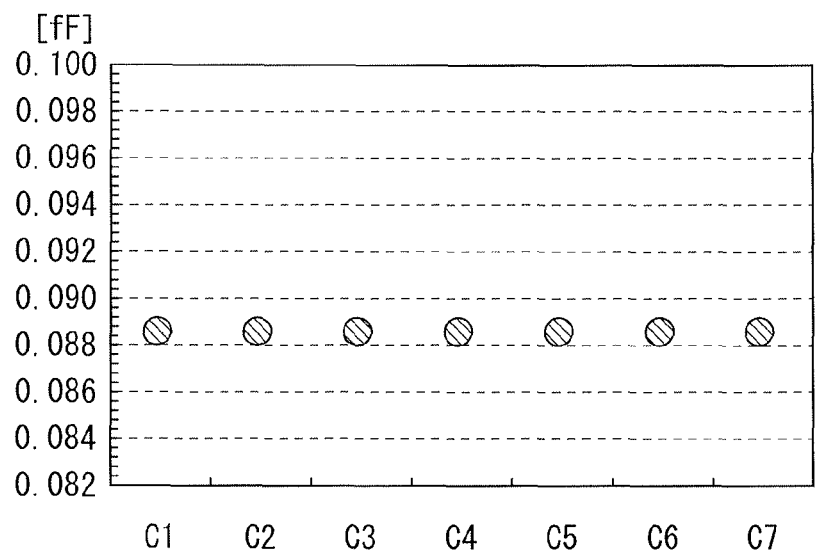
FIG. 17B is a characteristic diagram illustrating an example of measured capacities in the device group with the layout illustrated in FIG. 17A.

FIG. 17B illustrates an example of a result of measuring capacities [fF (femtofarad)] of the capacitors C1 to C7 arranged in the layout illustrated in FIG. 17A. In a case where misalignment does not occur in such a manner, the capacitors C1 to C7 have capacities substantially equal to one another. Therefore, in a case where the measured capacities of the capacitors C1 to C7 are compared to one another, and the capacities are not specifically changed, it is allowed to be determined that misalignment does not occur. An example of a change in capacity when misalignment occurs with use of this example as a reference will be described below.

Figure 18A:
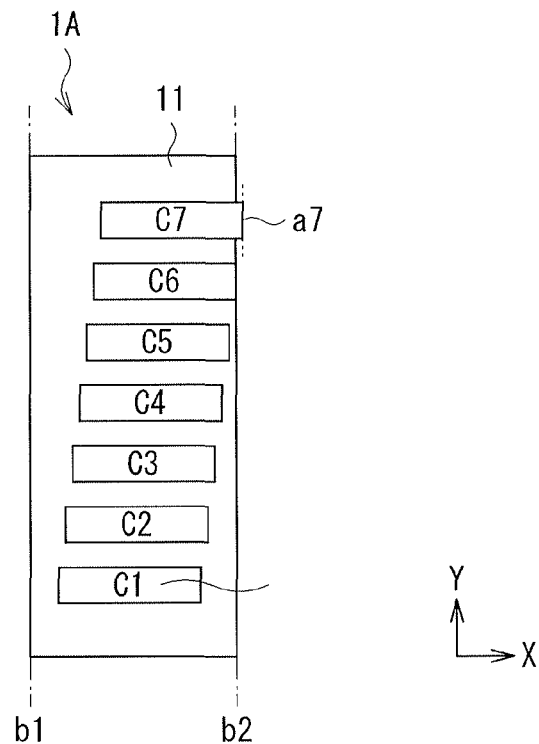
FIG. 18A is a schematic view illustrating a layout in a device group in a case where misalignment (small) occurs.

FIG. 18A schematically illustrates a layout of the first conductive layer 11 and the second conductive layer 12 (in a case where relatively small misalignment from a reference position occurs). In this example, the first conductive layer 11 and the second conductive layer 12 are arranged in a state in which only one or more (a short side a7 of the sub-conductive layer 12a corresponding to the capacitor C7 in this case) of the sub-conductive layers 12a configuring the second conductive layer 12 protrude outward from the edge b2 of the first conducive layer 11.

Figure 18B:
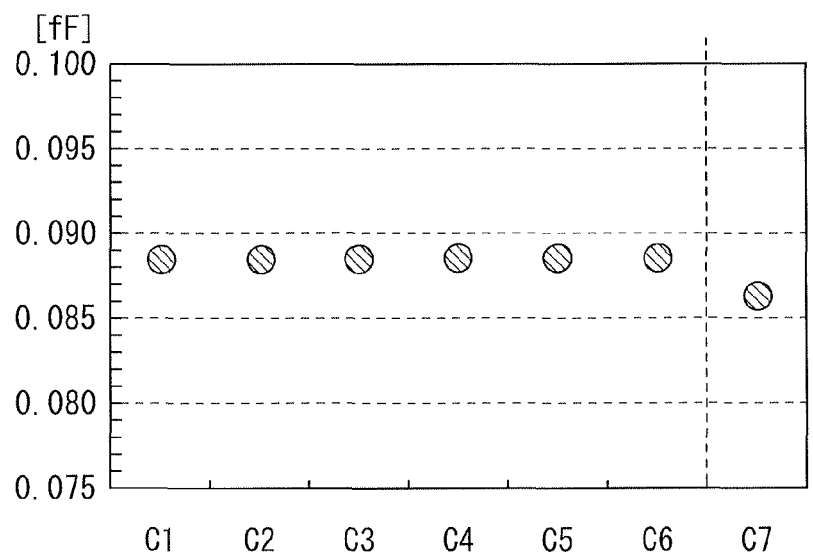
FIG. 18B is a characteristic diagram illustrating an example of measured capacities in the device group with the layout illustrated in FIG. 18A.

FIG. 18B illustrates an example of a result of measuring the capacities [fF (femtofarad)] of the capacitors C1 to C7 arranged in the layout illustrated in FIG. 18A. For example, in a case where extremely small misalignment occurs along the X-axis direction in such a manner, in the capacitor C7, an area where the sub-conductive layer 12a and the first conductive layer 11 are superimposed on each other is reduced, and the capacitor C7 has a smaller capacity than the other capacitors C1 to C6. In other words, since the plurality of sub-conductive layers 12a are so arranged as to be shifted in a stepwise fashion, in a case where the above-described extremely small misalignment occurs, a change in capacity occurs in one or more of the capacitors C1 to C7 (one or more of the capacities are reduced). The capacities of these capacitors C1 to C7 are compared to one another, and the misalignment amount is allowed to be determined easily, based on a boundary between a portion where the capacity is changed in a stepwise fashion and a portion where the capacity is not changed (for example, between the capacitors C6 and C7 in this case) and the layout of the plurality of sub-conductive layers 12a (planar shapes of the sub conducive layer 12a, the intervals d2, and the like).

It is to be noted that the misalignment amount detected with use of one device group 1A is only misalignment along one axis direction, and in this example, the misalignment amount along the X-axis direction is detectable. Therefore, as illustrated in FIG. 5, the device groups 1A may be preferably provided along two directions, i.e., the X-axis direction and the Y-axis direction.

Figure 19A:
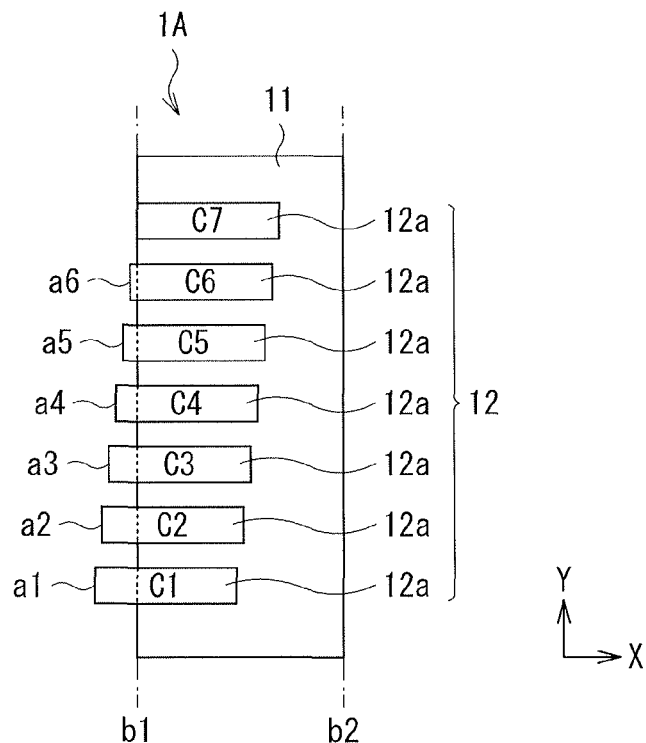
FIG. 19A is a schematic view illustrating a layout of a device group in a case where misalignment (large) occurs.

FIG. 19A schematically illustrates a layout of the first conductive layer 11 and the second conductive layer 12 (in a case where relatively large misalignment from the reference position occurs). In this example, the first conductive layer 11 and the second conductive layer 12 are arranged in a state in which ends of half or more (short sides a1 to a6 of the sub-conductive layers 12a corresponding to the capacitors C1 to C6 in this case) of the sub-conductive layers 12a configuring the second conductive layer 12 protrude (project) outward from the edge b1 of the first conductive layer 11.

Figure 19B:
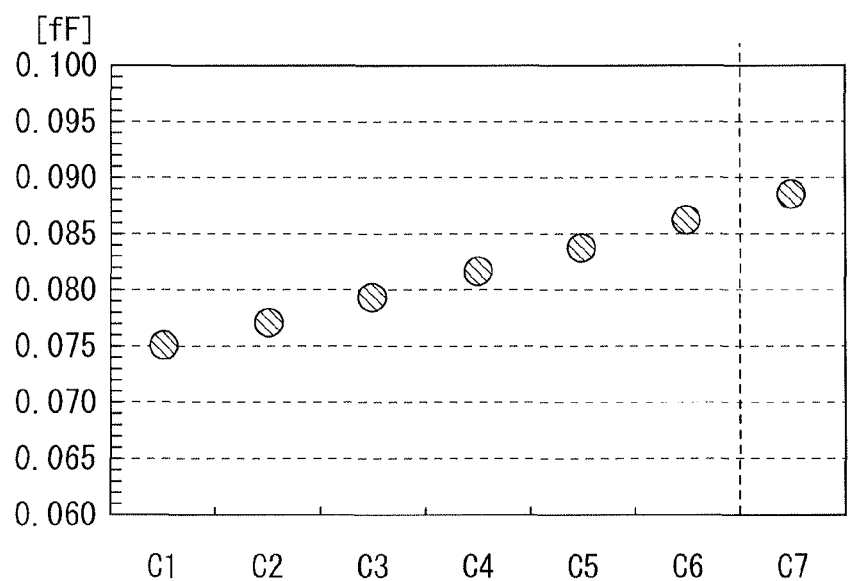
FIG. 19B is a characteristic diagram illustrating an example of measured capacities in the device group with the layout illustrated in FIG. 19A.

FIG. 19B illustrates an example of a result of measuring capacities [fF (femtofarad)] of the capacitors C1 to C7 arranged in the layout illustrated in FIG. 19A. For example, in a case where misalignment occurs along the X-axis direction, in the capacitors C1 to C7, areas where the sub-conductive layer 12a and the first conductive layer 11 are superimposed on each other are changed in a stepwise fashion, thereby changing the capacities of the capacitors C1 to C7 in a stepwise fashion (downward to the left). In other words, since the plurality of sub-conductive layers 12a are so arranged as to be shifted in a stepwise fashion, in a case where misalignment occurs, a stepwise change in capacity occurs in the capacitors C1 to C7 according to the misalignment amount. The capacities of these capacitors C1 to C7 are relatively compared to one another, and the misalignment amount is allowed to be determined easily, based on a boundary between a portion where the capacity is changed in a stepwise fashion and a portion where the capacity is not changed (for example, between the capacitors C6 and C7 in this case) and the layout of the plurality of sub-conductive layers 12a (the planar shape of the sub conducive layers 12a, the intervals d2, and the like).

Figure 20A:
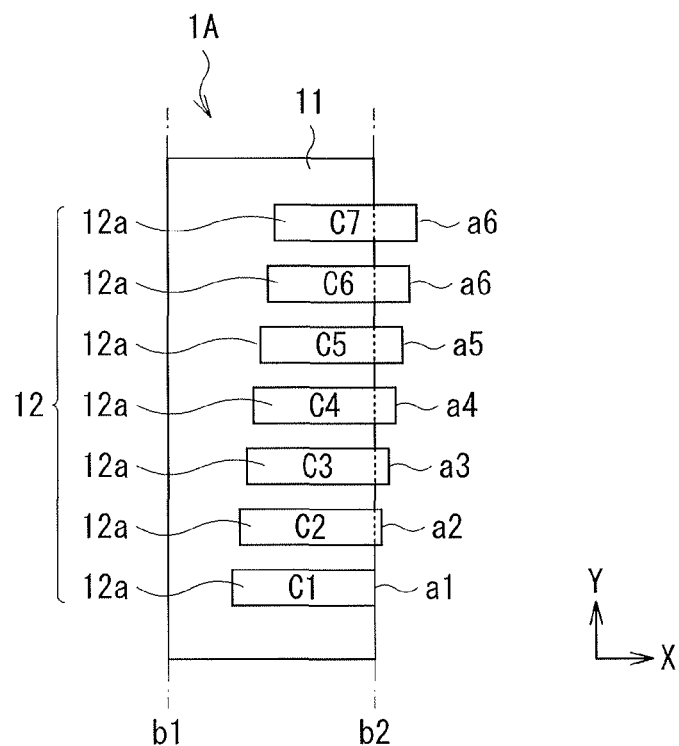
FIG. 20A is a schematic view illustrating a layout in a device group in a case where misalignment (large) occurs.

FIG. 20A schematically illustrates a layout of the first conductive layer 11 and the second conductive layer 12 (in a case where relatively large misalignment from the reference position occurs). In this example, the first conductive layer 11 and the second conductive layer 12 are arranged in a state in which ends of half or more (short sides a2 to a7 of the sub-conductive layers 12a corresponding to the capacitors C2 to C7 in this case) of the sub-conductive layers 12a configuring the second conductive layer 12 protrude outward from the edge b2 of the first conductive layer 11.

Figure 20B:
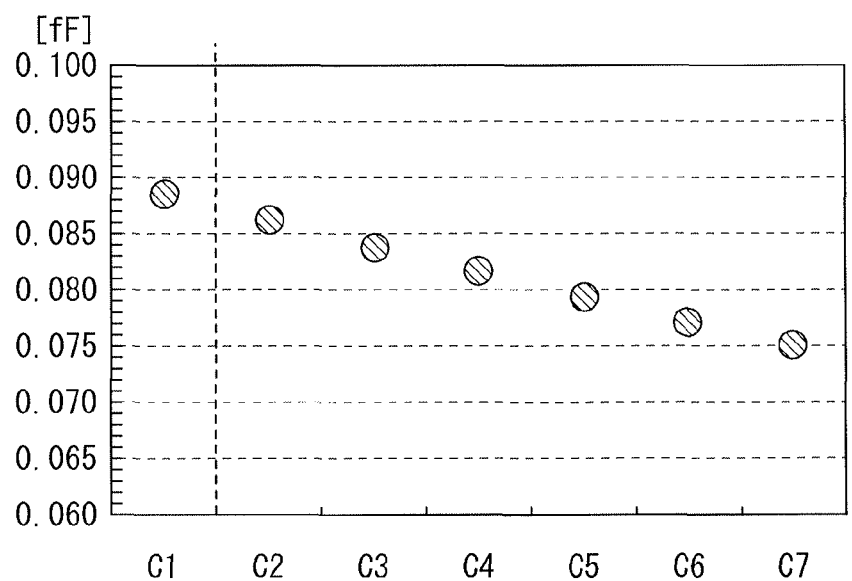
FIG. 20B is a characteristic diagram illustrating an example of measured capacities in the device group with the layout illustrated in FIG. 20A.

FIG. 20B illustrates an example of a result of measuring capacities [fF (femtofarad)] of the capacitors C1 to C7 arranged in the layout illustrated in FIG. 20A. For example, in a case where misalignment occurs along the X-axis direction, in the capacitors C1 to C7, areas where the sub-conductive layer 12a and the first conductive layer 11 are superimposed on each other are changed in a stepwise fashion, thereby changing the capacities in a stepwise fashion (downward to the right). In other words, since the plurality of sub-conductive layers 12a are so arranged as to be shifted in a stepwise fashion, in a case where misalignment occurs, a stepwise change in capacity occurs in the capacitors C1 to C7 according to the misalignment amount. The capacities of these capacitors C1 to C7 are relatively compared to one another, and the misalignment amount is allowed to be determined easily, based on a boundary between a portion where the capacity is changed in a stepwise fashion and a portion where the capacity is not changed (for example, between the capacitors C1 and C2 in this case) and the layout of the plurality of sub-conductive layers 12a (the planar shapes of the sub conducive layer 12a, the intervals d2, and the like).

Moreover, when the example illustrated in FIGS. 19A and 19B and the example illustrated in FIGS. 20A and 20B are compared to each other, a slope of the stepwise change in capacity in the capacitors C1 to C7 differs depending on a direction of misalignment that occurs along the X-axis direction. Therefore, the direction where misalignment occurs is allowed to be determined, based on the slope (downward to the right, downward to the left, or the like) of the stepwise change.

Further, in the above-described examples, misalignment that occurs between the first conductive layer 11 and the second conductive layer 12 is detected; however, even in a case where one of the first conductive layer 11 and the second conductive layer 12 is formed to be smaller (or larger) than the design value, a change in capacity occurs; therefore, a difference in size is also detectable.

Figure 21A:
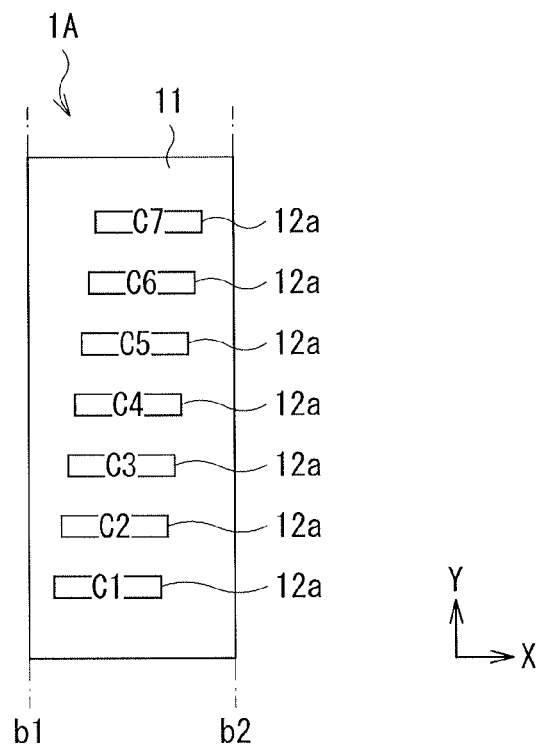
FIG. 21A is a schematic view illustrating a layout in a device group in a case where a second conductive layer is smaller than a design value.
Figure 21B:
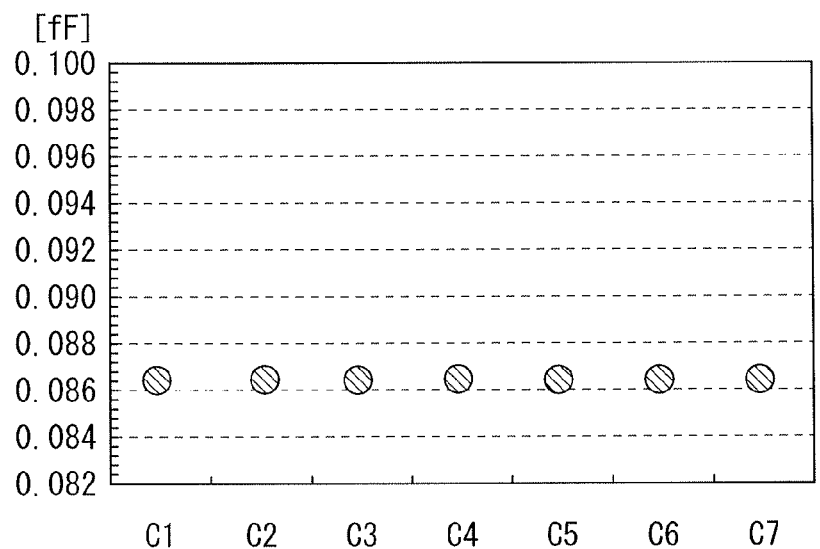
FIG. 21B is a characteristic diagram illustrating an example of measured capacities in the device group with the layout illustrated in FIG. 21A.

For example, as illustrated in FIG. 21A, in a case where the second conductive layer 12 is formed to be smaller than the design value, as illustrated in FIG. 21B, for example, smaller capacities than the measurement result in FIG. 17B may be measured. Thus, in a case where capacities according to the design value are known, even if a difference in size occurs in addition to misalignment, the occurrence of the difference in size is allowed to be detected, based on a change in capacity.

Figure 22A:
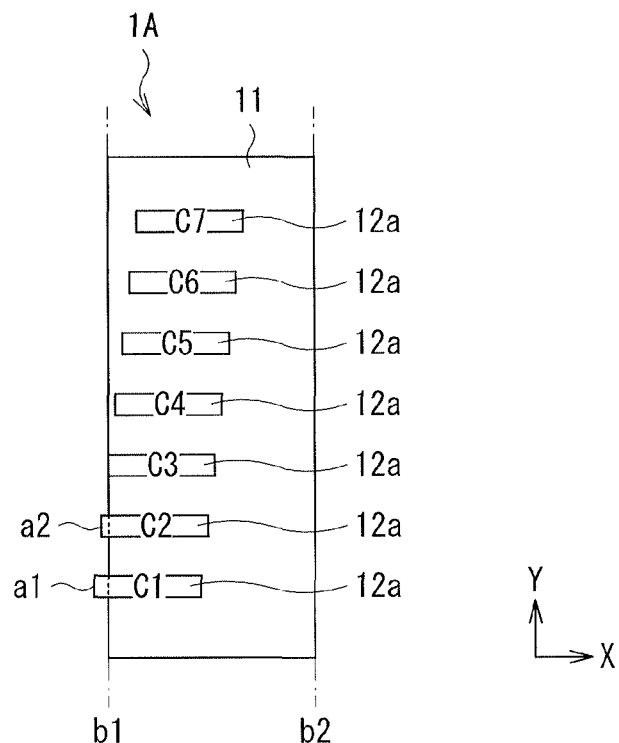
FIG. 22A is a schematic view illustrating a layout in a case where further misalignment occurs in the device group in FIG. 21A.
Figure 22B:
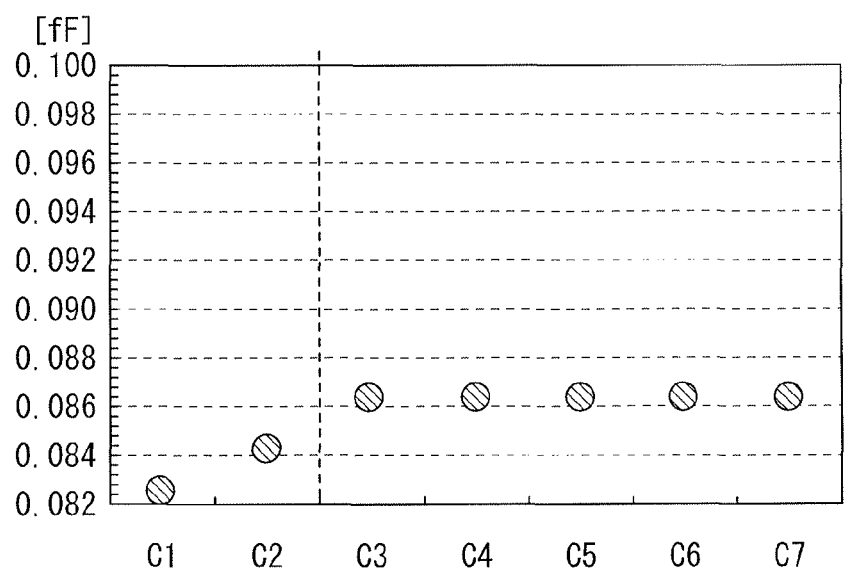
FIG. 22B is a characteristic diagram illustrating an example of measured capacities in the device group with the layout illustrated in FIG. 22A.

Moreover, as illustrated in FIG. 22A, in a case where both misalignment and a difference in size occur, for example, a measurement result may be as illustrated in FIG. 22B. In this example, the short sides a1 and a2 of the sub-conductive layers 12a corresponding to the capacitors C1 and C2 are so arranged as to protrude from the edge b1 of the first conductive layer 11, and the second conductive layer 12 is formed to be smaller than the design value. In this case, when the respective capacities of the capacitors C1 to C7 are compared to one another, for example, while a change in capacity occurs around a boundary between the capacitors C2 and C3, in a portion where a stepwise change in capacity does not occur (a portion corresponding to the capacitors C3 to C7), the values of the capacities are smaller than the measurement result in FIG. 17B. Therefore, both the misalignment amount and the occurrence of the difference in size are detectable.

Figure 23A:
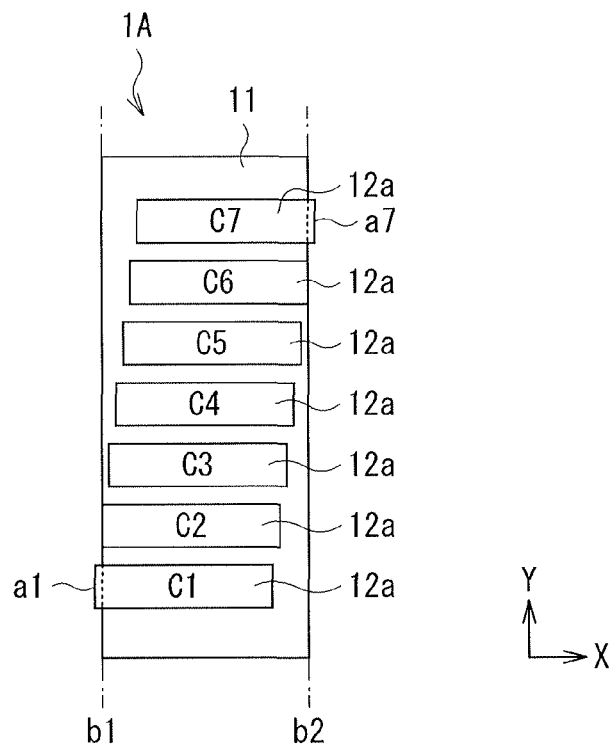
FIG. 23A is a schematic view illustrating a layout of a device group in a case where the second conductive layer is larger than the design value.
Figure 23B:
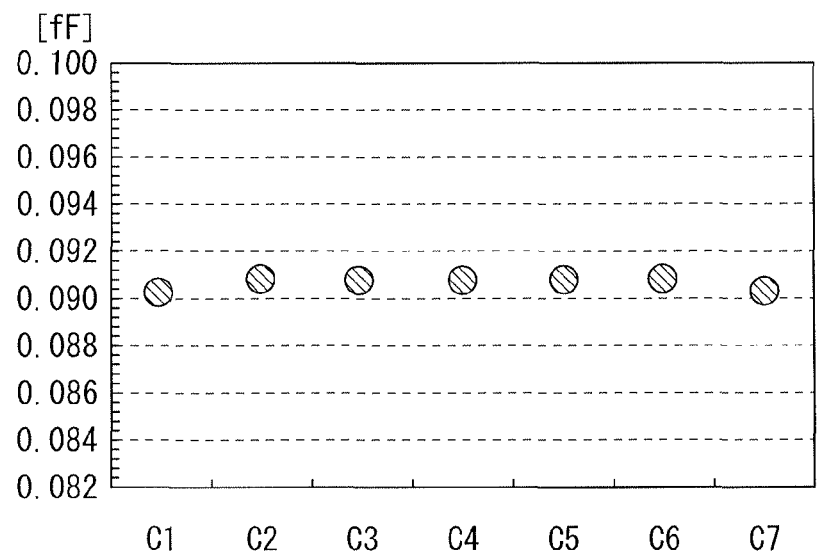
FIG. 23B is a characteristic diagram illustrating an example of measured capacities in the device group with the layout illustrated in FIG. 23A.

On the other hand, as illustrated in FIG. 23A, in a case where the second conductive layer 12 is formed to be larger than the design value, as illustrated in FIG. 23B, for example, larger capacities than the measurement result in FIG. 17B may be measured. Moreover, in this example, the short sides a1 and a7 of the uppermost and lowermost sub-conductive layers 12a (the sub-conductive layers 12a corresponding to the capacitors C1 and C7) protrude from the edges b1 and b2; therefore, the capacities of the capacitors C1 and C7 located on respective ends in FIG. 23B are slightly smaller than those of the other capacitors C2 to C6.

Figure 24A:
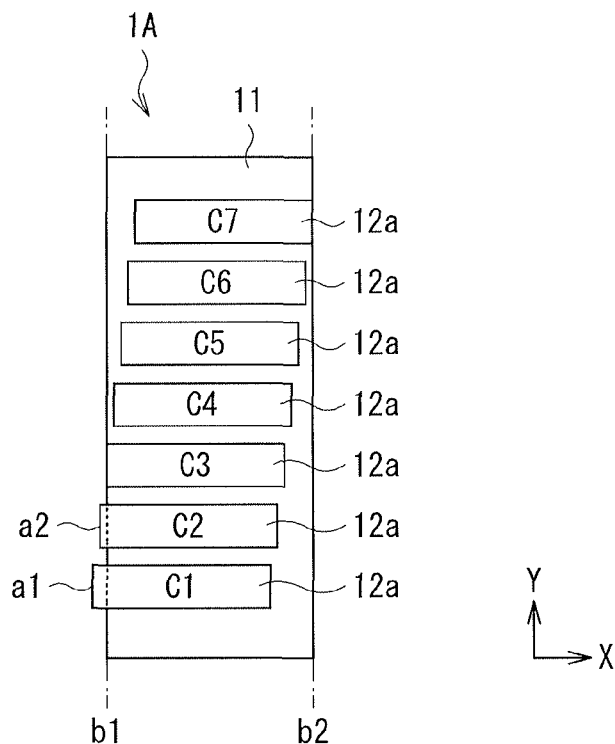
FIG. 24A is a schematic view illustrating a layout in a case where further misalignment occurs in the device group in FIG. 23A.
Figure 24B:
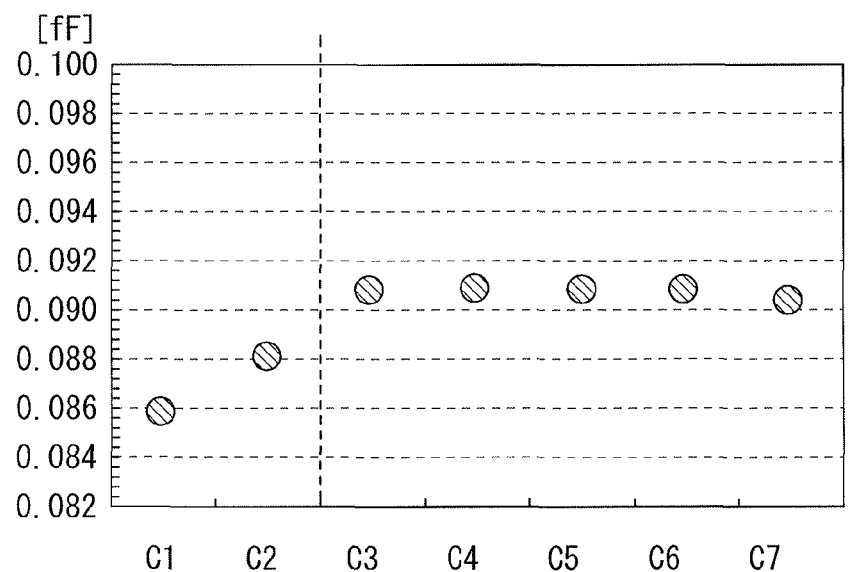
FIG. 24B is a characteristic diagram illustrating an example of measured capacities in the device group with the layout illustrated in FIG. 24A.

Further, as illustrated in FIG. 24A, in a case where the second conductive layer 12 is formed to be larger than the design value, and both misalignment and a difference in size occur, for example, a measurement result as illustrated in FIG. 24B may be obtained. In this example, the short sides a1 and a2 of the sub-conductive layers 12a corresponding to the capacitors C1 and C2 are so arranged as to protrude outward from the edge b1 of the first conductive layer 11, and the second conductive layer 12 is formed to be larger than the design value. In this case, when the respective capacities of the capacitors C1 to C7 are compared to one another, for example, while a change in capacity occurs around a boundary between the capacitors C2 and C3, in a portion where a stepwise change in capacity does not occur (a portion corresponding to the capacitors C3 to C7), the values of the capacities are larger than the measurement result in FIG. 17B.

As described above, in this embodiment, in the device group 1A, the ends (the short sides a1 to a7) of the plurality of sub-conductive layers 12a configuring the second conductive layer 12 are arranged in relatively different positions with respect to the edges b1 and b2 of the first conductive layer 11. Therefore, when the respective capacities of the plurality of capacitors 10a are measured, and the respective measured capacities are relatively compared to one another, misalignment between the first conductive layer 11 and the second conductive layer 12 is allowed to be detected.

(Defect Judgment)

After each device group 1A performs misalignment detection, the presence or absence of a defect is allowed to be judged, based on a result of the misalignment detection. For example, a case where the detected misalignment amount exceeds a tolerance level (a predetermined threshold value) is allowed to be judged as a defect. This defect judgment is allowed to be performed by a user of the semiconductor unit 1 such as an IC manufacturer. Moreover, judgment is allowed to be performed on each region (each selective region in the wafer or each IC chip) by providing the device groups 1A at various positions in a wafer surface. More specifically, an IC formed around the device group 1A that detects misalignment, or an IC formed adjacent to such a device group 1A is allowed to be judged as a defective item. Therefore, in the wafer surface, a point where a defect caused by misalignment is produced is precisely detectable, and defect judgment on each IC chip is possible. An efficient semiconductor process is achievable.

Figure 25:
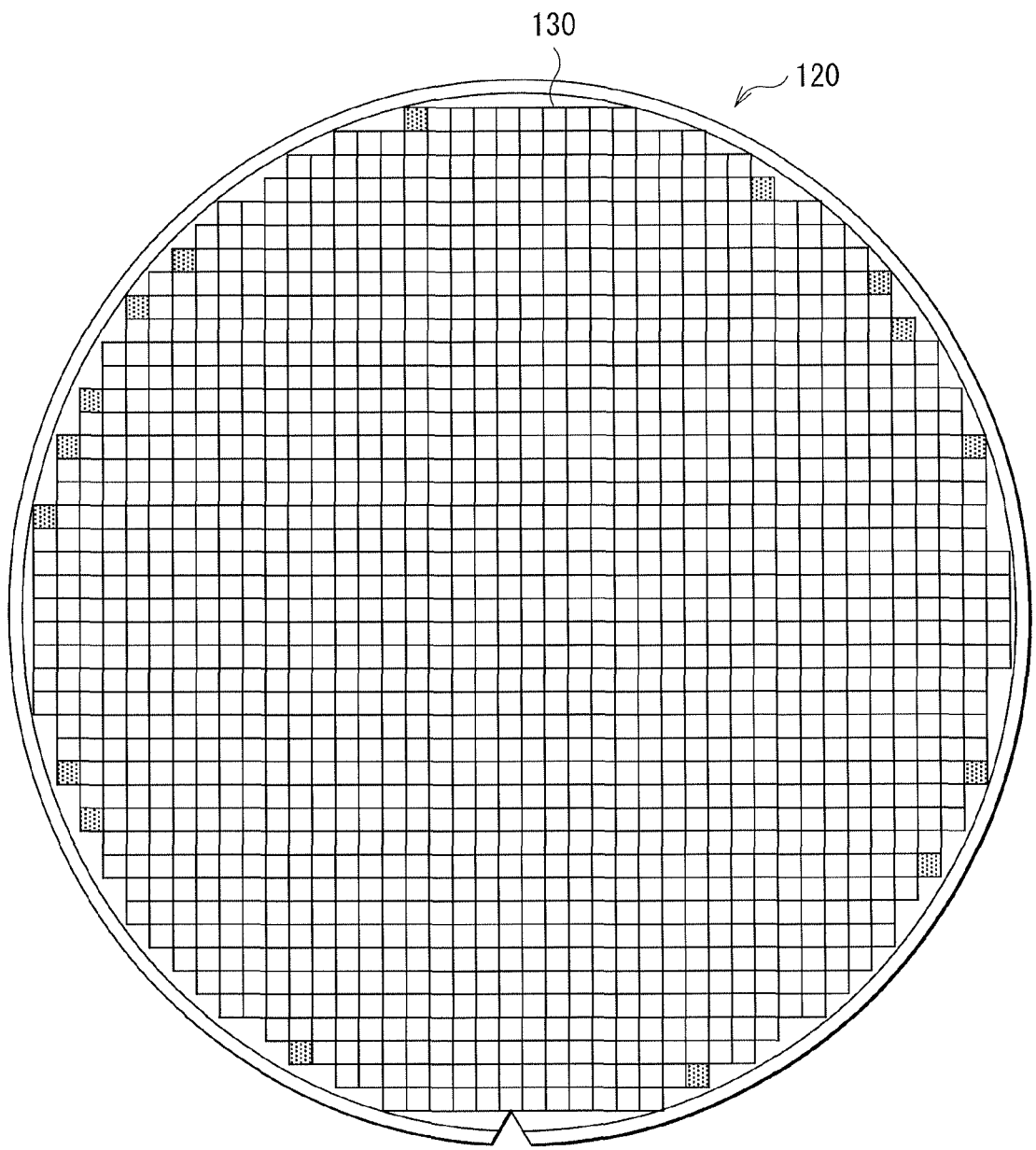
FIG. 25 is a diagram of an example of a map of a semiconductor wafer where a defective point caused by misalignment is recorded.

FIG. 25 illustrates an example of a map in which defective ICs caused by misalignment are recorded. A map in which positions of ICs judged as defective items in a surface of a semiconductor wafer 120 are recorded may be formed in such a manner. This example indicates that defects caused by misalignment are produced around an outer peripheral section of the semiconductor wafer 120. Moreover, an improvement in yields is expected by forming such a map and providing feedback about positions where defects are produced and causes (misalignment in this case) of the defects to the manufacturing process.

Figure 26A:
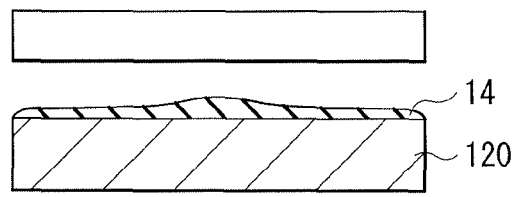
FIG. 26A is a schematic view for describing a technique of forming an insulating film on a semiconductor wafer (a sputtering method).
Figure 26B:
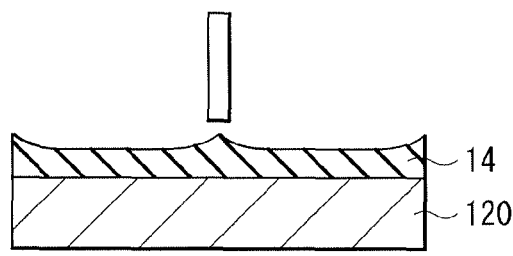
FIG. 26B is a schematic view for describing a technique of forming an insulating film on a semiconductor wafer (a spin-coating method).
Figure 27:
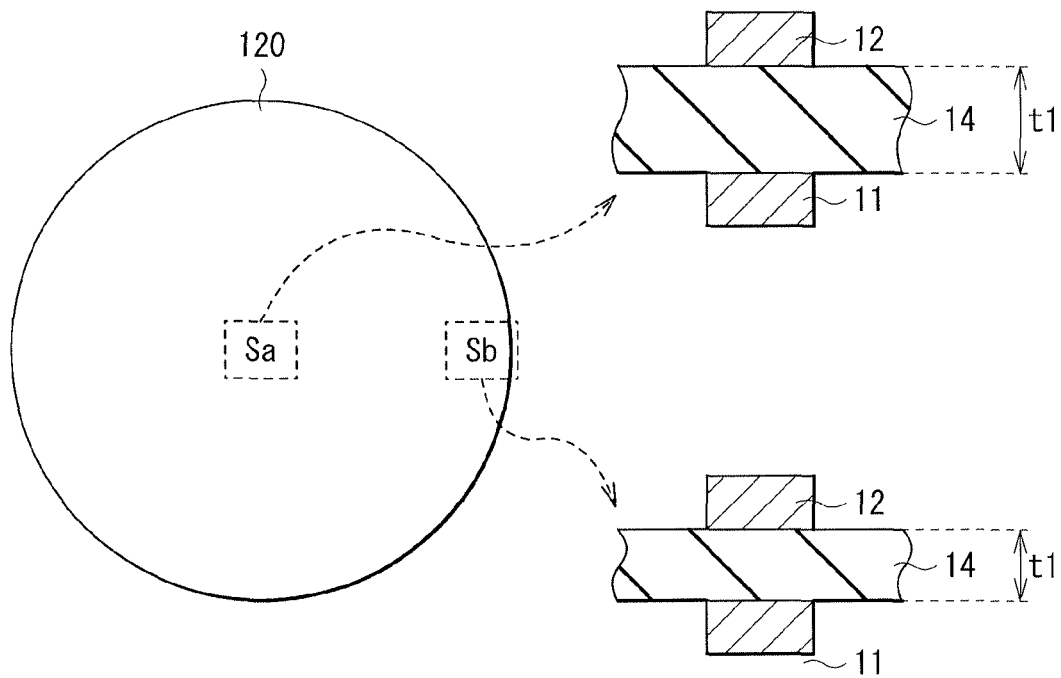
FIG. 27 is a schematic view for describing variation in thickness of an insulating film in a semiconductor wafer surface.

In the semiconductor process, an insulating film (corresponding to the insulating film 14 in FIG. 6B) is formed on the semiconductor wafer 120 by a sputtering method as illustrated in FIG. 26A, or is formed on the semiconductor wafer 120 by a spin-coating method or the like as illustrated in FIG. 26B. Therefore, as illustrated in FIG. 27, in the surface of the semiconductor wafer 12, the thickness of the insulating film 14 varies with region, and, for example, a thickness t1 in a region Sa around a wafer central section tends to be large, and a thickness t2 in a region Sb around a wafer outer peripheral section tends to be small.

A capacity C of a capacitor configured by sandwiching an insulating film between a pair of conductive layers is typically represented by the following expression (10), where $\epsilon_0$ is vacuum permittivity, $\epsilon$ is relative permittivity of the insulating film, d is a distance between the conductive layers (a thickness of the insulating film), and S is an area of the conductive layer.

$$C=\epsilon_0 \cdot \epsilon \cdot S/d \qquad (10)$$

Figure 28:
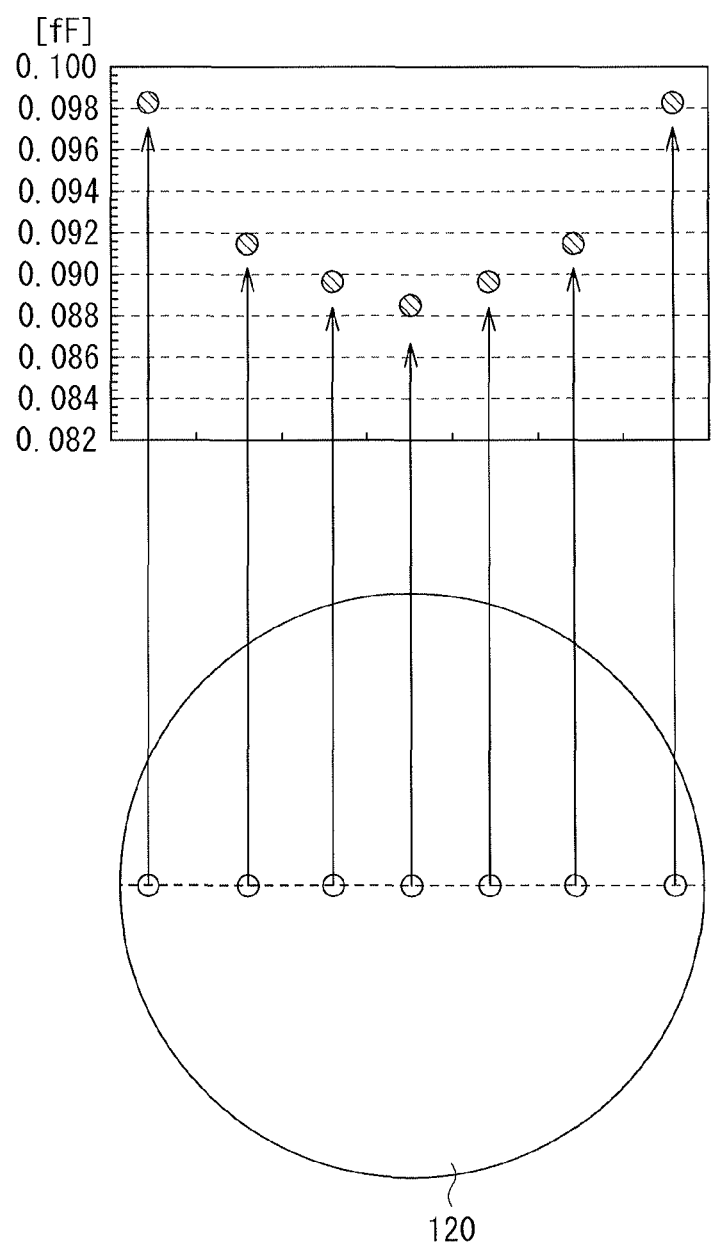
FIG. 28 is a characteristic diagram illustrating variation in capacity caused by variation in thickness of the insulating film in the semiconductor wafer surface.

Therefore, in a case where the area S is equal, as illustrated in FIG. 28, the capacity varies due to variation in thickness of the insulating film in respective regions from a central section to an outer peripheral section in the semiconductor wafer 120.

In this embodiment, as described above, the device groups 1A are provided to various positions in the wafer surface, and misalignment is detected by a relative comparison of capacities of the respective device groups 1A. Therefore, even in a case where variation in the thickness of the insulating film occurs in the above-described wafer surface, misalignment detection is less likely to be affected by an influence of the variation. Therefore, a defect caused by misalignment is allowed to be detected precisely.

(Capacity Correction)

In the test method using the above-described semiconductor unit 1, it is described that misalignment detection is performed by electrical measurement with use of the device group 1A, and defect judgment is performed, based on a result of the detection; however, as a further application example, the position judged as a defect may be corrected. For example, an IC that falls out of specifications, i.e., a design value by the above-described misalignment of ICs in which capacitors such as various capacitors are used may be corrected to be a conforming IC by capacity compensation.

Figure 29:
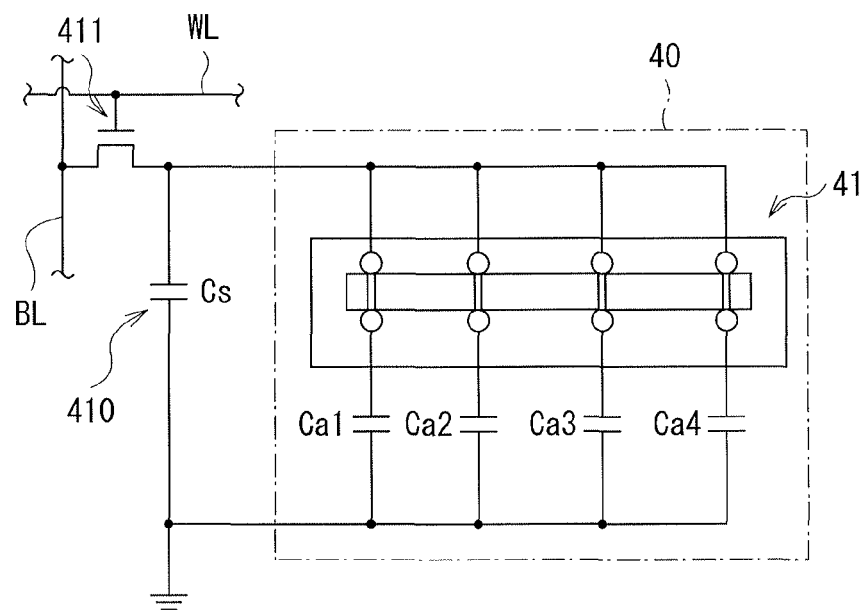
FIG. 29 is a circuit diagram illustrating a configuration example of a main part of a memory circuit including a correction circuit.

FIG. 29 is a configuration example of a main part of a memory circuit including a correction circuit (a correction circuit 40). In this memory circuit, for example, an end of a retention capacitor 410 is connected to a bit line BL and a word line WL through a switching device 411, and when a signal at a high level is input to the word line WL, the retention capacitor 410 is charged through the bit line BL. In such a memory circuit, for example, the correction circuit 40 configured to correct the capacity of the retention capacitor 410 may be connected in parallel to the retention capacitor 410.

The correction circuit 40 includes one or more capacitors for correction (four capacitors Ca1, Ca2, Ca3, and Ca4 in this case), and a capacity selection section 41 capable of separating one or more capacitors of these capacitors Ca1 to Ca4 from the retention capacitor 410. The capacitors Ca1 to Ca4 are arranged side by side, and have capacities that are same as or different from one another. The capacity selection section 41 may be configured of, for example, a fuse. Examples of a technique of separating the capacitors by the fuse include a technique using poly-wiring, and a technique by a laser. Moreover, the capacitors may be configured to be separated use of a switching device such as a transistor by using a nonvolatile memory. In the correction circuit 40, with use of the capacity selection section 41, an unnecessary capacitor is separated from the capacitors Ca1 to Ca4, based on the misalignment amount, and capacity correction is performed on the retention capacitor 410.

For example, in a case where misalignment occurs, a capacity Cs of the retention capacitor 410 is smaller than the design value; therefore, a capacity shortfall is covered by a combination of any of the capacitors Ca1 to Ca4. For example, in a case where the design value (a necessary capacity amount) of the capacity Cs is 22 pF (picofarad), but only 17 pF is obtained due to misalignment, a shortfall of 5 pF is covered with use of the correction circuit 40. For example, in a case where the capacitors Ca1, Ca2, Ca3, and Ca4 are configured to have 8 pF, 4 pF, 2 pF, and 1 pF, respectively, for example, the capacitors Ca1 and Ca3 are selectively separated with use of the capacity selection section 41. Thus, a desired capacity of 22 pF is allowed to be obtained by adding a sum (5 pF) of the capacities of the capacitors Ca2 and Ca4. In this example, an IC in a state in which the capacitors Ca2 and Ca4 are electrically connected to the retention capacitor 410, and the capacitors Ca1 and Ca3 are electrically separated from the retention capacitor 410 is shipped.

It is to be noted that the retention capacitor 410 according to this embodiment corresponds to a specific example of "second capacitor" in an embodiment of the present disclosure, and the capacitors Ca1 to Ca4 correspond to specific examples of "third capacitor" in an embodiment of the present disclosure.

As described above, in the semiconductor unit 1 according to this embodiment, for example, the device groups 1A (a plurality of capacitors 10a) are included in the semiconductor wafer surface, and each of the device groups 1A includes the first conductive layer 11 and the second conductive layer 12 with the insulating film 14 in between. The second conductive layer 12 is configured of a plurality of sub-conductive layers 12a that have substantially the same shape as one another, and the respective sub-conductive layers 12a are arranged in relatively different positions with respect to the edges b1 and b2. By such a configuration, the capacities of the respective capacitors are changed by an area in which the first conductive layer 11 and the sub-conductive layer 12a are superimposed on each other; therefore, misalignment between the first conductive layer 11 and the second conductive layer 12 is allowed to be detected, based on these capacity changes. Since misalignment is allowed to be detected in the device group 1A by a relative comparison of respective capacities of the plurality of capacitors 12a in such a manner, even if variation in thickness of the insulating film 14 occurs in the wafer surface, misalignment detection is less likely to be affected by the variation. Therefore, a defect caused by misalignment is allowed to be detected precisely.

Next, modification examples of the device group in the semiconductor unit according to the above-described first embodiment will be described below. There are various configurations of the device group (layouts of the first conductive layer and the second conductive layer) in addition to the above-described configuration. Some of them will be described below as examples. It is to be noted that like components are denoted by like numerals as of the above-described first embodiment and will not be further described.

Modification Example 1-1

Figure 30A:
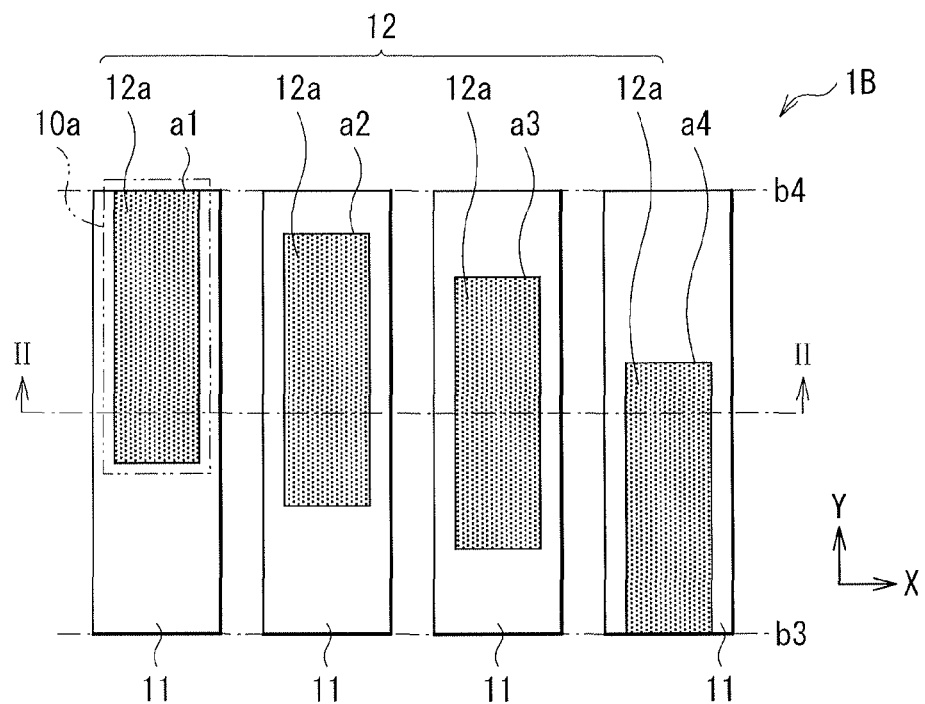
FIG. 30A is a schematic plan view illustrating a layout in a device group according to Modification Example 1-1.
Figure 30B:
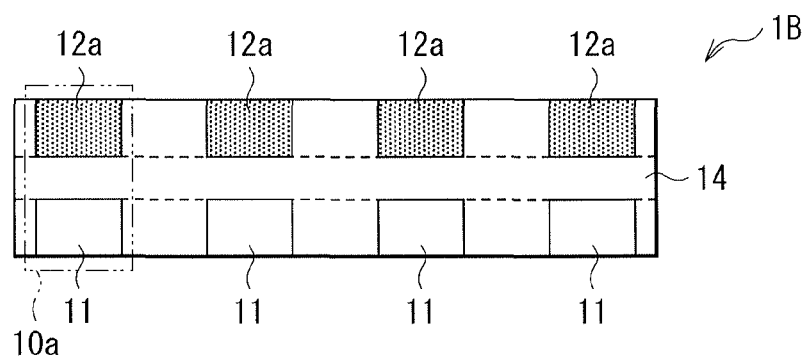
FIG. 30B is a sectional view taken along an arrow of FIG. 30A.

FIG. 30A is a schematic view illustrating an XY planar configuration of a device group (a device group 1B) according to Modification Example 1-1. FIG. 30B is a sectional view taken along a line II-II in an arrow direction of FIG. 30A. In the device group 1A according to the above-described first embodiment, one (common) first conductive layer 11 is provided for a plurality of sub-conductive layers 12a; however, like the device group 1B in this modification example, a plurality of first conductive layers 11 may be provided. However, the plurality of first conductive layers 11 are electrically connected to one another. As with the above-described first embodiment, the second conductive layer 12 includes a plurality of sub-conductive layer 12a, and in this example, the first conductive layers 11 and the sub-conductive layers 12a are so laid out as to allow respective sub-conductive layers 12a to be superimposed on respective first conductive layers 11.

In this modification example, each of the first conductive layers 11 includes edges b3 and b4 extending along one axis direction (the X-axis direction in this case), and the plurality of sub-conductive layers 12a are arranged in relatively different positions with respect to the edges b3 and b4. Therefore, as with the above-described first embodiment, the capacities of the respective capacitors 10a are measured, and misalignment occurring along one axis direction (the Y-axis direction in this case) is allowed to be detected by a relative comparison of the respective measured capacities.

Modification Example 1-2

Figure 31:
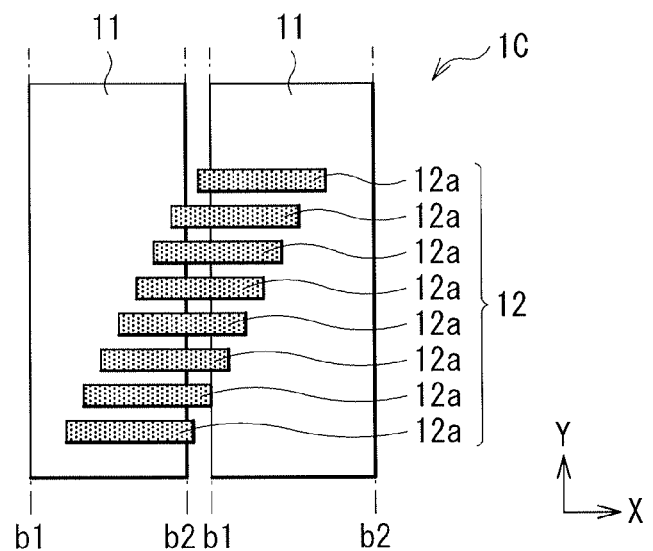
FIG. 31 is a schematic plan view illustrating a layout in a device group according to Modification Example 1-2.

FIG. 31 is a schematic view illustrating an XY planar configuration of a device group (a device group 1C) according to Modification Example 1-2. In the device group 1C according to this modification example, a plurality of (two in this case) first conductive layers 11 are provided, and the second conductive layer 12 is arranged across these two first conductive layers 11. The first conductive layer 11 and the second conductive layer 12 are not necessarily provided on a one-to-one basis, and it is only necessary to arrange the plurality of sub-conductive layers 12a in relatively different positions with respect to the edge b1 and b2 of the first conductive layer 11.

Modification Examples 1-3 and 1-4

Figure 32:
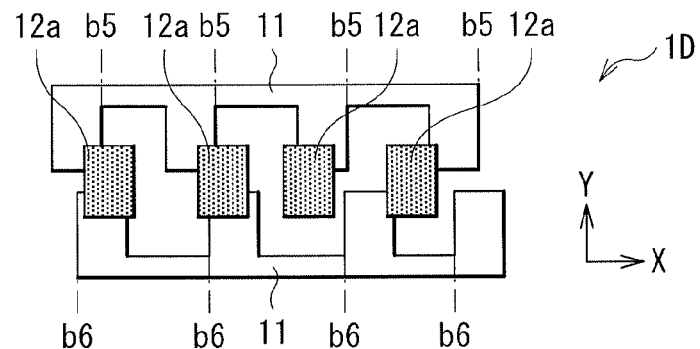
FIG. 32 is a schematic plan view illustrating a layout in a device group according to Modification Example 1-3.
Figure 33:
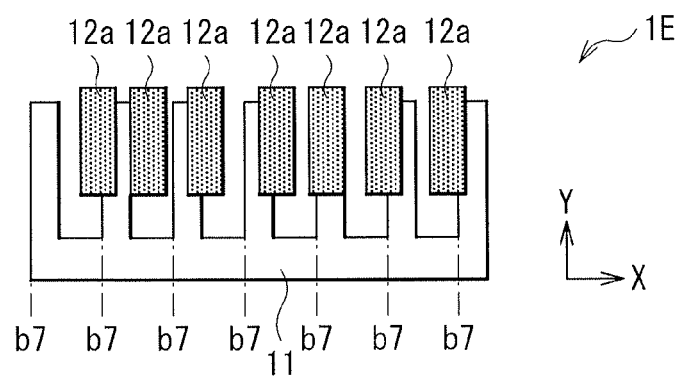
FIG. 33 is a schematic plan view illustrating a layout in a device group according to Modification Example 1-4.

FIG. 32 is a schematic view illustrating an XY planar configuration of a device group (a device group ID) according to Modification Example 1-3. FIG. 33 is a schematic view illustrating an XY planar configuration of a device group (a device group 1E) according to Modification Example 1-4. In these modification examples, the XY planar shape of the first conductive layer 11 is not rectangular but pectinate. Thus, it is only necessary for the first conductive layer 11 to have a shape having an edge (for example, edges b5, b6, b7, or the like) extending along one axis direction in such a manner, and it is only necessary to arrange the sub-conductive layers 12a in relatively different positions with respect to such an edge.

Modification Example 1-5

Figure 34:
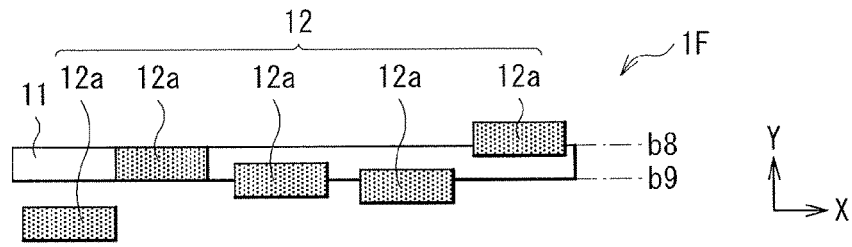
FIG. 34 is a schematic plan view illustrating a layout in a device group according to Modification Example 1-5.

FIG. 34 is a schematic view illustrating an XY planar configuration of a device group (a device group 1F) according to Modification Example 1-5. In the device group 1F according to this modification example, as with the device group 1A according to the above-described first embodiment, the first conductive layer 11 has edges b8 and b9 extending along the X-axis direction, and a plurality of sub-conductive layers 12a are arranged in relatively different positions with respect to the edges b8 and b9. However, in this modification example, the plurality of sub-conductive layers 12a are arranged randomly with respect to the edges b8 and b9.

Modification Example 1-6

Figure 35:
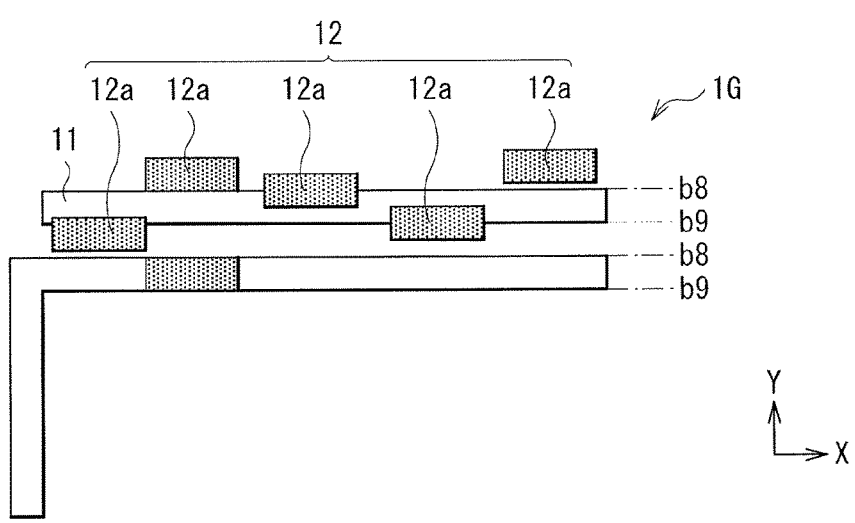
FIG. 35 is a schematic plan view illustrating a layout in a device group according to Modification Example 1-6.

FIG. 35 is a schematic view illustrating an XY planar configuration of a device group (a device group 1G) according to Modification Example 1-6. In the device group 1G according to this modification example, a plurality of first conductive layers 11 may be provided in a layout in which the sub-conductive layers 12a are randomly arranged as with the above-described modification example 1-5. Moreover, the planar shapes of the plurality of (two in this case) first conductive layers 11 may be the same as or different from each other.

Modification Example 1-7

Figure 36:
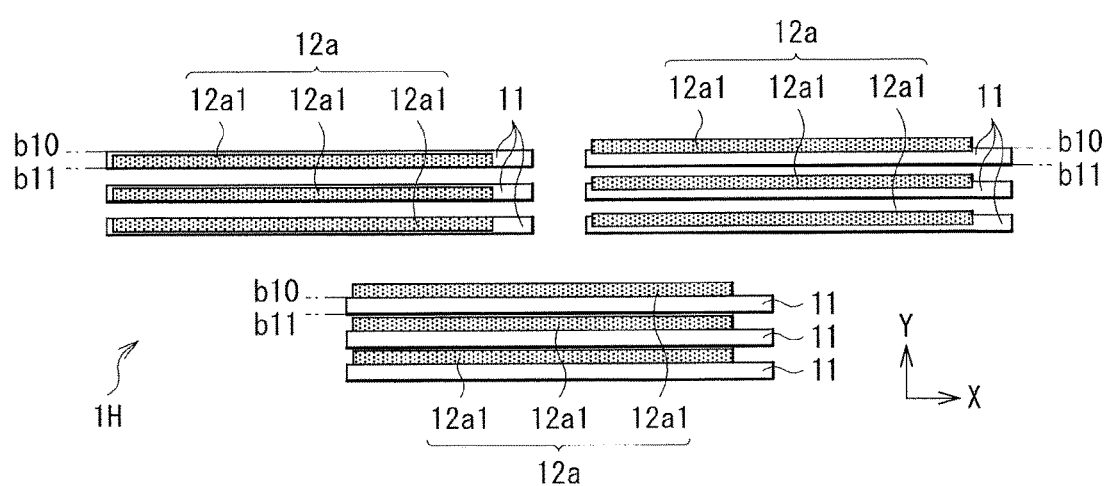
FIG. 36 is a schematic plan view illustrating a layout in a device group according to Modification Example 1-7.

FIG. 36 is a schematic view illustrating an XY planar configuration of a device group (a device group 1H) according to Modification Example 1-7. In the device group 1H according to this modification example, each of the sub-conductive layers 12a configuring the second conductive layer 12 is further partitioned, and each of the sub-conductive layers 12a is configured of a plurality of (three in this case) fine line layers 12a1. Moreover, the first conductive layers 11 are provided to the fine line layers 12a1 on a one-to-one basis. The sub-conductive layers 12a each configured of three fine line layers 12a1 are arranged in relatively different positions with respect to edges b10 and b11 of the first conductive layer 11.

Second Embodiment

Figure 37:
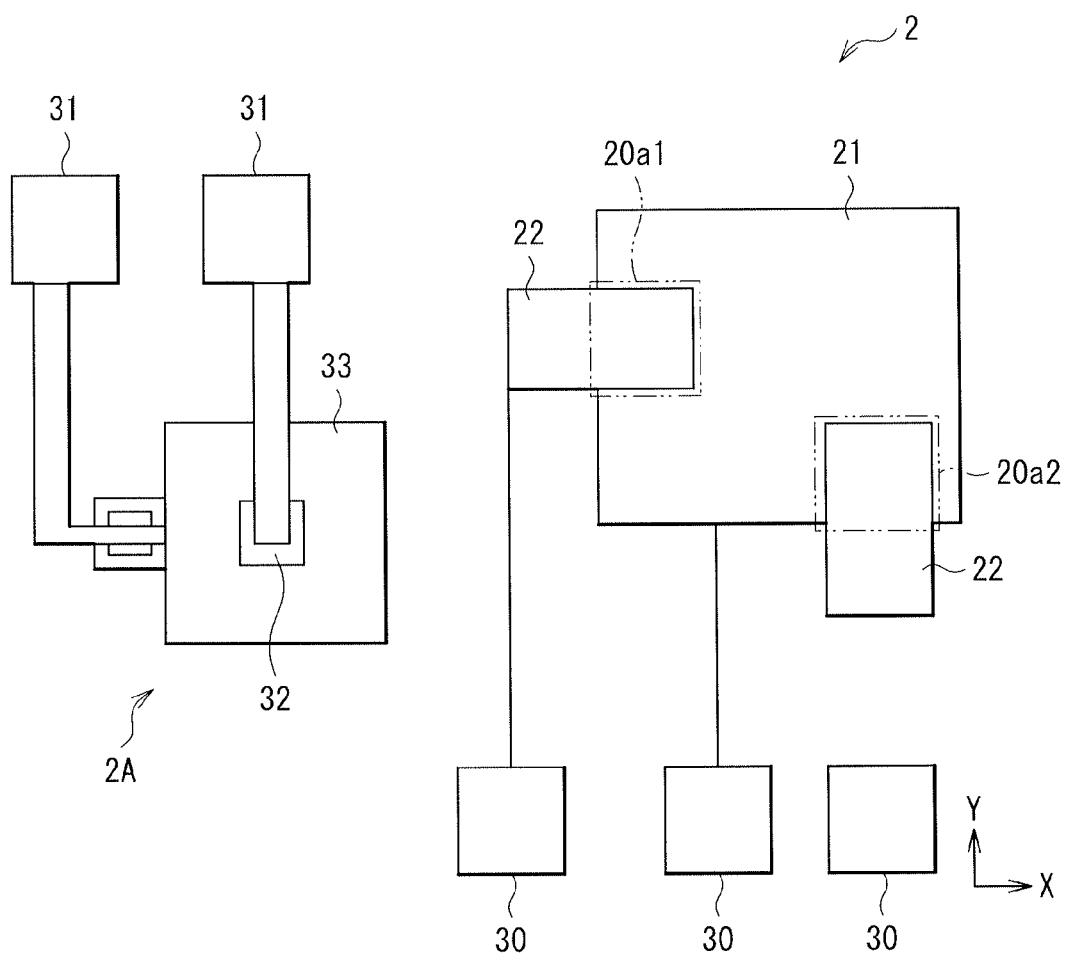
FIG. 37 is a schematic view illustrating a schematic configuration of a semiconductor unit according to a second embodiment of the present disclosure.

FIG. 37 is a schematic view illustrating a schematic configuration of a semiconductor unit (a semiconductor unit 2) according to this embodiment. In the semiconductor unit 2 according to this embodiment, as with the semiconductor unit 1 according to the above-described first embodiment, a defect caused by misalignment is allowed to be detected by electrical measurement with use of a capacitor. However, the semiconductor unit 2 differs from the semiconductor unit 1 according to the above-described first embodiment in the following point. In the semiconductor unit 1, misalignment is detected with use of a unit of a plurality of capacitors 10a configured by partitioning the second conductive layer 12; however, in this embodiment, misalignment is detected with use of one capacitor (a capacitor 20a1 or 20a2) formed corresponding to one second conductive layer 12. It is to be noted that, for convenience sake, a capacitor configured to detect misalignment along the X-axis direction is referred to as "capacitor 20a1", and a capacitor configured to detect misalignment along the Y-axis direction is referred to as "capacitor 20a2". As with the device group 1A according to the above-described first embodiment, a plurality of capacitors 20a1 and 20a2 are provided to various points in a semiconductor wafer. A film thickness measurement device 2A configured to measure a thickness of an insulating film 14a (an insulating film located in a same layer of the insulating film 14 provided between a first conductive layer 21 and a second conductive layer 22) is arranged adjacent to these capacitors 20a1 and 20a2. The first conductive layer 21 and the second conductive layer 22 are so provided as to be superimposed on each other in part or as a whole. More specifically, the second conductive layer 22 is so provided as to face a part of an edge of the first conductive layer 21, and has a portion superimposed on the first conductive layer 21 and a portion not superimposed on the first conductive layer 21.

Figure 38A:
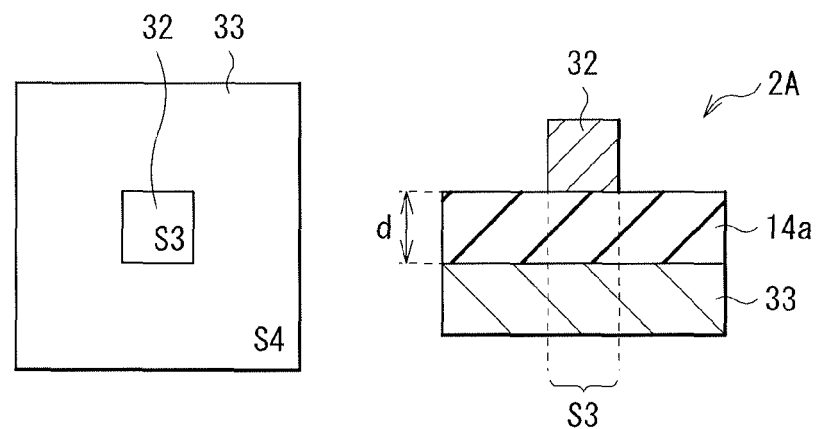
FIG. 38A is a schematic view for describing a film thickness measurement principle using a film thickness measurement device illustrated in FIG. 37.
Figure 38B:
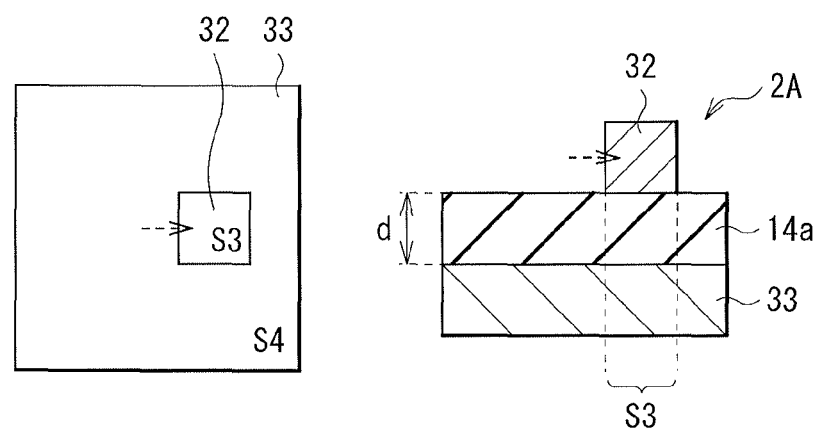
FIG. 38B is a schematic view for describing the film thickness measurement principle using the film thickness measurement device illustrated in FIG. 37.

FIGS. 38A and 38B illustrate a schematic configuration of the film thickness measurement device 2A. The film thickness measurement device 2A includes a pair of conductive films 32 and 33 with an insulating film 14a in between. An area S3 of one conductive film (the conductive film 32) of the pair of conductive films 32 and 33 is designed to be smaller than an area S4 of the other conductive film (the conductive film 33). A capacity of the film thickness measurement device 2A is measured by a measurement section 31 (or through the measurement section 31), and a thickness d of the insulating film 14a is calculated, based on the measured capacity. The measurement section 31 includes a capacity detection circuit similar to that of the above-described measurement section 30 or a terminal capable of being connected to various electric meters. It is to be noted that the conductive films 32 and 33 correspond to specific examples of "third conductive layer" and "fourth conductive layer" in an embodiment of the present disclosure.

Film thickness measurement with use of the film thickness measurement device 2A is based on the following principle. As illustrated in FIG. 38B, even if misalignment occurs between the conductive films 32 and 33 with use of a layout of the conductive films 32 and 33 illustrated in FIG. 38A as a reference, an area (equal to the area S3 of the conductive film 32) where the conductive films 32 and 33 are superimposed on each other is not changed; therefore, the area S represented by the above-described expression (10) is known, and the thickness d of the insulating film 14a is allowed to be determined. Since the first conductive layer 21 and the second conductive layer 22 are arranged adjacent to the film thickness measurement device 2A, the thickness d measured by the film thickness measurement device 2A is substantially equal to the thickness of the insulating film 14 between the first conductive layer 21 and the second conductive layer 22.

Figure 39:
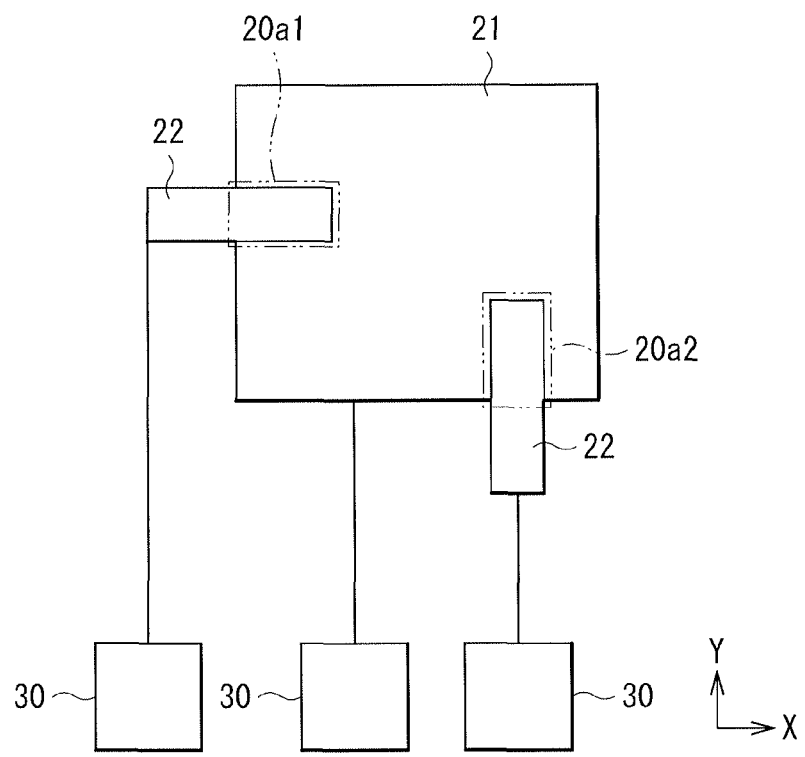
FIG. 39 is a schematic view for describing misalignment detection by the semiconductor unit illustrated in FIG. 37.
Figure 40:
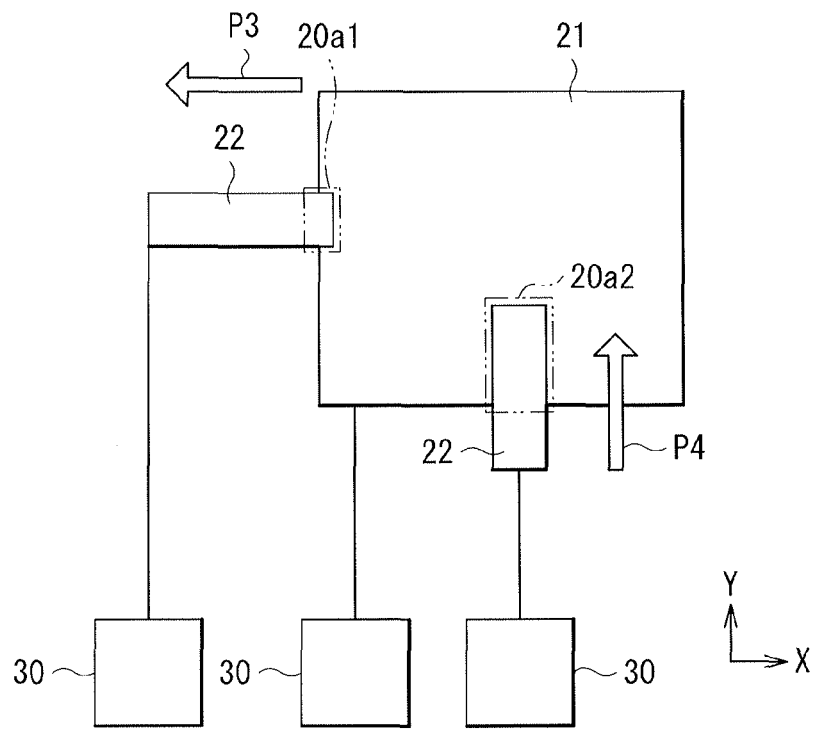
FIG. 40 is a schematic view for describing misalignment detection by the semiconductor unit illustrated in FIG. 37.

In misalignment detection, the capacities of the capacitors 20a1 and 20a2 are measured by the measurement section 30 (or through the measurement section 30), and a misalignment amount is determined, based on the measured capacities and the thickness of the insulating film 14 measured with use of the above-described film thickness measurement device 2A. More specifically, in a case where misalignment occurs with use of a capacity in a case where misalignment does not occur (refer to FIG. 39) as a reference, a change in capacity occurs in each of the capacitors 20a1 and 20a2. For example, as illustrated in FIG. 40, in a case where the position of the second conductive layer 22 is shifted toward a direction along the X-axis direction P3, in the capacitor 20a1, an area where the first conductive layer 21 and the second conductive layer 22 are superimposed on each other is reduced, thereby reducing the capacity. Moreover, in a case where the position of the second conductive layer 22 is shifted toward a direction along the Y-axis direction P4, in the capacitor 20a2, an area where the first conductive layer 21 and the second conductive layer 22 are superimposed on each other is increased, thereby increasing the capacity. Therefore, the misalignment amount along each axis direction is allowed to be determined by the above-described expression (10), based on the capacities of the capacitors 20a1 and 20a2 and the thickness of the insulating film 14. Moreover, as with the above-described first embodiment, defect judgment is allowed to be performed, based on the misalignment amount, and a map in which a defective point is recorded may be formed.

Figure 41:
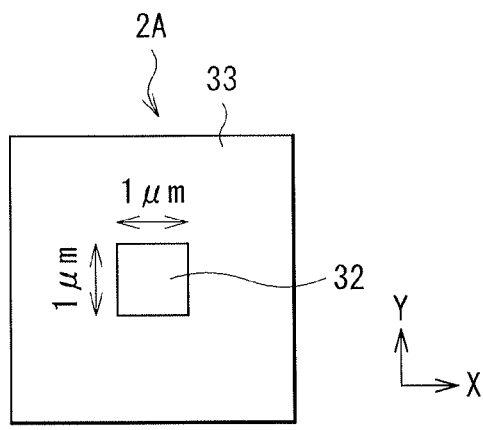
FIG. 41 is a schematic view illustrating a practical example of the film thickness measurement device.
Figure 42:
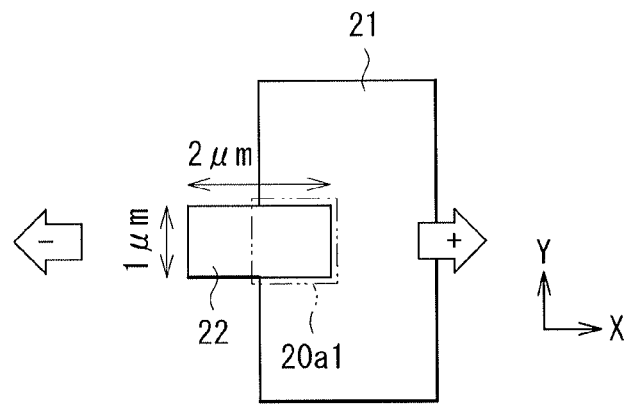
FIG. 42 is a schematic view illustrating a practical example of the second conductive layer.
Figure 43:
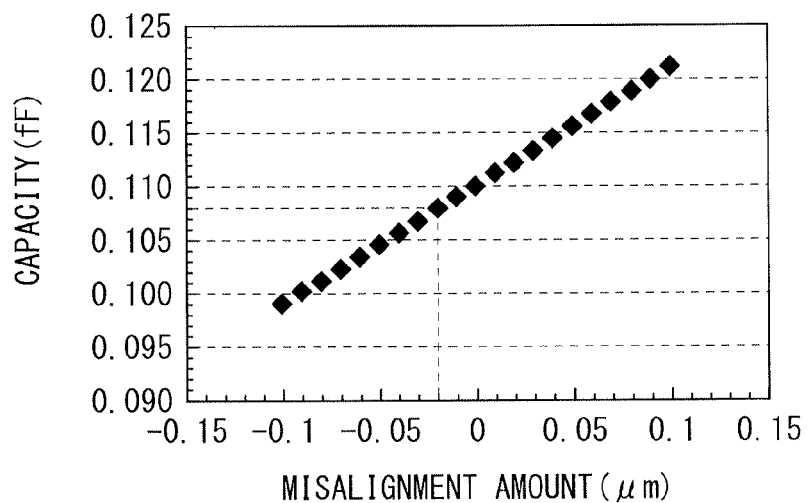
FIG. 43 is a characteristic diagram illustrating an example of a practical example result based on FIGS. 41 and 42.

FIGS. 41 to 32 illustrate practical examples of film thickness measurement and misalignment detection. At that time, in the film thickness measurement device 2A, as illustrated in FIG. 41, an XY dimension of the conductive film 32 was 1 μm×1 μm. As the insulating film 14a, a plasma oxide film ($SiO_2$) (with a relative permittivity c=4) formed with use of TEOS gas was used. When the capacity of the film thickness measurement device 2A was measured, the capacity was $1.10 \times 10^{-16}$ F. From this result, as the thickness of the insulating film 14a (the insulating film 14), 0.322 μm was derived. It is to be noted that vacuum permittivity $\epsilon_0$ was $8.86 \times 10^{-12}$. On the other hand, as illustrated in FIG. 42, in the capacitor 20a1, the XY plane dimension of the second conductive layer 22 was 1 μm×2 μm. In FIG. 43, the misalignment amount obtained, based on a change in capacity of the capacitor 20a1 and the thickness of the insulating film 14 is illustrated. For example, when the capacity of the capacitor 20a1 was measured, a capacity of 0.108 fF was obtained, and when the misalignment amount was determined, based on the capacity and the thickness of the insulating film, the misalignment amount was −0.02 μm.

In this embodiment, as described above, the capacitors 20a1 and 20a2 each including the first conductive layer 21 and the second conductive layer 22 with the insulating film 14 in between and the film thickness measurement device 2A configured to measure the thickness of the insulating film 14 are included. By such a configuration, misalignment between the first conductive layer 21 and the second conductive layer 22 is allowed to be detected, based on a change in capacity in the capacitors 20a1 and 20a2 and the thickness of the insulating film. At this time, since the thickness of the insulating film 14 is known, misalignment is allowed to be precisely detected without an influence of variation in thickness of the insulating film 14. Therefore, a defect caused by misalignment is allowed to be detected precisely.

Modification Example 2

Figure 44:
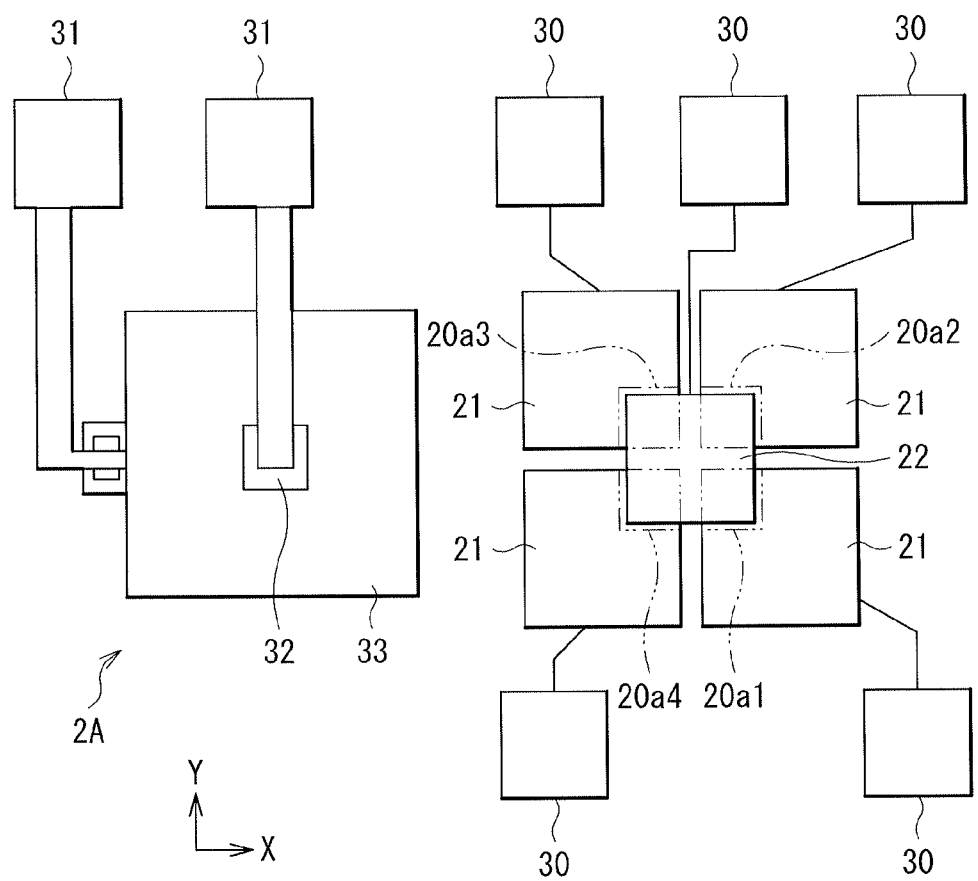
FIG. 44 is a schematic view illustrating a schematic configuration of a semiconductor unit according to Modification Example 2.

FIG. 44 is a schematic view illustrating a configuration of a main part of a semiconductor unit according to a modification example of the above-described second embodiment. In this semiconductor unit, the first conductive layers 21 are arranged in a 2×2 arrangement, and one second conductive layer 22 is provided for four first conductive layers 21 in total. By such a configuration, four capacitors 20a1, 20a2, 20a3, and 20a4 are formed for one second conductive layer 22. In other words, the second conducive layer 22 is so arranged as to be superimposed on a part or a whole of each of the four first conductive layers 21, and respective superimposed portions correspond to the respective capacitors 20a1 to 20a4. Misalignment along two axis directions, i.e., the X-axis direction and the Y-axis direction is allowed to be detected with use of capacitors in such a layout configuration.

Figure 45A:
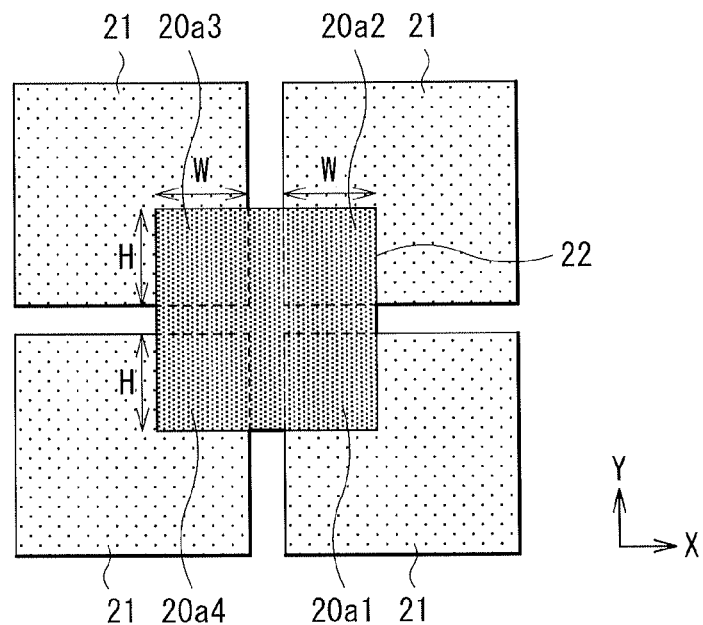
FIG. 45A is a schematic view for describing misalignment detection by the semiconductor unit illustrated in FIG. 44.

Derivation of an arithmetic expression used for misalignment detection in this modification example will be described below referring to FIGS. 45A and 45B. More specifically, first, as illustrated in FIG. 45A, in a layout in which misalignment does not occur (according to the design value), the capacitors 20a1 to 20a4 have the same shape and the same area, and a width in the X-axis direction and a width in the Y-axis direction of each of the capacitors 20a1 to 20a4 are W and H, respectively. In this modification example, a misalignment amount (dx, dy) is allowed to be derived from a relationship between the width W (or the width H) and the areas ($S_1$ to $S_4$) of the capacitors 20a1 to 20a4. It is to be noted that the areas $S_1$ to $S_4$ are allowed to be calculated, based on the above-described expression (10), from the capacities ($C_1$ to $C_4$) of the capacitors 20a1 to 20a4 and the film thickness d of the insulating film 14 measured by the film thickness measurement device 2A.

Figure 45B:
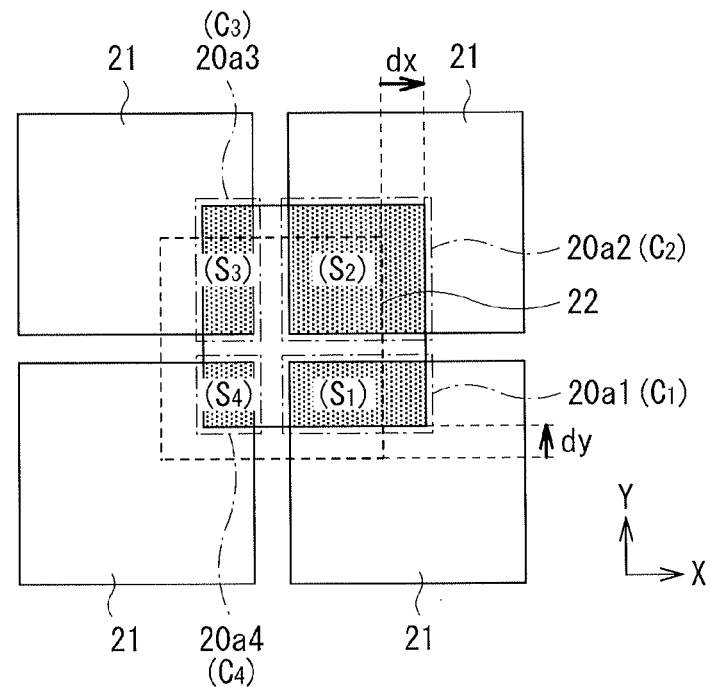
FIG. 45B is a schematic view for describing misalignment detection by the semiconductor unit illustrated in FIG. 44.

More specifically, as illustrated in FIG. 45B, a case where misalignment by dx toward a positive direction (to the right in the diagram) along the X-axis direction and misalignment by dy toward a positive direction (upward in the diagram) along the Y-axis direction occur is assumed. In this case, the areas $S_1$ to $S_4$ of the capacitors 20a1 to 20a4 are allowed to be represented by the following expressions (11-1) to (11-4).

$$S_1 = (W+dx)(H-dy) = HW - Wdy + Hdx - dxdy \tag{11-1}$$

$$S_2 = (W+dx)(H+dy) = HW + Wdy + Hdx + dxdy \tag{11-2}$$

$$S_3 = (W-dx)(H+dy) = HW + Wdy - Hdx - dxdy \tag{11-3}$$

$$S_4 = (W-dx)(H-dy) = HW - Wdy - Hdx + dxdy \tag{11-4}$$

The misalignment amounts dx and dy are allowed to be derived with use of the above-described expressions (11-1) to (11-4). For example, the misalignment amount dx along the X-axis direction is derived as follows. First, the following expression (12-1) is obtained by summing the above-described expressions (11-1) and (11-2), and the following expression (12-2) is obtained by summing the above-described expressions (11-3) and (11-4). In other words, expressions for the areas of the capacitors arranged along the Y-axis direction are summed. An expression (12-3) is obtained by eliminating a term "2HW" from these expressions (12-1) and (12-2) and solving for dx.

$$S_1 + S_2 = 2HW + 2Hdx \tag{12-1}$$

$$S_3 + S_4 = 2HW - 2Hdx \tag{12-2}$$

$$dx = (S_1 + S_2 - S_3 - S_4)/4H \tag{12-3}$$

On the other hand, the misalignment amount dy along the Y-axis direction is derived as follows. First, the following expression (13-2) is obtained by summing the above-described expressions (11-2) and (11-3), and the following expression (13-2) is obtained by summing the above-described expressions (11-1) and (11-4). In other words, the expressions for the areas of the capacitors arranged along the X-axis direction are summed. An expression (13-3) is obtained by eliminating the term "2HW" from these expressions (13-1) and (13-2) and solving for dy.

$$S_2 + S_3 = 2HW + 2Wdy \tag{13-1}$$

$$S_1 + S_4 = 2HW - 2Wdy \tag{13-2}$$

$$dy = (-S_1 + S_2 + S_3 - S_4)/4W \tag{13-3}$$

As described above, in this modification example, the misalignment amounts (dx and dy) are allowed to be determined by arithmetic processing with use of the film thickness d of the insulating film 14 measured by the film thickness measurement device 2A, the values of respective capacities of the capacitors 20a1 and 20a4, design values (width W and H) of the portion where the first conductive layer 21 and the second conductive layer 22 are superimposed on each other. Therefore, effects similar to those in the above-described first and second embodiments are allowed to be obtained, and it is not necessary to hold a table or the like representing a relationship between capacity and the misalignment amount in advance. Moreover, measured capacities of the four capacitors 20a1 to 20a4 are used; therefore, while a measurement error is reduced, a parasitic capacity is easily cancelled, and misalignment along two axis directions of X and Y is allowed to be detected precisely.

Modification Example 3

Figure 46A:
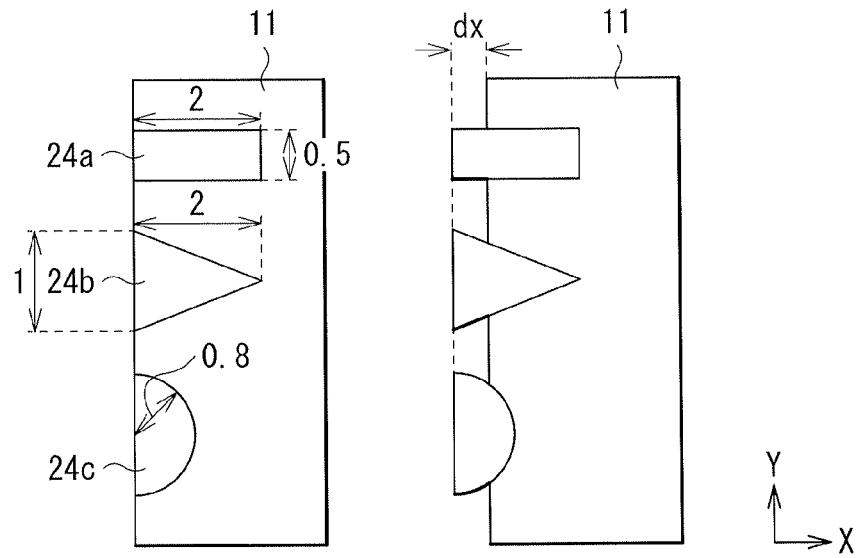
FIG. 46A is a schematic view illustrating planar shapes of sub-conductive layers configuring a second conductive layer according to Modification Example 3.
Figure 46B:
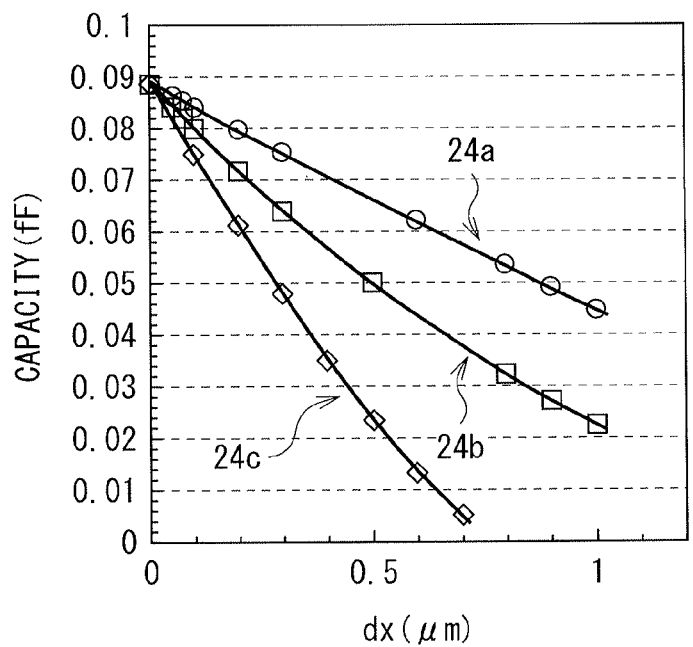
FIG. 46B is a characteristic diagram illustrating a relationship between a misalignment amount and a change in capacity by different shapes illustrated in FIG. 46A.

FIG. 46A is a schematic view for describing a shape pattern of the sub-conductive layer 12a configuring the second conductive layer 12 according to Modification Example 3. In the above-described first and second embodiments, as the shape of the second conductive layer (or the sub-conductive layer of the second conductive layer), a rectangular shape and a square shape are described as examples; however, in addition to the rectangular shape (the conductive layer 24a), the XY planar shape of the sub-conductive layer may be a triangular shape (a conductive layer 24b) or a semicircular shape (a conductive layer 24c). FIG. 46B illustrates a relationship of a change in capacity with respect to the misalignment amount. Thus, a change in capacity differs depending on the planar shapes of the conductive layers 24a to 24c in such a manner, and, for example, in the conductive layer 24c with a semicircular shape, compared to the conductive layers 24a and 24b with other shapes, a change in capacity with respect to an extremely small misalignment amount is large (sensitivity of capacity to the misalignment amount is increased). However, the areas of respective conductive layers 24a to 24c are designed to be substantially equal to one another. More specifically, in the sub-conductive layer 24a with a rectangular shape, lengths of a short side and a long side are about 0.5 μm and about 2 μm, respectively, in the sub-conductive layer 24b with a triangular shape, a length of a bottom side is about 1 μm, and a height is about 2 μm, and in the sub-conductive layer 24c with a semicircular shape, a radius is about 0.8 μm.

Third Embodiment

Figure 47A:
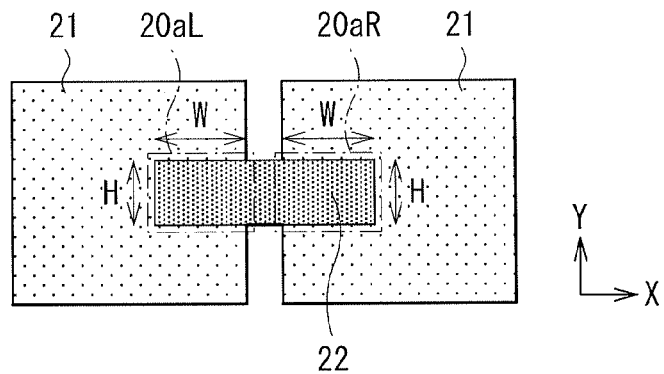
FIG. 47A is a schematic view illustrating a configuration of a main part of a semiconductor unit according to a third embodiment of the present disclosure.

FIG. 47A is a schematic view illustrating a configuration of a main part of a semiconductor unit according to this embodiment. In the semiconductor unit according to this embodiment, as with the semiconductor unit 1 according to the above-described first embodiment, a defect caused by misalignment is allowed to be detected by electrical measurement with use of a capacitor. Moreover, the layout of the first conductive layer 21 and the second conductive layer 22 is similar to that in the semiconductor unit 2 according to the above-described second embodiment, and the second conductive layer 22 is so arranged as to be superimposed on a part or a whole of each of two or more first conductive layers 21. However, in this embodiment, the film thickness measurement device 2A is not necessary. Moreover, although not illustrated, a measurement section 30 is connected to the first conductive layer 21 and the second conductive layer 22, and as with the above-described first embodiment, capacity measurement and misalignment detection are performed in the measurement section 30 (or through the measurement section 30). In this embodiment, misalignment is allowed to be detected precisely without an influence of variation in film thickness of the insulating film 14 by arithmetic processing with use of a difference between measured capacity amounts and a sum of the measured capacity amounts.

Although the layout of the conductive layers is not specifically limited, a case where a plurality of (two in this case) first conductive layers 21 are arranged along one axis direction (for example, the X-axis direction) at predetermined intervals, and one second conductive layer 22 is arranged across respective parts of the respective two first conductive layers 21 will be described as an example. Portions where the first conductive layer 21 and the second conductive layer 22 are superimposed on each other serve as capacitors 20aL and 20aR (first capacitors). The XY planar shape of the first conductive layer 21 may be, for example, a rectangular shape (or a square shape). The XY planar shape of the second conductive layer 22 is a rectangular shape having a long side along one axis direction (the X-axis direction in this case), and a width along the Y-axis direction is H. Moreover, as a design value without misalignment (refer to FIG. 47A), a width along the X-axis direction of a portion superimposed on the first conductive layer 21 of the second conductive layer 22 is W. Derivation of an arithmetic expression in a case where misalignment along the X-axis direction is detected with use of the semiconductor unit with such a layout configuration will be described below.

First, when "$\epsilon_0 \epsilon / d$" in the above-described expression (10) is referred to as a coefficient k, as design values (refer to FIG. 47A), capacities ($C_L$ and $C_R$) of the capacitors 20aL and 20aR are represented by the following expression (14).

$$C_L = C_R = k \cdot W \cdot H \tag{14}$$

Figure 47B:
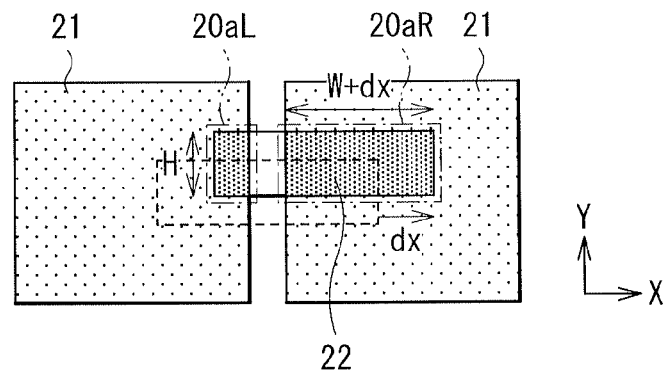
FIG. 47B is a schematic view illustrating an example of a layout in a case where misalignment occurs in the semiconductor unit illustrated in FIG. 47A.

Then, the capacities $C_L$ and $C_R$ of the capacitors 20aL and 20aR in a case where misalignment from the design values occurs (refer to FIG. 47B) may be represented by the following expressions (15-1) and (15-2). It is to be noted that, in this case, misalignment by dx occurs toward the positive direction (toward the right in the diagram) of the X-axis direction is assumed. The coefficient k is allowed to be eliminated from these expressions (15-1) and (15-2), and the following expression (16) for dx is obtained.

$$C_R = k(W+dx)H \tag{15-1}$$

$$C_L = k(W-dx)H \tag{15-2}$$

$$dx = W(C_R - C_L)/(C_R + C_L) \tag{16}$$

Figure 48A:
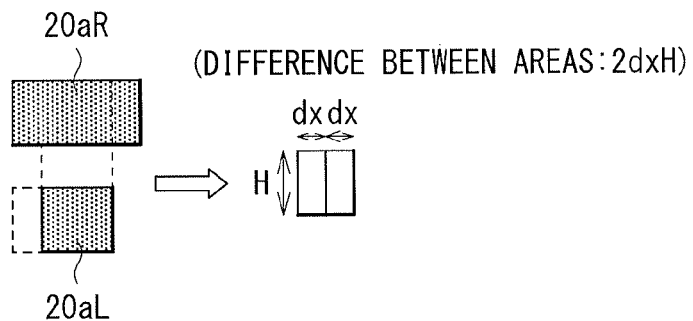
FIG. 48A is a schematic view for describing a difference between areas in the layout illustrated in FIG. 47B.
Figure 48B:
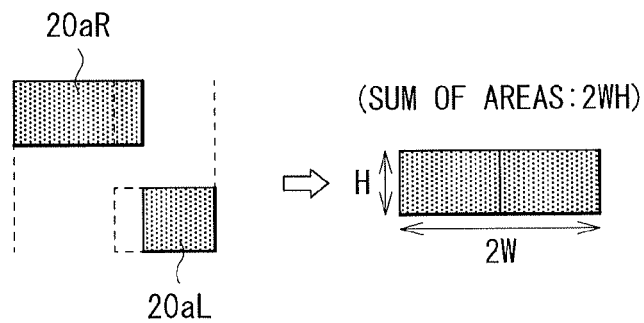
FIG. 48B is a schematic view for describing a sum of areas in the layout illustrated in FIG. 47B.

Alternatively, the following way of thinking is also possible. As illustrated in FIG. 48A, a difference between the areas of two capacitors 20aL and 20aR refers to "2dxH", and as illustrated in FIG. 48B, the sum of the areas of the two capacitors 20aL and 20aR refers to "2WH". A ratio between them is "dx/W" as represented by the following expression (17). Herein, the capacity is obtained by multiplying the area by the coefficient k; therefore, a ratio between the difference between the areas and the sum of the areas is equal to a ratio between a difference between the capacities and a sum of the capacities, and is allowed to be represented by the following expression (18). The expression (18) is equivalent to the above-described expression (16).

$$2dxH/2WH = dx/W \tag{17}$$

$$dx/W = (C_R - C_L)/(C_R + C_L) \tag{18}$$

Thus, in this embodiment, as long as the capacities $C_L$ and $C_R$ of the capacitors 20aL and 20aR and the design value (the width W along the X-axis direction in this case) are known, the misalignment amount (dx) is allowed to be determined easily by arithmetic processing. As a characteristic of the arithmetic processing, the difference ($C_R - C_L$) between the capacities $C_R$ and $C_L$ and the sum ($C_R + C_L$) of the capacities $C_R$ and $C_L$ are used. Accordingly, it is not necessary to hold a relationship between the capacity and the misalignment amount in advance, and the unit configuration is allowed to be simplified. In other words, the misalignment (dx in this case) along one direction is allowed to be detected with use of only three parameters, i.e., two capacities $C_L$ and $C_R$ and the width (W in this case) in the one direction. In particular, since the coefficient k including the film thickness d of the insulating film 14 is eliminated in a derivation process for the expression (16), misalignment detection based on the expression (16) is not affected by the influence of variation in thickness of the insulating film 14. Therefore, effects similar to those in the above-described first and second embodiments are allowed to be obtained.

Modification Example 4-1

Figure 49A:
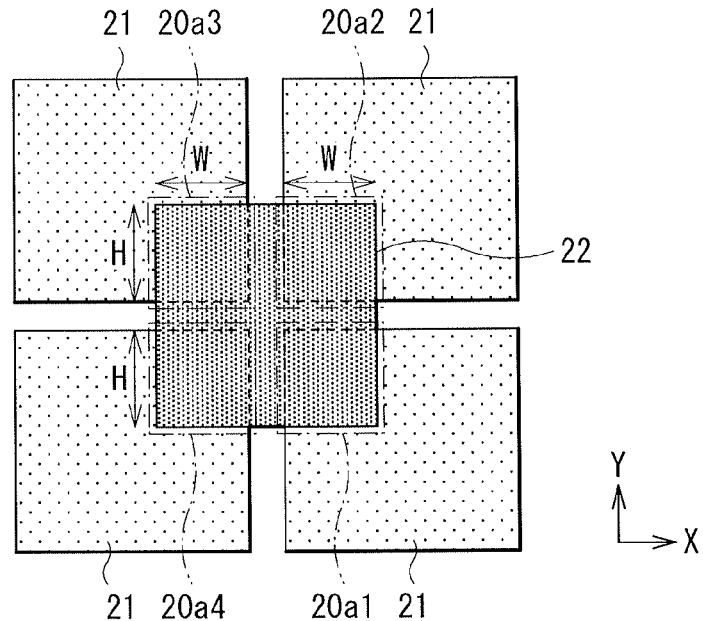
FIG. 49A is a schematic view illustrating a configuration of a main part of a semiconductor unit according to Modification Example 4-1.

FIG. 49A is a schematic view illustrating a configuration of a main part of a semiconductor unit according to a modification example (Modification Example 4-1) of the above-described third embodiment. In this semiconductor unit, the layout of the conductive layers may be similar to, for example, that in the above-described Modification Example 2. In other words, the first conductive layers 21 are arranged in a 2×2 arrangement, and one second conductive layer 22 is provided for these four first conductive layer 21. Moreover, the second conductive layer 22 is so arranged as to be superimposed on a part or a whole of each of the first conductive layers 21. Therefore, four capacitors 20a1 to 20a4 (first capacitors) are formed corresponding to one second conductive layer 22. It is to be noted that FIG. 49A illustrates a layout according to the design value without misalignment, and the capacitors 20a1 to 20a4 have the same shape and area. Moreover, the width along the X-axis direction and the width along the Y-axis direction of a portion superimposed on the first conductive layer 21 of the second conductive layer 22 are W and H, respectively. With use of the semiconductor unit including such capacitors, misalignment along two axis directions, i.e., the X-axis direction and the Y-axis direction are allowed to be detected. Derivation of an arithmetic expression used for misalignment detection in this modification example will be described below.

Figure 49B:
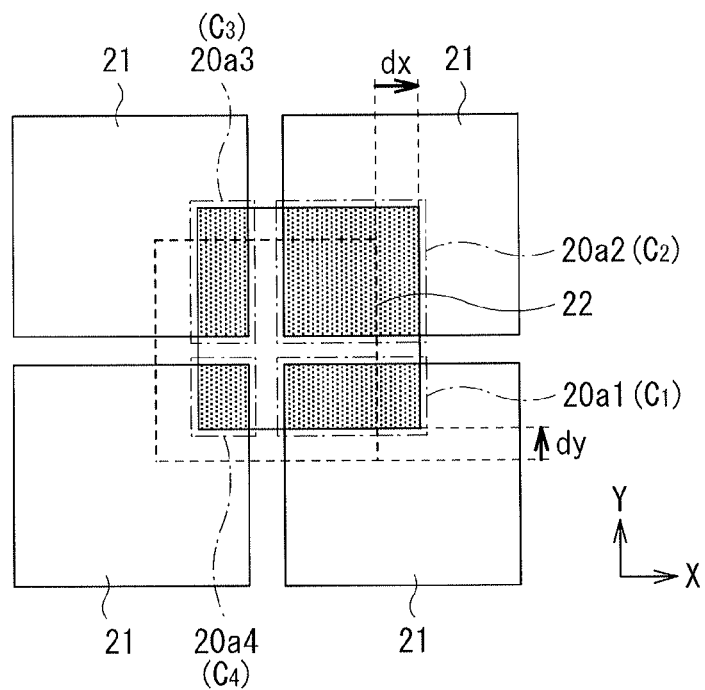
FIG. 49B is a schematic view illustrating an example of a layout in a case where misalignment occurs in the semiconductor unit illustrated in FIG. 49A.

First, the capacities ($C_1$ to $C_4$) of the capacitors 20a1 to 20a4 in a case where misalignment from the design value (refer to FIG. 49A) occurs (refer to FIG. 49B) may be represented by the following expressions (19-1) to (19-4) with use of the coefficient k. It is to be noted that a case where misalignment by dx toward the positive direction (toward the right in the diagram) along the X-axis direction and misalignment by dy toward the positive direction (upward in the diagram) in the Y-axis direction occur is assumed.

$$C_1=k(W+dx)(H-dy)=k(HW-Wdy+Hdx-dxdy) \quad (19\text{-}1)$$

$$C_2=k(W+dx)(H+dy)=k(HW+Wdy+Hdx+dxdy) \quad (19\text{-}2)$$

$$C_3=k(W-dx)(H+dy)=k(HW+Wdy-Hdx-dxdy) \quad (19\text{-}3)$$

$$C_4=k(W-dx)(H-dy)=k(HW-Wdy-Hdx+dxdy) \quad (19\text{-}4)$$

The misalignment amounts dx and dy are allowed to be derived with use of the above-described expressions (19-1) to (19-4). First, the following expression (20) is obtained by summing the above-described expressions (19-1) to (19-4) (by summing all of the capacities ($C_1$ to $C_4$) of the capacitors 20a1 to 20a4). Therefore, the coefficient k is allowed to be represented by the following expression (21).

$$C_1+C_2+C_3+C_4=4kHW \quad (20)$$

$$k=(C_1+C_2+C_3+C_4)/(4HW) \quad (21)$$

Then, the misalignment amount dx along the X-axis direction is derived as follows. The following expression (22) is obtained by determining a difference between a sum of capacities of the capacitors (the capacitors 20a1 and 20a2 in this case) with widths increased along the X-axis direction and a sum of capacities of the capacitors (the capacitors 20a3 and 20a4 in this case) with widths decreased along the X-axis direction. The following expression (23) is obtained by substituting a right-hand side of the above-described expression (21) into the coefficient k of the expression (22).

$$(C_1+C_2)-(C_3+C_4)=4kHdx \quad (22)$$

$$dx=W(C_1+C_2-C_3-C_4)/(C_1+C_2+C_3+C_4) \quad (23)$$

On the other hand, the misalignment amount dy along the Y-axis direction is derived as follows. The following expression (24) is obtained by determining a difference between a sum of capacities of the capacitors (the capacitors 20a2 and 20a3 in this case) with widths increased along the Y-axis direction and a sum of capacities of the capacitors (the capacitors 20a1 and 20a4 in this case) with widths decreased along the Y-axis direction. The following expression (25) is obtained by substituting a right-hand side of the above-described expression (21) into the coefficient k of the expression (24).

$$(C_2+C_3)-(C_1+C_4)=4kWdy \quad (24)$$

$$dy=H(C_2+C_3-C_1-C_4)/(C_1+C_2+C_3+C_4) \quad (25)$$

As described above, in this modification example, as long as the respective capacities of the capacitors 20a1 to 20a4 and the design values (the widths W and H) are known, the misalignment amounts (dx and dy) along two axis directions are allowed to be determined easily by arithmetic processing. As with the above-described third embodiment, as a characteristic of the arithmetic processing, the difference between the capacities and the sum of the capacities are used. Moreover, since the coefficient k including the film thickness d of the insulating film 14 is eliminated in a derivation process for the expressions (23) and (25), when the misalignment amount is detected with use of the expressions (23) and (25), misalignment detection is not affected by the influence of variation in thickness of the insulating film 14. Therefore, effects similar to those in the above-described first and second embodiments are allowed to be obtained. Further, the measured capacities of the four capacitors 20a1 to 20a4 are used; therefore, while a measurement error is reduced, a parasitic capacity is easily reduced, and misalignment along the two axis directions of X and Y is allowed to be detected precisely.

Modification Example 4-2

Figure 50A:
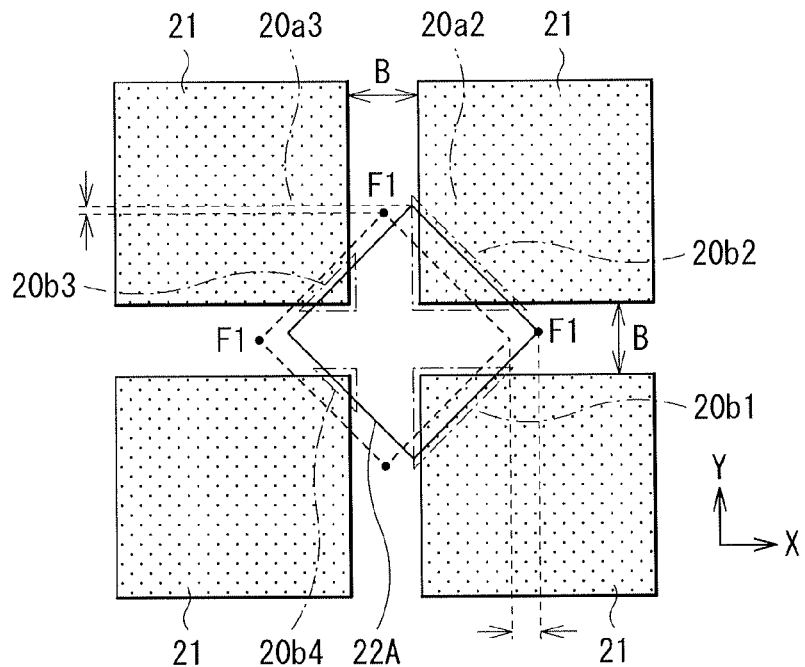
FIG. 50A is a schematic view illustrating a configuration of a main part of a semiconductor unit according to Modification Example 4-2.
Figure 50B:
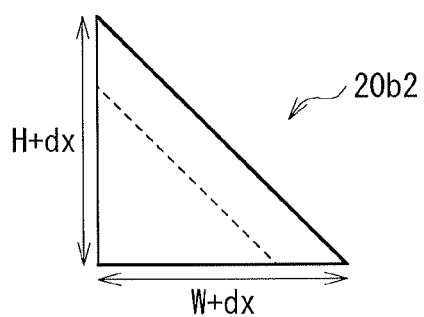
FIG. 50B is a schematic enlarged view of a part of the semiconductor unit illustrated in FIG. 50A.

FIG. 50A is a schematic view illustrating a configuration of a main part of a semiconductor unit according to a modification example (Modification Example 4-2) of the above-described third embodiment. FIG. 50B is a schematic enlarged view of one capacitor (for example, a capacitor 20b2). In this semiconductor unit, a configuration is similar to that in the above-described Modification Example 4-1, except that the shape of the second conductive layer (the second conductive layer 22A) or the method of arranging the second conductive layer (the second conductive layer 22A) is different in the layout of the conductive layers. In other words, the first conductive layers 21 are arranged in a 2×2 arrangement, and one second conductive layer 22A is provided for these four first conductive layers 21. Moreover, the second conductive layer 22A is so arranged as to be superimposed on a part or a whole of each of the first conductive layers 21. Therefore, four capacitors 20b1 to 20b4 are formed corresponding to one second conductive layer 22A. It is to be noted that, in FIG. 50A, a layout according to the design value without misalignment of the second conductive layer 22A is indicated by a broken line, and a layout with misalignment of the second conductive layer 22 is indicated by a solid line. Moreover, a width along the X-axis direction and a width along the Y-axis direction of a portion superimposed on the first conductive layer 21 of the second conductive layer 22A are W and H, respectively.

In this modification example, the XY planar shape of the second conductive layer 22A may be, for example, a rhombic shape or a square shape, and an apex F1 of the shape is so laid out as to be arranged in a gap B between the first conductive layers 21. Moreover, the size of the gap B may be preferably so designed as to allow each apex F1 not to be superimposed on the first conductive layer 21 even in a case where misalignment occurs. Therefore, the XY planar shapes of portions (areas of the capacitors 20b1 to 20b4) where respective first conductive layers 21 and the second conductive layer 22A are superimposed on each other are similar shapes (triangular shapes) to one another. In this modification example, an arithmetic expression is derived as follows to detect misalignment.

First, capacities ($C_1$ to $C_4$) of the capacitors 20b1 to 20b4 in a case where misalignment (indicated by a solid line in FIG. 50A) from the design value (indicated by the broken line in FIG. 50A) occurs are allowed to be represented by the following expressions (26-1) to (26-4) with use of the coefficient k. It is to be noted that a case where misalignment by dx toward the positive direction (to the right in the diagram) along the X-axis direction and alignment by dy toward the positive direction (upward in the diagram) along the Y-axis direction occur is assumed.

$$C_1=\{k(W+dx)(H-dy)\}/2 \tag{26-1}$$

$$C_2=\{k(W+dx)(H+dy)\}/2 \tag{26-2}$$

$$C_3=\{k(W-dx)(H+dy)\}/2 \tag{26-3}$$

$$C_4=\{k(W-dx)(H-dy)\}/2 \tag{26-4}$$

As with the above-described Modification Example 4-1, the misalignment amounts dx and dy are allowed to be derived with use of the above-described expressions (26-1) to (26-4). First, the following expression (27) for the coefficient k is obtained by summing the above-described expressions (26-1) to (26-4) (summing all of the capacities ($C_1$ to $C_4$) of the capacitors 20b1 to 20b4).

$$k=(C_1+C_2+C_3+C_4)/(2HW) \tag{27}$$

Moreover, in misalignment along the X-axis direction, as with the above-described Modification Example 4-1, the following expression (28) is obtained by determining a difference between a sum of capacities of the capacitors 20b1 and 20b2 and a sum of capacities of the capacitors 20b3 and 20b4. The following expression (29) is obtained by substituting a right-hand side of the above-described expression (27) into the coefficient k of the expression (28). In other words, the same expression as the expression (23) in the above-described Modification Example 4-1 is obtained.

$$dx=(C_1+C_2-C_3-C_4)/2kH \tag{28}$$

$$dx=W(C_1+C_2-C_3-C_4)/(C_1+C_2+C_3+C_4) \tag{29}$$

On the other hand, as with the above-described Modification Example 4-1, in misalignment along the Y-axis direction, the following expression (30) is obtained by determining a difference between a sum of capacities of the capacitors 20b2 and 20b3 and a sum of capacities of the capacitors 20b1 and 20b4. The following expression (31) is obtained by substituting a right-hand side of the above-described expression (27) into the coefficient k of the expression (30). In other words, the same expression as the expression (25) in the above-described Modification Example 4-1 is obtained.

$$dy=(C_2+C_3-C_1-C_4)/2kW \tag{30}$$

$$dy=H(C_2+C_3-C_1-C_4)/(C_1+C_2+C_3+C_4) \tag{31}$$

As described above, unlike the above-described third embodiment and Modification Example 4-1, the shape and arrangement of the second conductive layer 22A is not limited to the square shape or a rectangular shape, and is variously laid out. Moreover, in this modification example, the respective shapes of the capacitors 20b1 to 20b4 are triangular. In the above-described Modification Example 3, it is described that the triangular shape has high sensitivity of capacity to misalignment, compared to the rectangular shape; however, in this modification example, the same arithmetic expression as that in the above-described Modification Example 4-1 is obtained by canceling out a combination of capacitors with increased areas and a combination of capacitors with decreased areas.

Modification Examples 5-1 to 5-5

It is to be noted that the layouts of the conductive layers described in the above-described second and third embodiments are not limited to those described above. For example, the XY planar shape of the first conductive layer 21 and the planar shape of the second conductive layer 22 may be the same as or different from each other.

Figure 51A:
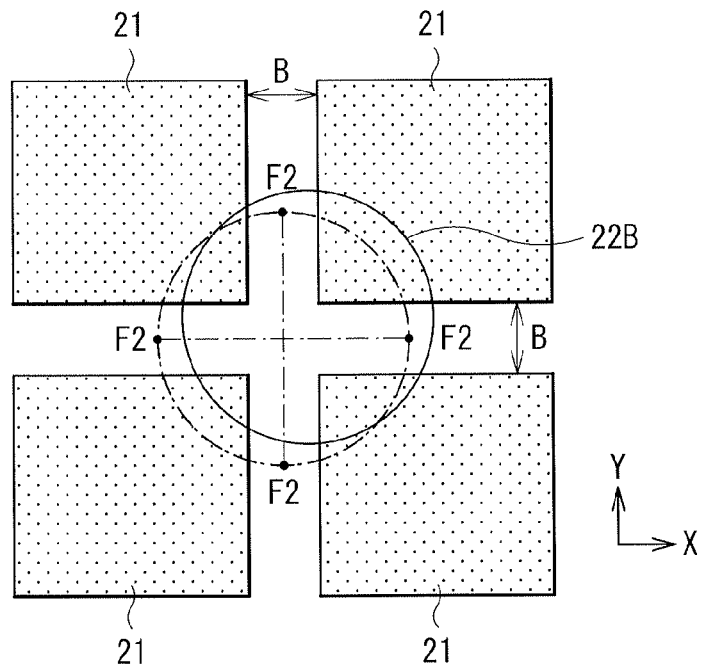
FIG. 51A is a schematic view illustrating a configuration of a main part of a semiconductor unit according to Modification Example 5-1.
Figure 51B:
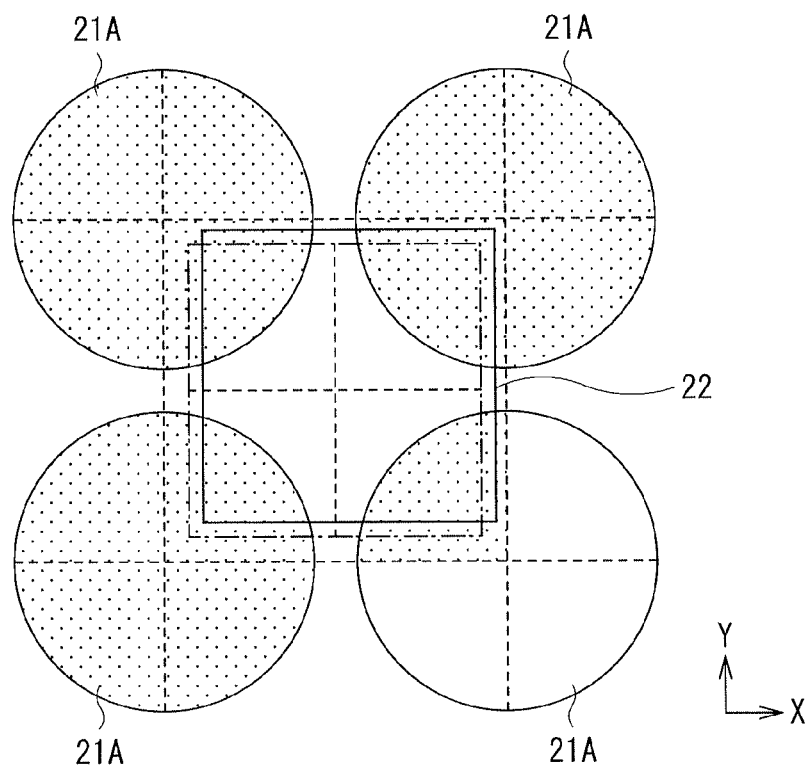
FIG. 51B is a schematic view illustrating a configuration of a main part of a semiconductor unit according to Modification Example 5-2.
Figure 51C:
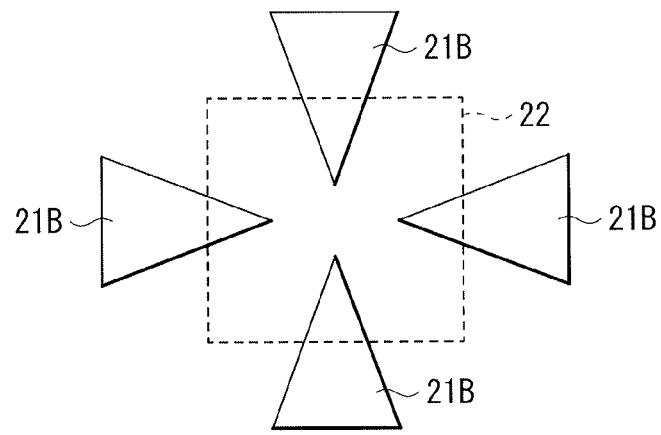
FIG. 51C is a schematic view illustrating a configuration of a main part of a semiconductor unit according to Modification Example 5-3.
Figure 51D:
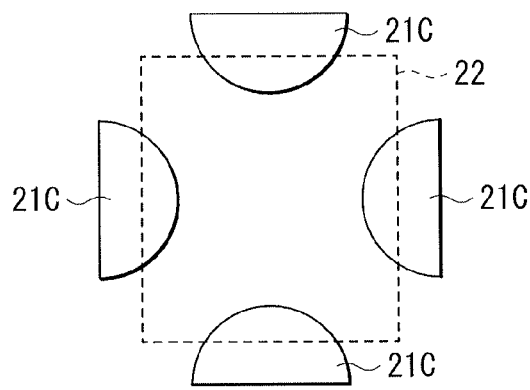
FIG. 51D is a schematic view illustrating a configuration of a main part of a semiconductor unit according to Modification Example 5-4.
Figure 51E:
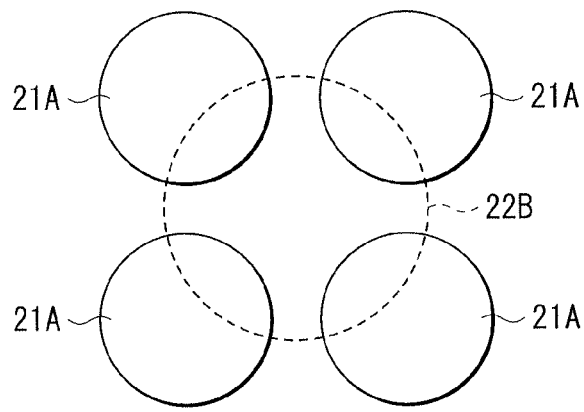
FIG. 51E is a schematic view illustrating a configuration of a main part of a semiconductor unit according to Modification Example 5-5.

More specifically, like Modification Example 5-1 illustrated in FIG. 51A, a layout in which the second conductive layer 22B with a circular shape is arranged with respect to the first conductive layer 21 with a square shape may be adopted. In this case, the gap B may be preferably so set as to allow respective points F2 of the second conductive layer 22B not to be superimposed on the respective first conductive layers 21. Moreover, like Modification Example 5-2 illustrated in FIG. 51B, a layout in which the second conductive layer 22 with a square shape is arranged with respect to the first conductive layer 21 with a circular shape may be adopted. Further, like Modification Example 5-3 illustrated in FIG. 51C, a layout in which the second conductive layer 22 with a square shape is arranged with respect to the first conductive layer 21B with a triangular shape may be adopted. Furthermore, like Modification Example 5-4 illustrated in FIG. 51D, a layout in which the second conductive layer 22 with a square shape is arranged with respect to the first conductive layer 21C with a semicircular shape may be adopted. In addition, like Modification Example 5-5 illustrated in FIG. 51E, a layout in which the second conductive layer 22B with a circular shape is arranged with respect to the first conductive layer 21A with a circular shape may be adopted.

Thus, the first conductive layer and the second conductive layer may have various shapes, and various combinations of the first conductive layer and the second conductive layer may be adopted. Moreover, it is only necessary to arrange one of the above-described first conductive layer and the above-described second conductive layer in an upper layer and arrange the other layer in a lower layer, and a vertical positional relationship between the first conductive layer and the second conductive layer is not specifically limited.

Although the present disclosure is described referring to the embodiments and the like, the present disclosure is not limited thereto, and may be variously modified. For example, in the above-described embodiments and the like, a case where the insulating film 14 and the second conductive layer 12 are formed in this order on the first conductive layer 11 is described as an example; however, as long as the first conductive layer 11 and the second conductive layer 12 are so arranged as to be superimposed on each other in part or as a whole, a vertical positional relationship between the first conductive layer 11 and the second conductive layer 12 may be inverted. In other words, the first conductive layer 11 may be formed on the second conductive layer 12 configured of a plurality of the above-described sub-conductive layers 12a with the insulating film 14 in between.

Moreover, the above-described planar shapes and layouts of the first conductive layer 11 and the second conductive layer 12 are merely examples, and the present disclosure is not limited to the above-described configuration examples. Moreover, effects described in the above-described embodiments and the like are merely examples, and other effects may be obtained, or other effects may be further included.

It is to be noted that the present disclosure may have the following configurations.

(1) A semiconductor unit including:
a substrate made of a semiconductor; and
a device group formed on the substrate and configured of a plurality of first capacitors,
in which the device group includes one or a plurality of first conductive layers and a second conductive layer, the first and second conductive layers provided to be superimposed on each other in part or as a whole with an insulating film in between,
the first conductive layer includes an edge extending along one direction,
the second conductive layer includes a plurality of sub-conductive layers having substantially same shapes as one another, and
the plurality of sub-conductive layers are arranged in relatively different positions with respect to the edge of the first conductive layer.

(2) The semiconductor unit according to (1), in which, in the device group, the plurality of sub-conductive layers in the second conductive layer are arranged to be electrically isolated from one another, and the one first conductive layer is provided for the plurality of sub-conductive layers, or the plurality of first conductive layers that are configured to be electrically connected to one another are provided for the plurality of sub-conductive layers.

(3) The semiconductor unit according to (1) or (2), in which the plurality of sub-conductive layers are arranged in positions shifted along one axis direction in a stepwise fashion.

(4) The semiconductor unit according to any one of (1) to (3), in which the device group is provided to a plurality of positions on the substrate.

(5) The semiconductor unit according to any one of (1) to (4), in which the device group is provided along each of two axis directions orthogonal to each other.

(6) The semiconductor unit according to any one of (1) to (5), in which planar shapes of the plurality of sub-conductive layers are rectangular, semicircular, or triangular.

(7) The semiconductor unit according to any one of (1) to (6), further including a detection circuit configured to detect a misalignment amount between the first and second conductive layers, based on a capacitance in the device group.

(8) The semiconductor unit according to (7), in which the detection circuit detects the misalignment amount by a relative comparison of respective capacitances of the plurality of first capacitors in the device group.

(9) The semiconductor unit according to (7) or (8), further including:
a second capacitor provided on the substrate; and
a correction circuit configured to correct a capacitance of the second capacitor, based on the misalignment amount detected by the detection circuit.

(10) The semiconductor unit according to (9), in which the correction circuit includes a plurality of third capacitors connected in parallel to the second capacitor, and
one or more, or all of the plurality of third capacitors are electrically separated by correction based on the alignment amount.

(11) A semiconductor unit including:
a substrate made of a semiconductor;
a plurality of first capacitors formed on the substrate and each including first and second conductive layers with an insulating film in between; and
a detection circuit configured to detect a misalignment amount between the first and second conductive layers, based on capacitances of the plurality of first capacitors,
in which a plurality of the first conductive layers are provided,
the second conductive layer is provided to be superimposed on each of the first conductive layers in part or as a whole, and
the detection circuit is configured to detect the misalignment amount by arithmetic processing using a difference between capacitances of capacitors selected from the plurality of first capacitors and a sum of the capacitances of the selected capacitors.

(12) The semiconductor unit according to (11), in which the plurality of the first conductive layers are arranged along one axis direction, and
the second conductive layer are arranged across respective parts of the respective first conductive layers arranged along the one axis direction.

(13) The semiconductor unit according to (11), in which the first conductive layers are two-dimensionally arranged along two axis directions orthogonal to each other, and
the second conductive layer are arranged across respective parts of the respective first conductive layers two-dimensionally arranged.

(14) The semiconductor unit according to (13), in which the first conductive layers are arranged in an arrangement of two rows by two columns.

(15) The semiconductor unit according to any one of (11) to (14), in which the detection circuit is configured to perform arithmetic processing including capacitances of the plurality of first capacitors and a design value of a width in one or more axis directions in each of the first capacitors as parameters.

(16) A test method including:
detecting a relative misalignment amount between layers on a substrate made of a semiconductor, based on electrical measurement by a device group configured of a plurality of first capacitors; and
performing defect judgment on each of regions on the substrate, based on the detected misalignment amount, in which the device group includes first and second conductive layers provided to be superimposed on each other in part or as a whole with an insulating film in between, the first conductive layer includes an edge extending along one direction, the second conductive layer includes a plurality of sub-conductive layers having substantially same shapes as one another, and the plurality of sub-conductive layers are arranged in relatively different positions with respect to the edge of the first conductive layer.

(17) The test method according to (16), in which, in the detecting of the misalignment amount, the misalignment amount is detected by a relative comparison of respective capacitances of the plurality of first capacitors in the device group.

(18) The test method according to (16) or (17), further including forming a map in which a position of a defect caused by misalignment is recorded corresponding to a region that is judged as a defective region of the regions on the substrate.

(19) A test method including:

detecting a relative misalignment amount between layers on a substrate made of a semiconductor by electrical measurement using a plurality of first capacitors; and performing defect judgment on each of regions on the substrate, based on the detected misalignment amount, in which in the detecting of the misalignment amount, the misalignment amount is detected by arithmetic processing using a difference between capacitances of capacitors selected from the plurality of first capacitors and a sum of the capacitances of the selected capacitors, and the first capacitor includes a plurality of first conductive layers and a second conductive layer with an insulating film in between, the second conductive layer superimposed on a part or a whole of each of the first conductive layers.

(20) The test method according to (19), further including forming a map in which a position of a defect caused by misalignment is recorded corresponding to a region that is judged as a defective region of the respective regions on the substrate.

Moreover, the present disclosure may have the following configurations.

(21) A semiconductor unit including:

a substrate made of a semiconductor; and a first capacitor formed on the substrate, and including first and second conductive layers with an insulating film in between; and a film thickness measurement device configured to measure a thickness of the insulating film of the first capacitor, in which the first and second conductive layers are provided to be superimposed on each other in part or as a whole.

(22) The semiconductor unit according to (21), in which the first conductive layer includes an edge extending along one direction, the second conductive layer is provided to face a part of the edge of the first conductive layer, and includes a portion superimposed on the first conductive layer and a portion not superimposed on the first conductive layer.

(23) The semiconductor unit according to (21) or (22), in which the film thickness measurement device is provided adjacent to the first capacitor, the film thickness measurement device includes an insulating film for measurement formed in a same layer as the insulating film of the first capacitor, and third and fourth conductive layers facing each other with the insulating film for measurement in between, and the fourth conductive layer is provided to be superimposed only on a local region of a formation region of the third conductive layer.

(24) The semiconductor unit according to any one of (21) to (22), in which a plurality of combinations of the first and second conductive layers configuring the first capacitor are provided.

(25) The semiconductor unit according to any one of (21) to (24), in which a combination of the first and second conductive layers configuring the first capacitor is provided along each of two axis directions orthogonal to each other.

(26) A test method including:

detecting a relative misalignment amount between layers on a substrate made of a semiconductor by electrical measurement using a first capacitor; and performing defect judgment on each of regions on the substrate, based on the detected misalignment amount, in which the first capacitor includes first and second conductive layers provided to be superimposed on each other in part or as a whole with an insulating film in between, and in the detecting of the misalignment amount, a thickness of the insulating film of the first capacitor is measured, and the misalignment amount is detected in consideration of the measured thickness.

(27) The test method according to (26), further including forming a map in which a position of a defect caused by misalignment is recorded corresponding to a region that is judged as a defective region of the regions on the substrate.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor unit comprising:
   a substrate made of a semiconductor;
   a device group on the substrate and comprised of a plurality of first capacitors;
   a second capacitor;
   a detection circuit; and
   a correction circuit,
   wherein
   the device group includes a first conductive layer and a second conductive layer, the first and second conductive layers overlapping each other in part or in whole with an insulating film in between,
   the first conductive layer includes an edge extending along a first direction,
   the second conductive layer includes a plurality of substantially same-shaped sub-conductive layers which are arrayed along the first direction,
   the plurality of sub-conductive layers are electrically isolated from one another and are arranged in relatively different positions with respect to the edge of the first conductive layer along a second direction orthogonal to the first direction,
   the detection circuit is configured to detect a misalignment amount between the first and second conductive layers, based on a capacitance in the device group, and
   the correction circuit is configured to correct a capacitance of the second capacitor based on the misalignment amount detected by the detection circuit.

2. The semiconductor unit according to claim 1, wherein, in the device group, the first conductive layer is provided for the plurality of sub-conductive layers, or a plurality of electrically connected first conductive layers are provided for the plurality of sub-conductive layers.

3. The semiconductor unit according to claim 1, wherein the plurality of sub-conductive layers are arranged at positions shifted stepwise along the second direction.

4. The semiconductor unit according to claim 1, wherein the plurality of sub-conductive layers are rectangular, semicircular, or triangular shaped in plan view.

5. The semiconductor unit according to claim 1, wherein the detection circuit detects the misalignment amount by a relative comparison of respective capacitances of the plurality of first capacitors in the device group.

6. The semiconductor unit according to claim 1, wherein the correction circuit includes
a plurality of third capacitors connected in parallel to the second capacitor, and
one or more of the plurality of third capacitors are electrically isolated by correction based on the alignment amount.

7. The semiconductor unit of claim 1, wherein the detection circuit is configured to detect the misalignment amount by arithmetic processing using a difference between capacitances of capacitors selected from the plurality of first capacitors and a sum of the capacitances of the selected capacitors.

8. The semiconductor unit according to claim 1 comprising a plurality of electrically-connected first conductive layers, wherein:
the plurality of the first conductive layers are arrayed along the second direction, and
the sub-conductive layer are arranged overlapping respective parts of the respective first conductive layers.

9. A semiconductor unit comprising:
a substrate made of a semiconductor;
a device group on the substrate and comprised of a plurality of first capacitors;
a second capacitor;
a detection circuit; and
a correction circuit,
wherein
the device group includes a first conductive layer and a second conductive layer, the first and second conductive layers overlapping each other in part or in whole with an insulating film in between,
the second conductive layer includes a plurality of substantially same-shaped sub-conductive layers which are arranged along two orthogonal axes,
the plurality of sub-conductive layers are electrically isolated from one another and are arranged overlapping different portions of the first layer,
the detection circuit is configured to detect a misalignment amount between the first and second conductive layers, based on a capacitance in the device group, and
the correction circuit is configured to correct a capacitance of the second capacitor based on the misalignment amount detected by the detection circuit.

10. The semiconductor unit according to claim 9, wherein the detection circuit is configured to perform arithmetic processing including capacitances of the plurality of first capacitors and a design value of a width in one or more axis directions in each of the first capacitors as parameters.

11. A method comprising:
providing a substrate made of a semiconductor, a device group on the substrate and comprised of a plurality of first capacitors, a second capacitor on the substrate, a detection circuit, and a correction circuit, the device group includes a first conductive layer and a second conductive layer, the first and second conductive layers overlapping each other in part or in whole with an insulating film in between, the first conductive layer including an edge extending along a first direction, the second conductive layer including a plurality of substantially same-shaped sub-conductive layers which are arrayed along the first direction, the plurality of sub-conductive layers being electrically isolated from one another and arranged in relatively different positions with respect to the edge of the first conductive layer along a second direction orthogonal to the first direction;
detecting a relative misalignment amount between the first and second conductive layers, based on a capacitance in the device group;
performing defect judgment on each of regions on the substrate, based on the detected misalignment amount; and
correcting a capacitance of the second capacitor based on the misalignment amount detected by the detection circuit.

12. The method according to claim 11, wherein, in detecting the misalignment amount, the misalignment amount is detected by a relative comparison of respective capacitances of the plurality of first capacitors in the device group.

13. The method according to claim 11, further comprising forming a map in which a position of a defect caused by misalignment is recorded corresponding to a region that is judged as a defective region of the regions on the substrate.

14. The method of claim 11, wherein the misalignment amount is detected by arithmetic processing using a difference between capacitances of capacitors selected from the plurality of first capacitors and a sum of the capacitances of the selected capacitors.

* * * * *